United States Patent [19]

Claydon et al.

[11] Patent Number: 5,761,210
[45] Date of Patent: Jun. 2, 1998

[54] SIGNAL PROCESSING APPARATUS AND METHOD

[75] Inventors: Anthony Peter J. Claydon; Richard J. Gammack, both of Avon, United Kingdom

[73] Assignee: DiscoVision Associates, Irvine, Calif.

[21] Appl. No.: 486,750

[22] Filed: Jun. 7, 1995

Related U.S. Application Data

[62] Division of Ser. No. 481,107, Jun. 7, 1995.

[30] Foreign Application Priority Data

Jun. 7, 1995 [GB] United Kingdom .................. 9511568

[51] Int. Cl.$^6$ ...................................................... G06F 11/00
[52] U.S. Cl. ........................................................... 371/2.1
[58] Field of Search .................................... 371/2.1, 38.1, 371/39.1, 37.5, 37.7; 375/340; 395/846, 166, 200.13, 421.07, 858, 475, 800, 467

[56] References Cited

U.S. PATENT DOCUMENTS

| | | | |
|---|---|---|---|
| 4,967,375 | 10/1990 | Pelham et al. | 395/166 |
| 5,020,020 | 5/1991 | Pomfret et al. | 395/200.13 |
| 5,087,975 | 2/1992 | Citta et al. | 358/133 |
| 5,122,875 | 6/1992 | Raychaudhuri et al. | 358/133 |
| 5,168,356 | 12/1992 | Acampora et al. | 358/133 |
| 5,175,617 | 12/1992 | Wallace et al. | 358/133 |
| 5,283,646 | 2/1994 | Bruder | 348/415 |
| 5,287,420 | 2/1994 | Barrett | 382/56 |
| 5,291,582 | 3/1994 | Drako et al. | 395/846 |
| 5,506,636 | 4/1996 | Patel et al. | 348/725 |
| 5,566,183 | 10/1996 | Partyka | 371/2.1 |

OTHER PUBLICATIONS

Performance Results of a 64/256-QAM CATV Receiver Chip Set; Henry Samueli, Charles P. Reames, Leo Montreuil and William E. Wall.

Practical Implementation of a 43 MBit/Sec. (8Bit/HZ) Digital Modem for Cable Television; Rich Citta, Ron Lee; Zenith Electronics Corporation.

Bennett C. Wong, and Henry Samueli, *A 200-MHz All-Digital QAM Modulator and Demodulator in 1.2-µm CMOS for Digital Radio Applications*, IEEE Journal of Solid-State Circuits, vol. 26, No. 12, Dec. 1991.

Robert A. Hawley, Thu-ji Lin, and Henry Samueli, *A 300 Mhz Digital Double-Sideband to Single-Sideband Converter in 1 µm CMOS*, IEEE Journal of Solid-State Circuits, vol. 30, No. 1, Jan. 1995.

*Primary Examiner*—Phung Chung
*Attorney, Agent, or Firm*—Ronald J. Clark; Robert T. Braun; Arthur S. Bickel

[57] ABSTRACT

An integrated CMOS circuit is disclosed for deinterleaving transmitted data packets. The circuit operates with a RAM buffer that is no larger than a block of interleaved data. An optimized addressing scheme is provided that minimizes on-chip hardware. The circuit provides an orderly initialization of the buffer, and a suitable emptying process during a channel change or other interruption of data flow.

9 Claims, 42 Drawing Sheets

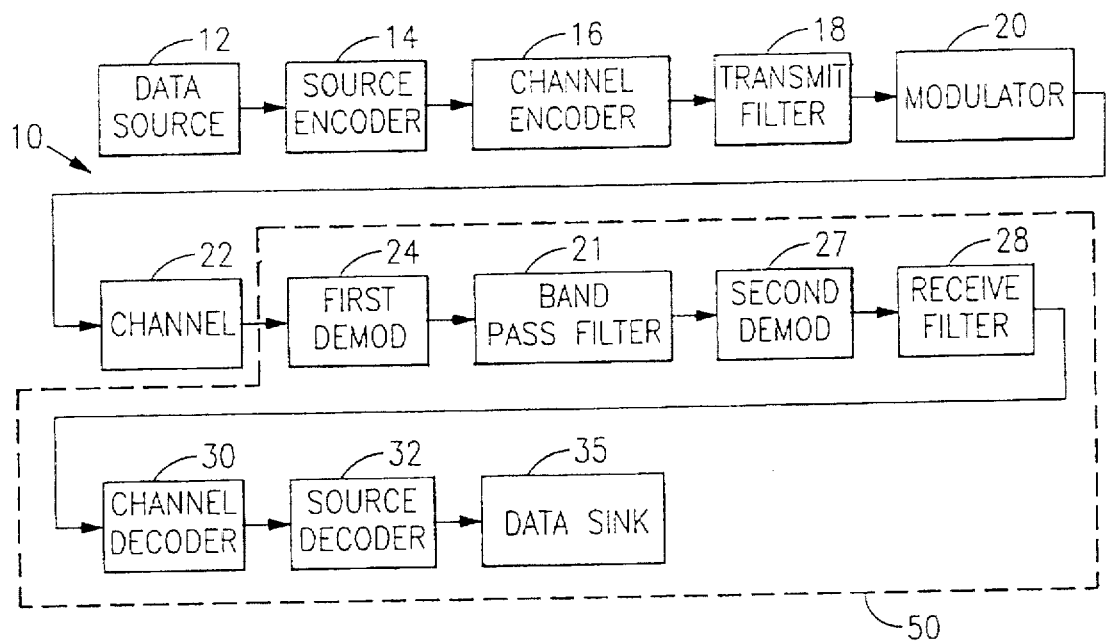
FIG.1
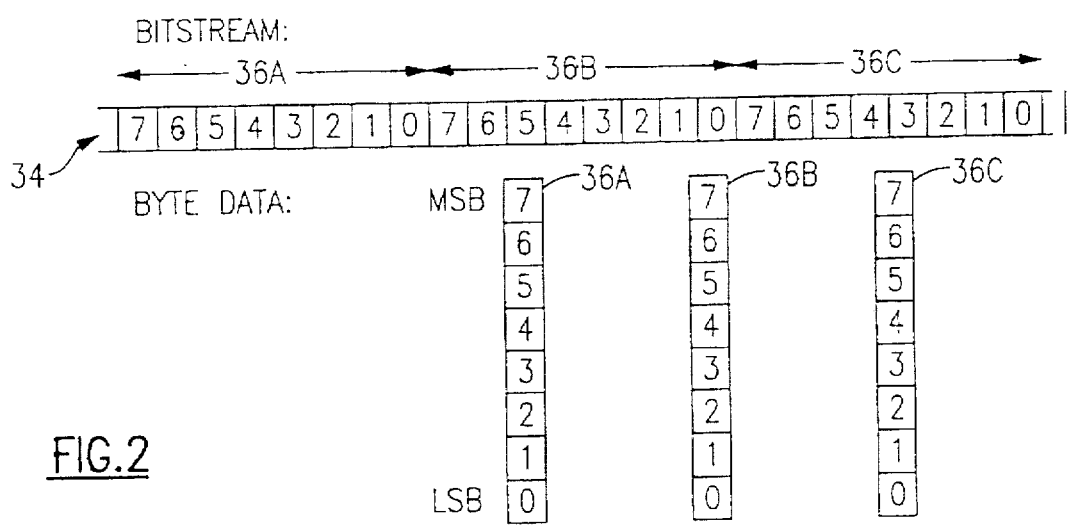
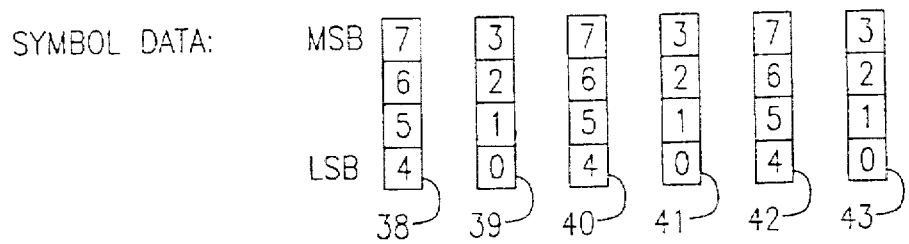
FIG.2 r = RESET
s = SET
α(x) = x$^{th}$ BIT OF α

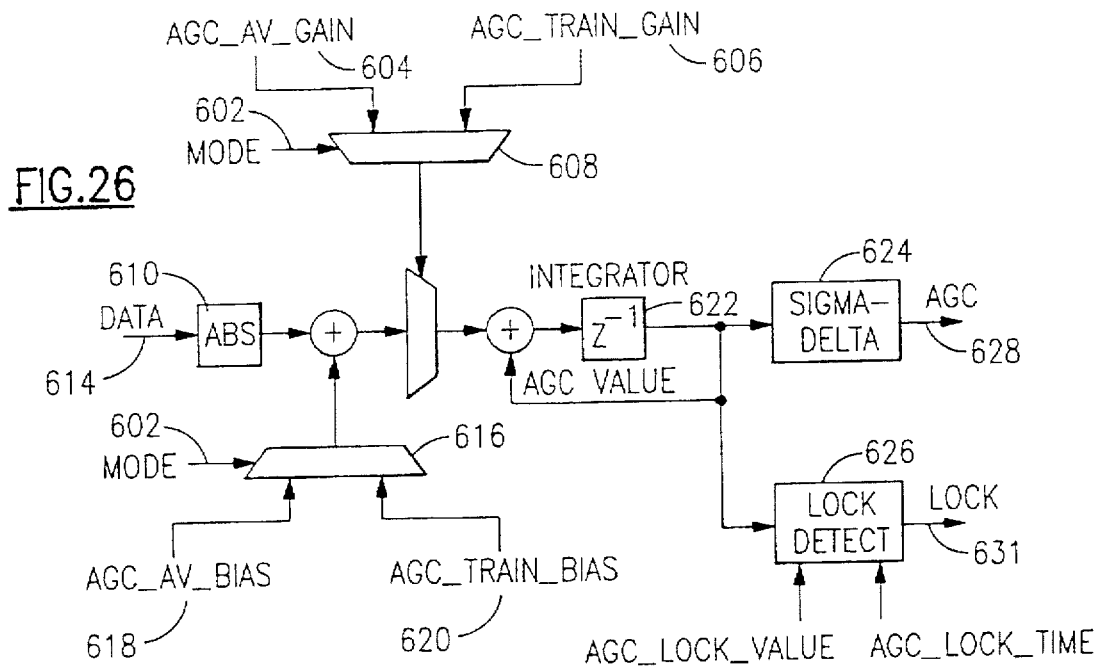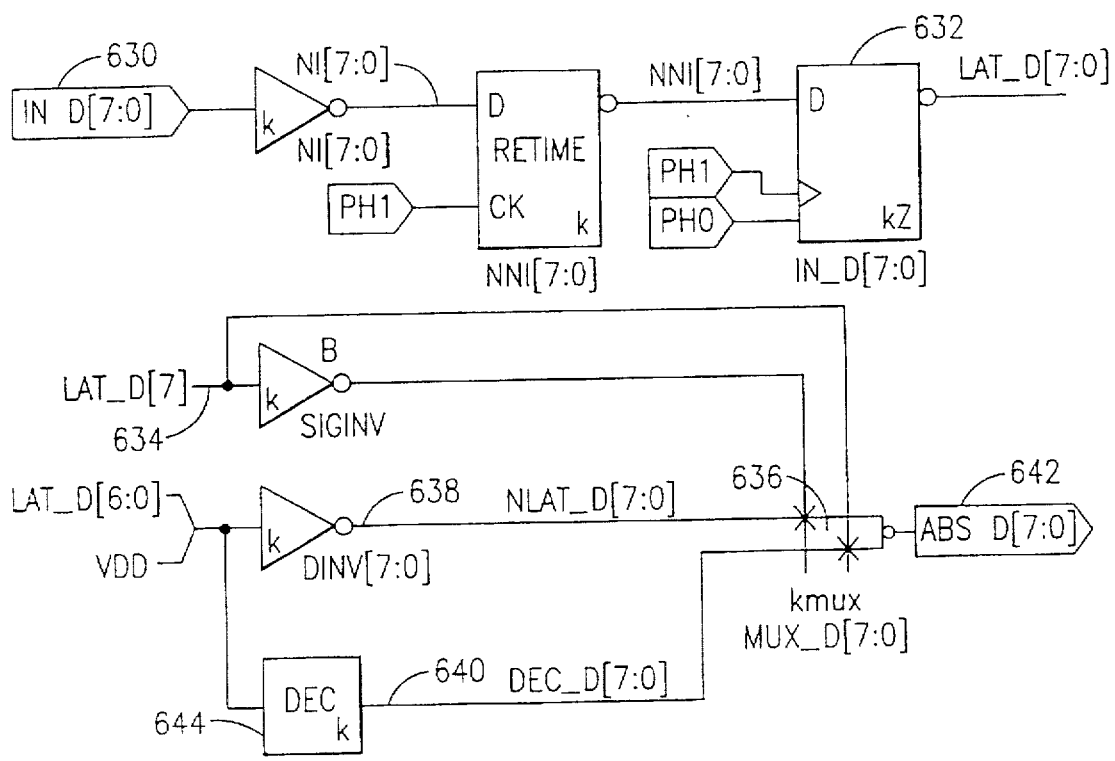

SIGNAL PROCESSING APPARATUS AND METHOD

This is a divisional of copending application(s) Ser. No. 0/481,107 filed on Jun. 7, 1995.

BACKGROUND OF THE INVENTION

1. Field of the Invention

This invention relates to processing signals received from a communications channel. More particularly this invention relates to an integrated signal processing system for receiving signals suitable for use in the transmission of video, "hi-fi" audio, images or other high bit rate signals.

2. Description of the Related Art

Encoded transmission of inherently analog signals is increasingly practiced today as a result of advances in signal processing techniques that have increased the bit rate achievable in a channel. At the same time new data compression techniques have tended to reduce the bandwidth required to acceptably represent analog information. The art is presently striving to more efficiently transmit video and audio data in applications such as cable television using digital techniques.

Various modulation techniques have been employed in digital communications. For example quadrature amplitude modulation (QAM) is a relatively sophisticated technique favored by practitioners of digital radio communications. This method involves two separate symbol streams, each stream modulating one of two carriers in quadrature. This system achieves spectral efficiencies, between 5-7 bits/sec-Hz in multilevel formats such as 64-QAM and 256-QAM. QAM is particularly useful in applications having a low signal-to-noise ratio. However double sideband modulation is required. Furthermore cross-coupled channel equalizers are generally needed, which adds to the overall complexity of the system.

A variant of QAM is quadrature phase shift keying (QPSK), in which a signal constellation consisting of four symbols is transmitted, each having a different phase and a constant amplitude. The scheme is implemented as the sum of orthogonal components, represented by the equation.

$$A_m = be^{j\theta_m}$$

where $\theta_m$ can be any of $\{0, \pi/2, \pi, 3\pi/2\}$. It is necessary to transmit both sidebands in order to preserve the quadrature information.

Another modulation scheme known to the art is vestigial sideband (VSB) modulation, which is achieved by amplitude modulating a pulsed baseband signal, and suppressing a redundant sideband of the amplitude modulated (AM) signal, in order to conserve bandwidth. Usually the lower sideband is suppressed. In the digital form of VSB, a digital pulse amplitude modulated (PAM) signal is employed.

It is proposed in Citta et al., Practical Implementation of a 43 mbit/Sec (8 bit/Hz) Digital Modem for Cable Television, 1993 NCTA Technical Papers, pp 271-278, to implement a 16 level VSB modulation method in cable television applications, wherein symbols of 16 discrete methods are amplitude modulated, using carrier suppression and transmission of a vestigial sideband in a 6 MHz channel. Transmission of a low level pilot carrier, located approximately 310 kHz above the lower channel edge, is included to assist in signal detection. The arrangement provides for the transmission of 43 Mbit/sec, but requires a passband of 5.38 MHZ at 4 bits/symbol.

SUMMARY OF THE INVENTION

It is therefore a primary object of the present invention to provide an improved system for the communication of digital data in a constrained channel.

It is another object of the invention to provide an improved, economical apparatus for receiving and decoding data at high bit rates, such as video and audio signals.

It is yet another object of the invention to provide an improved, highly accurate analog-to-digital converter which can operate at high speeds and is suitable for the processing of video signals.

It is still another object of the invention to provide an improved compact filter that can reduce a modulated signal to a complex baseband representation and concurrently perform a Nyquist operation.

It is a further object of the invention to provide an improved and highly compact deinterleaving circuit that can be economically implemented in a semiconductor integrated circuit.

It is another object of the invention to provide an output interface for a digital receiver that synchronizes the data flow through the receiver with a transmission rate of the signal.

These and other objects of the present invention are attained by a passband pulse amplitude modulation (PAM) receiver employing multilevel vestigial sideband modulation. A particular form of the invention is suitable for transmitting MPEG 2 transport layer data. MPEG is a standard well known to the art, in which data is grouped in a plurality of packets, each of which contains 188 bytes. This number was chosen for compatibility with asynchronous transfer mode (ATM) transmissions, another known telecommunication standard. The apparatus disclosed herein relies on randomization of the data prior to transmission, using a signal constellation having a zero mean.

The invention provides a signal processing apparatus for the reception of data packets that are transmitted through a channel, wherein the data packets include information data and error correction data for correcting errors in the received data, and the packets are represented in a modulated signal having pretransmission characteristics, and are demodulated following transmission. The signal processing apparatus comprises an analog-to-digital converter for sampling an input signal following transmission of the input signal through a communications channel. A timing recovery circuit is coupled to the analog-to-digital converter output for adjusting the frequency and the phase of the sampling intervals. A carrier recovery circuit is coupled to the analog-to-digital converter output for adjusting the frequency and phase of the input signal. An automatic gain control circuit is also coupled to the analog-to-digital converter output, and provides an error signal that is indicative of a magnitude of the input signal and a reference magnitude. A filter conforms the analog-to-digital converter output to pretransmission characteristics of the input signal. An adaptive equalizer is coupled to the filter, and has characteristics that are adaptively varied in accordance with predetermined information encoded in the modulated signal, so that the equalizer output compensates for channel characteristics. An error correcting circuit is coupled to the equalizer and to an output interface. The timing recovery circuit, the carrier recovery circuit, the equalizer, the error correcting circuit, and the output interface are integrated on a semiconductor integrated circuit.

In an aspect of the invention the modulated signal is modulated by vestigial sideband modulation, and there is provided an amplifier coupled to the channel and accepting the modulated signal therefrom, and a demodulator coupled to the amplifier for producing a demodulated signal.

In another aspect of the invention a plurality of the data packets are grouped in frames, each frame further comprising a frame header, while the predetermined information comprises a training sequence in the frame header.

In another aspect of the invention the equalizer comprises a first response filter, and a circuit for adjusting coefficients of the first response filter that is responsive to an error signal that is derived from a difference between an output of the first response filter and the predetermined information. The circuit for adjusting the coefficients executes the signed least-mean-square algorithm.

The equalizer also includes a phase tracking circuit for producing an in-phase component and a quadrature component that is representative of the modulated signal in accordance with the formula $$data = a(t)\cos\phi + â(t)\sin\phi$$

wherein data is an output;

$\phi$ is phase error;

a(t) is transmitted data; and

â(t) is the quadrature component of a(t).

The phase tracking circuit output is in accordance with the formula $$output_c = a(t)(\cos\theta\cos\phi + \sin\theta\sin\phi) + â(t)(\sin\phi\cos\theta - \cos\phi\sin\theta)$$

wherein $\theta$ is an angle of rotation of a signal constellation of the modulated signal. The phase tracking circuit comprises a second response filter, and a circuit for estimating the angle $\theta$ according to the least-mean-square algorithm.

In another aspect of the invention the first and second response filters are finite impulse response filters, and the second response filter performs a Hilbert transform.

In another aspect of the invention blocks of the packets are interleaved at an interleaving depth, and a deinterleaving circuit is incorporated in the integrated circuit. The deinterleaving circuit comprises a random access memory for memorizing the interleaved packets, which has a capacity that does not exceed a block of interleaved data, and is organized in a plurality of rows and a plurality of columns, wherein the rows define a plurality of groups. A first circuit generates an address signal representing a sequence of addresses of the random access memory, wherein successive addresses differ by a stride. A second circuit successively reads and writes data out of and into the random access memory respectively at an address of the random access memory that is determined by the address signal. A third circuit increases the stride by the interleaving depth, wherein the stride is increased upon deinterleaving of a block of interleaved data.

In another aspect of the invention the deinterleaving circuit further comprises a control circuit for operating the second circuit in a selected one of a first operating mode, wherein the random access memory is accepting incoming data and is not producing outgoing data; a second operating mode, wherein the random access memory is accepting incoming data and producing outgoing data; and a third operating mode, wherein the random access memory is not accepting incoming data and is producing outgoing data. The first circuit comprises a predecoder that preselects one of the groups of rows in the random access memory, and a row decoder that selects a row of the preselected group.

An input of the analog-to-digital converter has a modulated input that exceeds baseband, and the filter has a plurality of coefficients that are arranged to reduce the output of the analog-to-digital converter to a complex baseband representation of the modulated signal.

In an aspect of the invention the integrated circuit is a CMOS integrated circuit.

In another aspect of the invention the filter is integrated in the integrated circuit.

In another aspect of the invention the analog-to-digital converter is integrated in the integrated circuit.

In another aspect of the invention the automatic gain control circuit is integrated in the integrated circuit.

In another aspect of the invention the analog-to-digital converter comprises a comparator having first and second units, each of the units comprising a capacitor connected to a first node and a second node. A first switch means connects the first node to a selected one of an input voltage and a reference voltage. An inverter is connected to the second node and has an output, and the inverter has a small signal gain between the second node and the output thereof. A second switch means connects the output of the inverter of one of the first and second units to the first node of another of the first and second units, whereby the first and second units are cross-coupled in a positive feed back loop when the second switch means of the first unit and the second switch means of the second units are closed. The output of the inverter is representative of a comparison of the input voltage and the reference voltage. Each unit further comprises a third switch means for connecting the first node and the output of the inverter, whereby an input of the inverter is zeroed.

In another aspect of the invention the inverter, the first switch means, the second switch means, and the third switch means comprise MOS transistors.

In another aspect of the invention the filter down converts the input signal to complex baseband representation and performs a Nyquist operation on the input signal.

In another aspect of the invention the error correcting circuit comprises a Reed-Solomon decoder, which comprises a circuit for executing a Berlekamp algorithm. The circuit comprises a first register for holding a portion of a locator polynomial $\Lambda(x)$, a second register for holding a portion of a D polynomial, a first switch means for alternately selecting the first register and the second register in successive iterations of the Berlekamp algorithm. The circuit further comprises a third register for holding a portion of an evaluator polynomial $\Omega(x)$, a fourth register for holding a portion of an A polynomial, and a second switch means for alternately selecting the third register and the fourth register in successive iterations of the Berlekamp algorithm.

The invention provides a method of signal processing received data packets that are transmitted through a channel, wherein the data packets include information data and error correction data for correcting errors in the received data, and the packets are represented in a modulated signal having pretransmission characteristics, and are demodulated following transmission, comprising the steps of sampling an input signal at sampling intervals following transmission of the input signal through a channel. While the step of sampling is being performed, a frequency and a phase of the sampling intervals and a frequency and a phase of the input signal are adjusted. An error signal is provided that represents a difference between the signal that is indicative of a magnitude of the input signal and a reference magnitude. The sampled input signal is filtered to conform a postsampling characteristic thereof to a pretransmission characteristic thereof. The filtered input signal is adaptively equalized in accordance with predetermined information encoded in the modulated signal in order to conform the filtered input signal to characteristics of the channel. The adaptively equalized input signal is submitted to an error correcting circuit to produce corrected data, and the corrected data is output. The step of adjusting a frequency and a phase of the input signal, the step of providing an error signal, the step of filtering the sampled input signal, the step of adaptively equalizing the filtered input signal, and the step of submitting the adaptively equalized input signal to an error correcting circuit are performed using a semiconductor integrated circuit.

The invention provides a filter for operating upon a sampled signal comprising an arrangement of adders, multipliers, and multiplexers having a pulse-shaping response, in which the multipliers are arranged to multiply factors corresponding to samples of the signal by constant coefficients, the constant coefficients are selected for use in simultaneously shifting the signal in frequency and shaping pulses of the sampled signal according to the pulse-shaping response.

In one aspect of the invention the pulse-shaping response is a square-root raised cosine response.

In an aspect of the invention the pulse-shaping response is a square-root raised cosine response.

The invention provides a filter for operating upon a signal sampled at a rate exceeding the minimum Nyquist sampling frequency, which has an arrangement of multipliers, adders, and multiplexers arranged to operate upon a first portion of samples of the sampled signal while discarding a second portion of the samples, thereby preserving information transmitted within the bandwidth of the sampled signal, while reducing the number and frequency of the samples to be propagated.

In an aspect of the invention the first portion of the samples corresponds to symbol pulses.

In another aspect of the invention the first portion of the samples corresponds to one symbol per sample.

The invention provides an output interface for transferring data from a data source operating at a first clock rate provided by a first clock signal to a data sink operating at a second clock rate provided by a second clock signal. The interface has a first latch operable at the first clock rate, a second latch operable at the second clock rate. The second latch receives data from the first latch. The interface includes a first signal generator operable at the first clock rate, producing a data valid signal, and includes at least one third latch operable at the second clock rate. The third latch receives the data valid signal from the first signal generator in response to the second clock signal. A second signal generator is operable at the second clock rate, and activates a load data signal to the second latch in response to receipt of the data valid signal from the third latch. Data is thereby transferred from the first latch to the second latch in response to receipt by the second latch of the second clock signal when the load data signal is active.

The invention provides an output data error signaling system for signaling the presence or absence of an error in at least one multiple byte packet to an external processing environment. The multiple byte packet includes at least one error indicator, and has a buffer, the buffer storing at least one multiple byte packet. There is provided a packet error indicator, signaling an error condition of the packet to the external processing environment after receipt by the buffer of at least a portion of a packet containing an active error indicator bit.

BRIEF DESCRIPTION OF THE DRAWINGS

For a better understanding of these and other objects of the present invention, reference is made to the detailed description of the invention which is to be read in conjunction with the following drawings, by way of example wherein:

FIG. 1 is a block diagram of a communication system that is embodied by the present invention;

FIG. 2 is a diagram indicating mappings of a bitstream to 16-VSB symbols for transmission thereof by the system shown in FIG. 1;

FIG. 6b is an electrical schematic of an inverter used in the circuit shown in FIG. 6a;

FIG. 26 is a block diagram illustrating the automatic gain control circuit in the receiver shown in FIG. 4;

FIG. 28 is a more detailed electrical schematic of a portion of the circuit illustrated in FIG. 27;

DESCRIPTION OF THE PREFERRED EMBODIMENT

Figure 3:
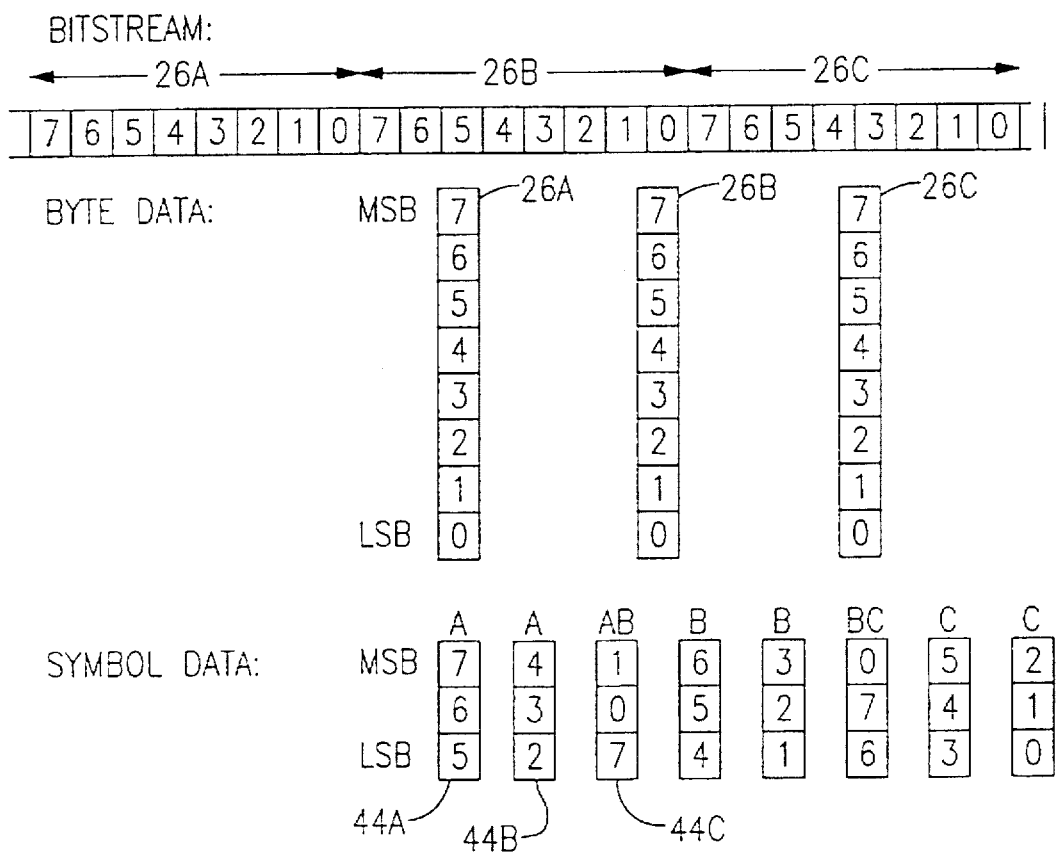
FIG. 3 is a diagram indicating mappings of a bitstream to 8-VSB symbols for transmission thereof by the system shown in FIG. 1.

As used herein the notation sK.N indicates signed 2's complement integers having a magnitude varying from 0 to $2^K-1$, and N bits of fraction. An unsigned integer is represented as K.N.

Turning now to the Drawing, and to FIG. 1 thereof, a communication system that is embodied by a preferred embodiment of the invention is generally referenced 10. A data source 12, such as a television signal, is submitted to a source encoder 14 to yield a bit stream that is processed through a channel encoder 16. It will be understood by those skilled in the art that the source encoder 14 is arranged to minimize the bit rate required to represent the data with a desired fidelity, and that the channel encoder 16 maximizes the information rate conveyed through a channel with less than a predetermined bit error probability. The arrangement of the data is discussed for convenience with reference to the MPEG2 (ISO/IEC JTC1/SC29/WG11N0702) digital transmission scheme, it being understood that many other kinds of data, grouped in packets of various sizes can be transmitted within the scope and spirit of the invention. In the preferred embodiment the transport stream from the data source 12 is formed by the source encoder 14 into 188 byte groups, in conformance with the MPEG 2 standard, and a Reed Solomon code is applied by the channel encoder 16, wherein each 188 byte group has 20 appended check bytes to form a 208 byte packet. Reed Solomon codes are known to provide high coding gains, and with this arrangement it is possible to correct up to 10 byte errors per packet. The details of the Reed-Solomon (208, 188) code are as follows:

Galois Field (256) arithmetic is used. The field generator polynomial is given by $x^8 +x^4+x^3+x^2+1$. A primitive element, $\alpha^x$, is the xth member of the Galois Field, and the code generator polynomial is given by:

$$\prod_{i=0}^{19} (x+\alpha^i)$$

The following C program correctly generates the Reed Solomon code.

```
#include <stdio.h>
#define GEN_POLY 0x1d
int a[256];
int b[256];
static int gfmult (d1, d2)
int d1, d2;
{
  int result;
  if ((d1==0)||(d2==0))
    return (0);
```

-continued

```
else
{
    result = b[d1]+b[d2];
    result = result%(255);
    return (a[result]);
}
}
main ()
{
    int in_data;
    int i;
    int shift_reg[20];
    int feedback;
    int symbol_count;
    int g[20]={174,165,121,121,198,228,22,187,36,69,150,112,
        220,6,99,111,5,240,185,152};
    a[0]=1; b[1]=0;
    a[1]=2; b[2]=1;
    for (i=2; i<256-1; i++)
    {
        a[i] = a[i-1] << 1;
        if (a[i] & 256)
            a[i] = (a[i]&(255))^GEN_POLY;;
        b[a[i]] = i;
    }
    symbol_count = 0;
    for (i=0; i<20; i++)
        shift_reg[i] = 0;
    while ((scanf ("%d", &in_data)) != EOF)
    {
        symbol_count++;
        feedback = in_data ^ shift_reg[19];
        for (i=(19); i>0; i--)
            shift_reg[i] = shift_reg[i-1] ^ (gfmult (feedback, g[i]));
        shift_reg[0] = (gfmult (feedback, g[0]));
        printf ("%d\n", in_data);
        if (symbol_count == 188)
        {
            for (i=(19); i>=0; i--)
                printf ("%d\n", shift_reg[i]);
            symbol_count = 0;
            for (i=0; i<20; i++)
                shift_reg[i] = 0;
        }
    }
}
```

The bytes in the Reed-Solomon encoded packets are then subjected to 16-way interleaving in order to better tolerate burst errors that could exceed the correction capabilities of the Reed-Solomon technique. This is accomplished, as indicated in Table 1, by writing byte packets rowwise into a 208×16 byte array, and reading the data by columns.

TABLE 1

Interleave Structure

| 0 | 1 | 2 | ... | 206 | 207 |
| 208 | 209 | 210 | ... | 414 | 415 |
| ... | ... | ... | ... | ... | ... |
| 3120 | 3121 | 3122 | ... | 3326 | 3327 |

The 3328 bytes are written in the order 0, 1, 2, . . . , 3327, and read in the order 0, 208, 416, . . . , 3120, 1, 209, . . . , 3121, . . . With this arrangement up to 42 microseconds of burst errors can be tolerated, assuming the a transmission rate of 30 megabits/second using 16-VSB.

The resultant interleaved block is passed through a transmit filter 18 and a modulator 20, as shown in FIG. 1. The digital communication scheme discussed herein assumes that randomized data is being transmitted with zero mean, to keep from transmitting with direct current (DC) bias. To achieve randomization, the data is subjected to a bit-wise exclusive OR operation with a pseudorandom sequence generated by a feedback shift register. The random number generator employs an 11 bit shift register (not shown) which is initialized to 1s. The generator function is the polynomial $1+x^9+x^{11}$.

Groups of interleaved blocks of data thus formed are transmitted along with a periodic frame header, which contains a frame synchronization sequence and a training sequence. The purpose of the latter will be explained in further detail below.

The frame structure is shown in table 2. The frame header includes a 31 symbol frame sync, 775 symbol training sequence, and a 26 symbol user data field.

TABLE 2

|  | Frame Header | Data |
| --- | --- | --- |
| 16-VSB | 832 symbols | 320 packets (20 interleaved blocks) |
| 8-VSB | 832 symbols | 240 packets (15 interleaved blocks) |
| 4-VSB | 832 symbols | 160 packets (10 interleaved blocks) |
| 2-VSB | 832 symbols | 80 packets (5 interleaved blocks) |

The generator polynomial for the frame sync is $x^5+x^4+x^2+x+1$, with an initial condition of 00001 (binary). This yields the frame sync sequence:

sseq=1,0,0,0,0,1,1,1,0,0,1,1,0,1,1,1,1,1,0,1,0,0,0,1,0,0,1, 0,1,0,1.

The generator polynomial for the training sequence is $x^5+x^3+1$, with initial condition 00100 (binary). This yields the training sequence:

tseq=0,0,1,0,0,0,0,1,0,1,1,1,1,0,1,0,0,0,1,1,1,1,1,0,0,1, 1,0,1.

The complete frame header consists of:

sseq+12×(tseq'+tseq)+tseq'+userdata[0..25], where tseq' is identical to tseq, except that the last bit is inverted from 1 to 0.

The user data field contains two sets of two bits which each specify the modulation level (16-VSB, 8-VSB, 4-VSB or 2-VSB), two bytes of user data and a 6 bit cyclic redundancy check (CRC) field as shown in table 3.

TABLE 3

| User Data Field ||||| |
| --- | --- | --- | --- | --- |
| VSB Levels | VSB levels | user_reg0 | user_reg1 | CRC |
| 2 bits | 2 bits | 8 bits | 8 bits | 6 bits |

The modulation level is defined in table 4.

TABLE 4

| VSB Modulation Level Field ||
| --- | --- |
| vsb-levels [1:0] | VSB modulation |
| 00 | 16-VSB |
| 11 | 8 VSB |
| 10 | 4 VSB |
| 01 | 2 VSB |

Figure 22:
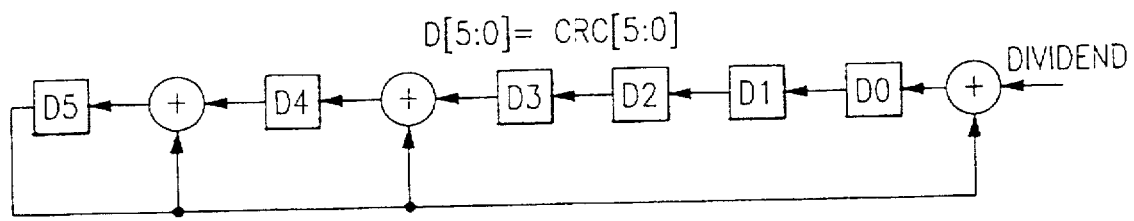
FIG. 22 is a diagram illustrating a generator of cyclic redundancy data.

The CRC is generated as follows: the sequence "vsb_levels[1:0], vsb_levels[1:0], user_reg0[7:0], user_reg[7:0] ,0,0,0,0,0,0" forms the dividend of a CRC with generator polynomial $G(x)=x^6+x^5+x^4+1$. The remainder is CRC[5:0]. A generator of a user data CRC generator is shown in FIG. 22.

The sequence "vsb_levels[1:0], vsb_levels[1:0], user_reg0[7:0], user_reg[7:0], CRC[5:0]" is scrambled by exclusive ORing with the first 26 bits of the training sequence tseq.

Data is transmitted as symbols consisting of 4 bits for 16-VSB, 3 bits for 8-VSB, 2 bits for 4-VSB, or 1 bit for 2-VSB. Bytes from the interleaver must be converted to symbols MSB first. Mapping to 16-VSB is explained with reference to FIG. 2. A bitstream 34 is formed of three bytes 36a, 36b, 36c, which are also represented vertically in the central portion of FIG. 2, with the MSB at the top. Each of the three bytes 36a–c is broken into two symbols 38–43. Symbols 38 and 39 contain the 4 most significant and least significant bits respectively of byte 36a. The contents of symbols 40–43 relate to bytes 36b–c in like manner.

FIG. 3 explains the mapping from bytes to symbols for 8-VSB. Here the bits of the three bytes 26A–C are arranged in groups of three bits, with crossing of byte boundaries, for example at symbol 44c of the three groups 46a, 46b and 46c. Symbols for 4-VSB and 2-VSB are formed in equivalent manners. The symbol constellations are shown in table 5. The frame header constellation, including the user data, is −8 (logical 0), and +8 (logical 1) for all modulation levels.

TABLE 5

| Symbol | Constellation | | | |
|---|---|---|---|---|
| | 16-VSB | 8-VSB | 4-VSB | 2-VSB |
| 0x8 | −15 | | | |
| 0x9 | −13 | | | |
| 0xa | −11 | | | |
| 0xb | −9 | | | |
| 0xc | −7 | | | |
| 0xd | −5 | | | |
| 0xe | −3 | | | |
| 0xf | −1 | | | |
| 0x0 | +1 | +2 | +4 | +8 |
| 0x1 | +3 | +6 | +12 | −8 |
| 0x2 | +5 | +10 | −12 | |
| 0x3 | +7 | +14 | −4 | |
| 0x4 | +9 | −14 | | |
| 0x5 | +11 | −10 | | |
| 0x6 | +13 | −6 | | |
| 0x7 | +15 | −2 | | |

The transmit filter 18 (FIG. 1) is a square root raised cosine filter having a rolloff of 20%.

Structural details of the source encoder 14, channel encoder 16, transmit filter 18, and modulator 20 are outside the scope of the invention and will not be further discussed.

Channel 22 can be any channel, such as a fiber optic link, coaxial cable, microwave, satellite, etc. which is suitable for the transmission of television, video, "hi-fi" audio or other high bit rate signals. The digital receiver, which will be described in greater detail hereinbelow, comprises a first demodulator 24, the output of which is filtered through a band pass filter 21. A second demodulator 27 converts its input to base band. The output of the second demodulator 27 is passed through a receive filter 28. The signal then passes successively to a channel decoder 30, a source decoder 32, and finally into a data sink 35. The channel decoder 30 and the source decoder 32 reverse the encoding that was accomplished in the source encoder 14 and the channel encoder 16 respectively.

Figure 4:
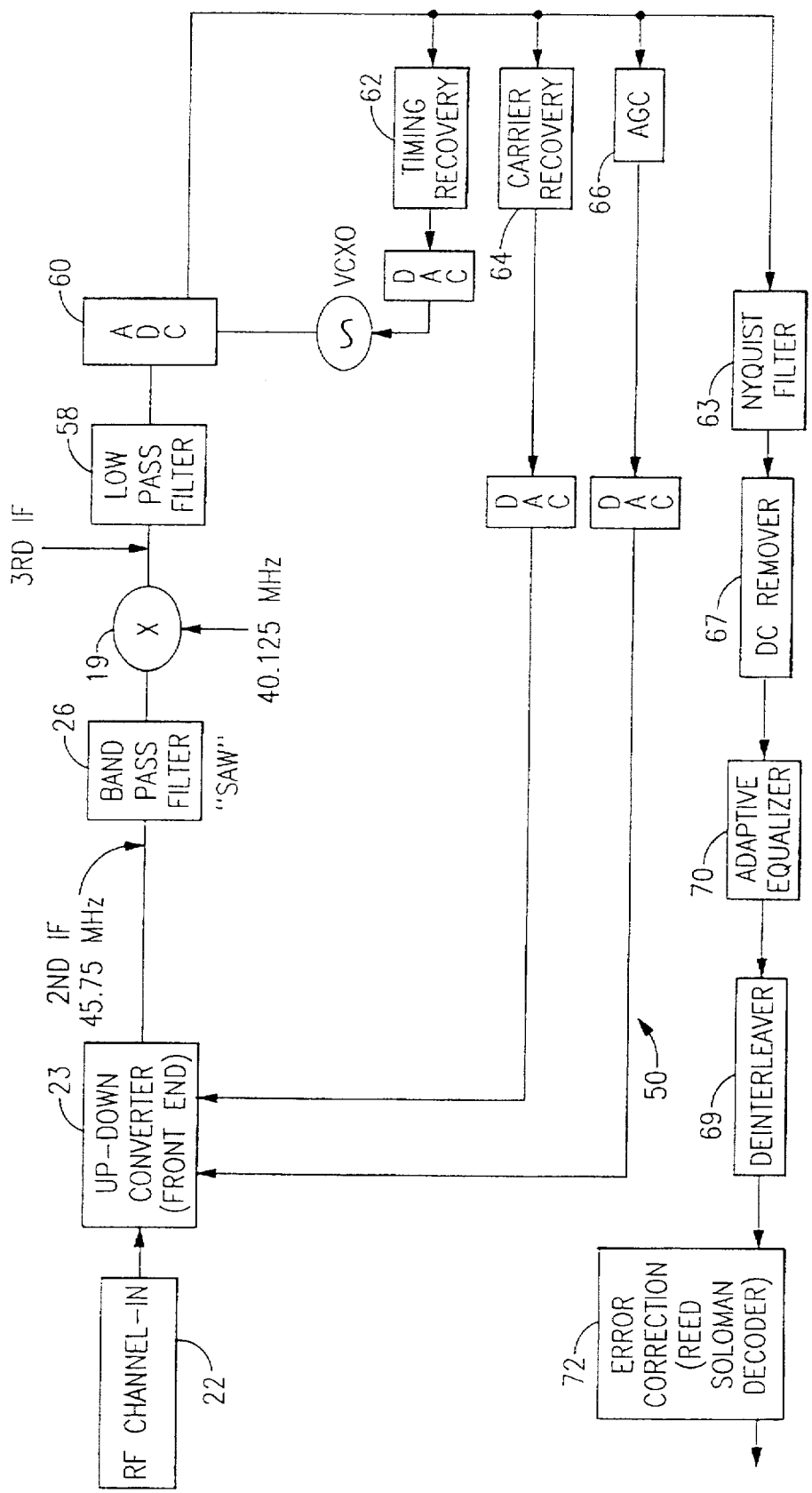
FIG. 4 is a block diagram of a digital receiver capable of receiving VSB signals from the channel in the data communication system shown in FIG. 1.
Figure 23:
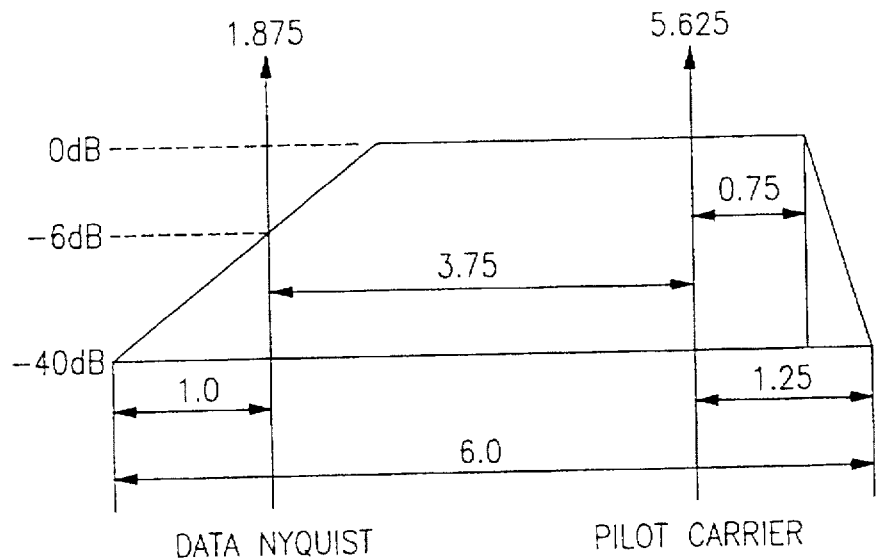
FIG. 23 is a diagram illustrating the VSB frequency spectrum at the input to the analog-to-digital converter of the receiver illustrated in FIG. 4.

The organization of a digital receiver 50 is shown in greater detail in FIG. 4. In the receiver front end 23, shown in yet greater detail in FIG. 4a, a radio frequency amplifier 52 is coupled to the channel 22 via a high pass filter 51. The output of the radio frequency amplifier 52 passes through radio frequency attenuater 53 and low pass filter 54 and is down converted to a first intermediate frequency by the first demodulator 24, and then passed through a low pass filter 25. The first demodulator 24 is of a known type. Its frequency is controlled by a voltage-controlled oscillator 33, programmed through a microprocessor interface operating through a digital-to-analog converter 37. The second demodulator 27 converts the signal to a second intermediate frequency, and is followed by a high pass filter 29, and another amplifier stage 31. The output of amplifier stage 31 is passed through a bandpass filter 21 to a third down converter 19 (FIG. 1), which converts the signal to a third intermediate frequency and then passes the signal to a low pass filter 58. A high speed analog to digital converter 60, provides an output which is used by timing recovery circuit 62, which ensures accurate sampling by analog-to-digital converter 60. FIG. 23 shows a graph of the signal spectrum at the input of the analog-to-digital converter 60, wherein frequencies and bandwidth values are shown in MHz. This spectrum shape can be achieved if the passband of band pass filter 21 is 4.75 MHz below the carrier to plus 0.75 MHZ above the carrier and there exists a transition band from carrier +0.75 MHz to carrier +1.25 MHz. The rolloff at the Data Nyquist frequency (1.875 MHz) is controlled by the bandpass pulse shaping by the transmit filter 18, discussed above. A filter 63 receives the output of the analog-to-digital converter 60, and converts the signal to complex base band representation. The output of the filter 63 is substantially real. DC bias in the signal is removed in DC Remover block 67.

A carrier recovery circuit 64 controls the second demodulator 27 (FIG. 4a) such that the correct frequency and phase are recovered. An automatic gain control circuit 66 feeds back to radio frequency attenuater 53 through digital-to-analog converter 55. Both the automatic gain control circuit 66 and the carrier recovery circuitry 64 are coupled to the output of analog-to-digital converter 60. An adaptive equalizer 70 contends with various channel impairments such as echoes and multipath transmission.

The main digital data stream from the analog-to-digital converter 60 is filtered by a matched filter, which matches the response of the transmit filter 18. The digital stream is also derandomized and deinterleaved in deinterleaver 69. The equalized signal is then subjected to Reed-Solomon decoding and error correction in error correction circuitry 72. Except for the front end 23, the receiver 50 is largely realized as an integrated CMOS device by well known methods.

Analog-to-Digital Converter

There are many applications which require a fast and accurate comparator, and achieving the design in CMOS makes integrating such applications an inexpensive alternative to using external support. An example of an application is the flash analog to digital converter (denoted FADC), where a linear array of comparators convert an analog voltage into a digital representation.

CMOS comparators have a poor gain characteristic, which eventually limits the speed of comparison, and the input referred offsets are large, limiting the resolution of the comparison.

Another set of problems are switching noise through the supplies and substrate from unrelated blocks of circuitry, and switch noise from sampling devices. These problems are usually solved by using a balanced differential system.

Most amplification systems are characterized by a time constant, t, and a gain G. The evolution of the output of a comparator is generally given by the form $$V_{out} = G(V_{in} - V_{ref})(1 - e^{-t/T})$$

Obviously, after a time t, the output is determined solely by G and t. For CMOS, to make G large enough necessarily makes t larger, and so a small input ($V_{in}-V_{ref}$) will take a long time to reach a clearly delimited logic level. This limits the speed of comparison, particularly when the design requires accuracy, that is a small ($V_{in}-V_{ref}$) to resolve.

The best performance in CMOS comes from using positive feedback. This gives a large gain G with a small t as desired. The drawbacks are a) a sampling system is required, since positive feedback is destructive; and b) more than two elements are required, and the probability of mismatch is thus increased.

The input referred offsets are mainly due to the mismatch of the transistors used to implement the comparator. All the transistor mismatch can be modeled as a mismatch in a single parameter, usually the threshold voltage, $V_t$. The equation for the current in a MOS transistor is given by $$I = \beta \frac{W}{L} V_{ds} \left( V_{gs} - V_t - \frac{V_{ds}}{2} \right)$$

where $\beta$ is a physical gain term;

W/L is the width/length ratio of the transistor;

$V_{ds}$ is the voltage from the Drain to the Source;

$V_{gs}$ is the voltage from the Gate to the Source; and $V_t$ is the threshold voltage, which is a physical characteristic.

Even if two transistors are adjacent, well-matched, on the same substrate and are biased identically, the current which flows is different because the $V_t$ is not controlled. A difference of +/−40 mV in a term of approximately 700 mV is common, particularly if standard available CMOS process is used.

Figure 5A:
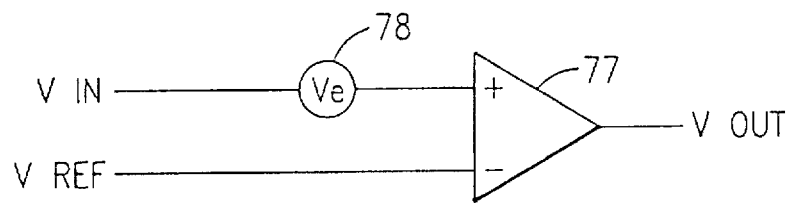
FIG. 5a is an electrical schematic illustrating a comparator that is helpful in understanding an aspect of the invention.

The input referred offset is shown in FIG. 5a, which illustrates a comparator 77. The input referred offset, $V_o$ 78, appears in series with the input $V_{in}$, and affects directly the comparison of Vin and the reference voltage $V_{ref}$. The comparison operation performs $V_{in} + V_o - V_{ref}$ and gives a result of a logic ONE if this sum is positive, and a logic ZERO otherwise. The offset $V_o$ 78 can be positive or negative, since the mismatch can go either way, and so for a ONE it must be guaranteed that $V_{in} > V_{ref} + |V_o|$, and for a logic ZERO it must be guaranteed that $V_{in} < V_{ref} - |V_o|$. The offset voltage $V_o$ 78 therefore appears as a window of magnitude Vo, centered around $V_{ref}$ in which the output of the comparison is not guaranteed to be correct.

By way of example, a 1 V peak-to-peak input into an 8-bit FADC, requires the comparator to successfully resolve a difference of at least one LSB. Since the FADC resolves to 8-bit precision there are $2^8$ or 256 levels. Therefore, the FADC must be capable of resolving to 1 V/256=3.9 mv. In general, existing systems require a resolution capability of one half the voltage differential of an LSB. With the example $V_t$ mismatch of 40 mV between two adjacent devices and the use of a two-transistor input stage this comparison is not achievable, since the comparator will not correctly resolve a difference of less than 40 mV.

The usual solution is to use a system which zeros the offset voltage $V_o$. The two main techniques used are:

a) use some down-time inherent in the system to visit each comparator, and deliberately offset the $V_{ref}$ using additional circuitry; and b) zero the offset voltage by using negative feedback and coupling the voltage difference onto a zeroed input.

Figure 5B:
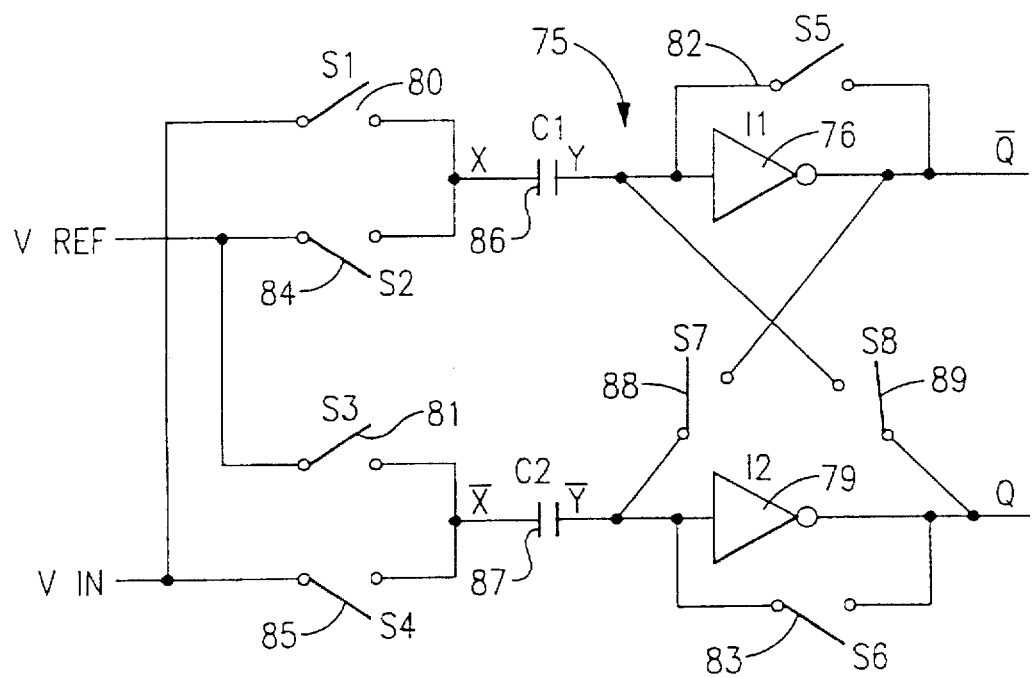
FIG. 5b is a more detailed electrical schematic of a comparator in accordance with the invention.

Both techniques have their drawbacks. Scheme (a) requires the system to have regular down-time, and the support circuitry is very large. Scheme (b) needs a sampled system, since time is needed to zero the input. The comparator of the present invention is shown schematically in FIG. 5b. The implementation of inverters 76 and 79 is not important, although it is assumed that the inverters 76, 79 have some small signal gain, g, greater than one. The operation of the comparator will be described in three phases. In phase 1, switches 80, 81, 82, and 83 are closed; the other switches in FIG. 5b are open. Switch 80 drives the node X to the voltage $V_{in}$. Switch 81 drives the node $\overline{X}$ to the voltage $V_{ref}$. Switch 82 connects inverter 76 with negative feedback ensuring that the input voltage and the output voltage are the same. This voltage is $V_{th}$, the threshold voltage of the inverter 76, and does not depend on any input offset. The net effect is to zero the input to the inverter 76. Switch 83 zeroes inverter 79. It should be noted that the voltages on Y and $\overline{Y}$ are not necessarily the same.

In phase 2, switches 84 and 85 are closed, the others open. Since nodes Y and $\overline{Y}$ are not driven, some fraction (near one) of the voltage change on X and $\overline{X}$ respectively will accrue due to the action of capacitors 86 and 87. Switch 84 drives the voltage $V_{ref}$ onto node X, thus causing a voltage change of ($V_{in}-V_{ref}$). The voltage accrued on Y will be some fraction of ($V_{in}-V_{ref}$), say f1 ($V_{in}-V_{ref}$) where f1 is approximately 1.0. Switch 85 drives the voltage $V_{in}$ onto node $\overline{X}$ thus causing a voltage change of $V_{ref}-V_{in}$. The voltage accrued on $\overline{Y}$ will be some fraction of ($V_{ref}-V_{in}$), say f2 ($V_{ref}-V_{in}$), where f2 is approximately 1.0.

The small signal gain of an inverter is given by:

$$V_{out}-V_{th}=g(V_{in}-V_{th})$$

and so the voltage on node Q will reach a value V given by:

$$V-V1=g1(f1(V_{in}-V_{ref})-V1)$$

where V1 is the zero voltage for inverter 76; and the voltage on node Q will reach a value V given by:

$$\overline{V}-V2=g2(f2.(V_{ref}-V_{in})-V2)$$

where V2 is the zero voltage for inverter 79.

In phase 3, switches 88 and 89 are closed, and switches 80, 81, 82, 83, 84 and 85 are open. To understand the operation, it is easier to assume that g1=g2=g and f1=f2=f and V1=V2=$V_{th}$. This is approximately correct, and is mathematically more clear. Switches 88 and 89 connect inverters 76 and 79 in positive feedback. The input voltage applied before feedback starts is just (V-$\overline{V}$).

$$V-\overline{V}=g\,f(V_{in}-V_{ref}-(V_{ref}-V_{in})) =2gf(V_{in}-V_{ref})$$

Assuming the f is approximately 1.0, an amplifier is now connected in positive feedback with an input magnitude of 2 g($V_{in}-V_{ref}$). The original signal has been amplified by a factor of 2 g before positive feedback is applied.

The system including inverters 76, 79 connected with positive feedback has an input referred offset, but if the designer ensures that 2 g is large enough, then the comparison can be guaranteed.

The circuit of FIG. 5b is fully symmetric, balanced and differential. Any common-mode switching noise will be rejected. Control of the switches according to phases 1–3 may be accomplished, for example by a 3:1 counter, or a 3 stage shift register.

Figure 6A:
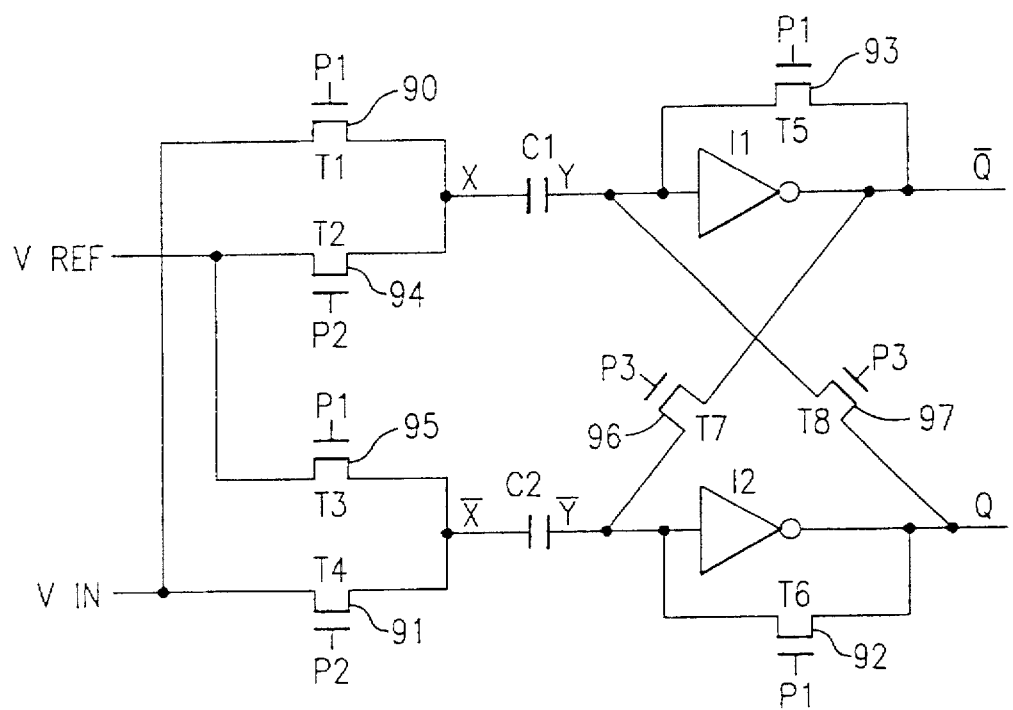
FIG. 6a is a schematic illustrating a preferred embodiment of the circuit shown in FIG. 5b.
Figure 6B:
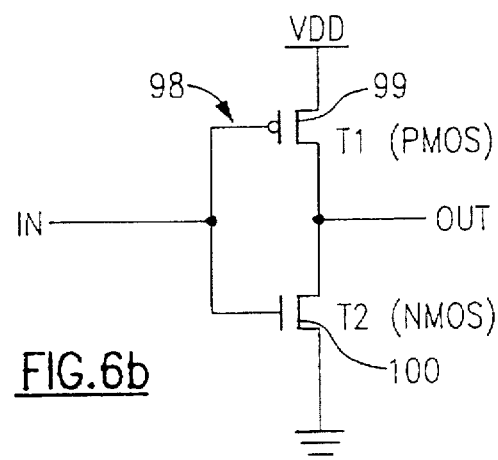

FIG. 6a is a CMOS circuit corresponding to the circuit of FIG. 5b, which is preferably used with transistors 90–97 replacing switches 80, 84, 81, 85, 82, 83, 88, 89 and the inverters 76, 79 implemented as shown in FIG. 6b, wherein inverter 98 is comprised of a PMOS transistor 99 and an NMOS transistor 100. The CMOS circuit of FIG. 6a is preferably included in the integrated circuit of the receiver 50. In FIG. 6a, switch control values of P1–P3 are as follows:

| P1 = HIGH | PHASE 1 | P2=P3=LOW |
|---|---|---|
| P2 = HIGH | PHASE 2 | P1=P3=LOW |
| P3 = HIGH | PHASE 3 | P1=P2=LOW |

Timing Recovery

Figure 53:
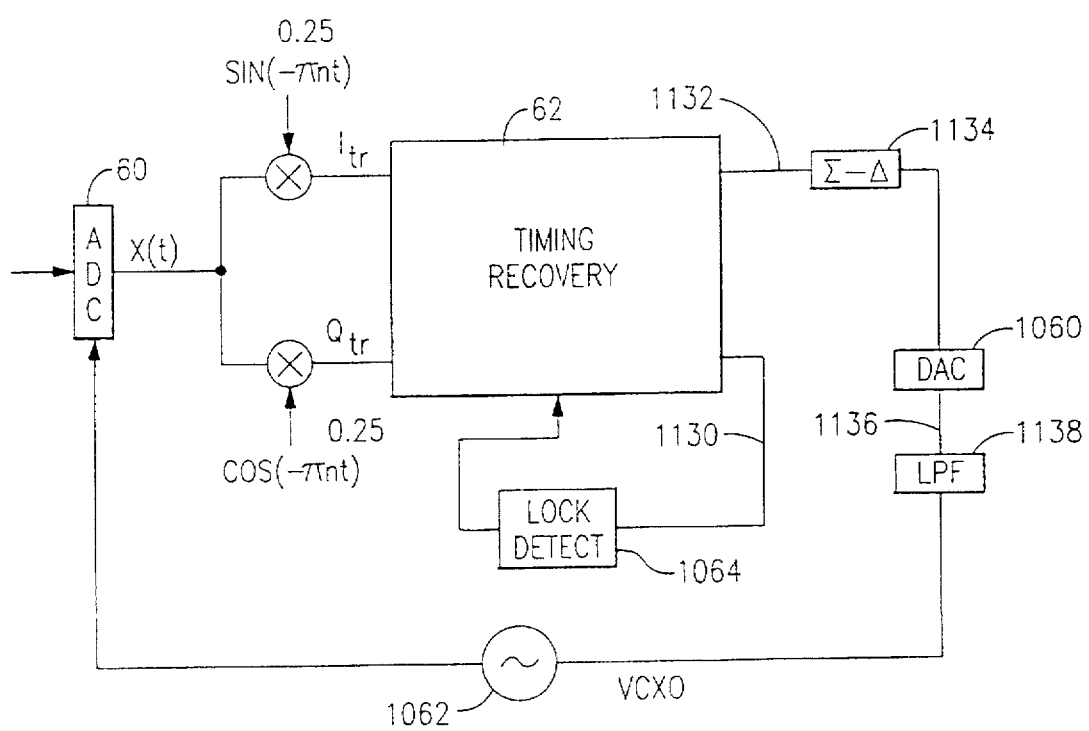
FIG. 53 is a block diagram of the timing recovery circuit as used in the receiver according to the present invention.

In order to properly detect the received data from the sampled signal emerging from the analog-to-digital converter 60 (FIG. 4), it is necessary to accurately follow the timing of the received signal. FIG. 53 shows a block diagram of the portion of the receiver controlling analog-to-digital converter sample timing, and FIG. 54 shows the timing recovery portion in detail.

As described with reference to FIG. 53 and FIG. 23, samples of the received signal, x(t), emerge from the analog-to-digital converter as a 15 megasamples per second signal having a carrier frequency at 5.625 MHz and a rolloff at data Nyquist of 1.875 MHz. The output of analog-to-digital converter 60 is split, and each branch multiplied with a periodic signal to provide signal inphase (real) and quadrature (imaginary) components $I_{tr}$ and $Q_{tr}$, respectively, which have been down converted from the third intermediate frequency so that the data Nyquist frequency (1.875 MHz) has been shifted down to 0 Hz (DC). The timing recovery block 62 accepts inputs $I_{tr}$ and $Q_{tr}$ and outputs a digital error signal representative of the difference between the transmitted signal rate and the rate used to initially sample the incoming signal. It also outputs a lock detect signal 1130 to a lock detect circuit 1064, the operation of which will be described in further detail below. The digital error signal is converted to an analog signal by digital to analog converter 1060. The analog signal is passed to a voltage controlled crystal oscillator 1062 which controls the frequency at which the signal is sampled in the analog-to-digital converter 60.

Figure 54:
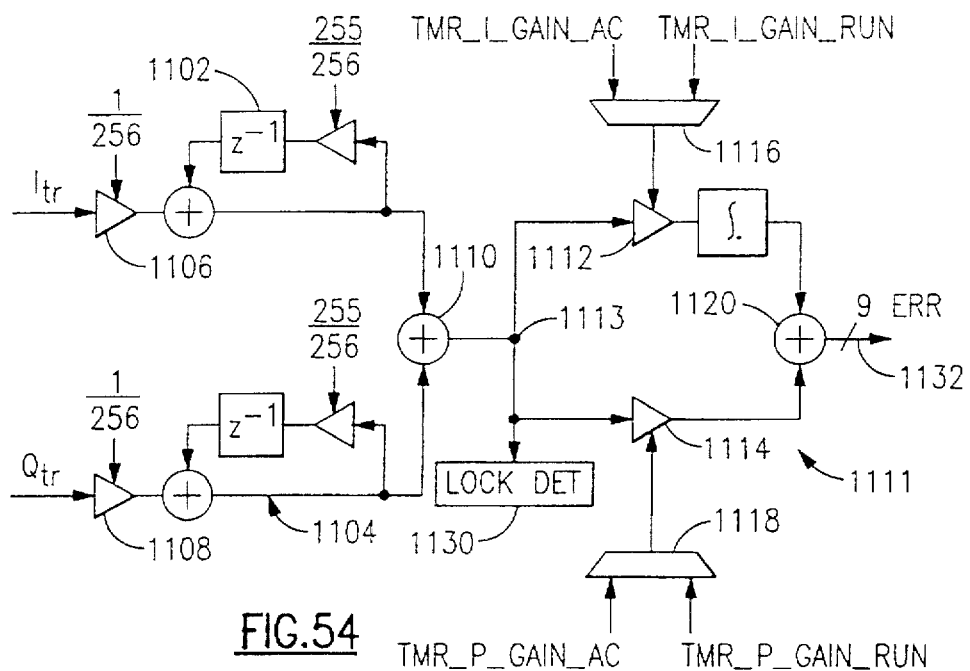
FIG. 54 is a detailed electrical schematic of the timing recovery circuit according to the present invention.

As shown in FIG. 54, inside the timing recovery circuit of the system there are provided delay feedback loops 1102 and 1104. The inphase and quadrature signal components $I_{tr}$ and $Q_{tr}$ are first attenuated by amplifiers 1106 and 1108 which each amplify the signal components with gain of 1/256. The delay feedback loops 1102 and 1104 each amplify the attenuated signal components with gain of 255/256 and delay the signal components as indicated by one cycle. This operation causes the timing recovery to be primarily dependent on the signal's past history while also remaining somewhat dependent on the present state of the signal, thereby providing low pass-filtered versions of the inphase and quadrature signal components $I_{tr}$ and $Q_{tr}$.

The resultant components are next multiplied together by multiplier 1110. This produces a signal $I_{tr}Q_{tr}$ 1113 which is proportional to the sine of the frequency difference between the symbol rate and the frequency of the sampling rate which was used.

The signal $I_{tr}Q_{tr}$ 1113 is output directly as a lock detect signal 1130. At the same time, the signal $I_{tr}Q_{tr}$ 1113 is applied to a proportional integral loop filter 1111. In the proportional integral loop filter 1111, the result is applied to two selective gain amplifiers 1112 and 1114 which can be operated alternately with a non-steady state gain value and with a steady state gain value. Thus, the gain on the integral side of the proportional integral loop filter 1111 is switched by selector 1116 to tmr_i_gain_ac during the acquisition phase in "locking" onto the signal timing. Once lock has been acquired, selector 1116 switches the gain to the steady state value, tmr_i_gain_run. The process occurs in parallel on the proportional side of the filter, as the amplifier gain is switched by selector 1118 between acquisition gain tmr_p_gain_ac and steady state gain tmr_p_gain_run.

The signal on the proportional side of the proportional integral loop filter is amplified without integration and passed forward. The signal on the integral side of the filter, however, is integrated and then passed to an adder 1120 to be combined with the signal emerging from the proportional gain amplifier. The two signals are recombined by adder 1120 and output as a 9-bit error signal 1132 which is then sigma-delta modulated in a sigma-delta modulator 1134 to form the single bit output TCTRL 1136. The output TCTRL 1136 is filtered by low pass filter 1138 and presented to the input of the voltage-controlled crystal oscillator 1062.

The lock condition is detected from the unprocessed lock detect signal 1130 of the filter in a sequence of operations as performed by a lock detect circuit 1064 which is implemented as a state machine. The following C code fragment is illustrative of the operation of the state machine:

```
if (clock_count == 0)
}
    count = 0;
    irr_val = 0;
    lock = False;
{
if ((clock_count %8192) == 0)
    count++;
/* irr_val is the average error */
iir_val = err + irr_val- (irr_val>>13);
if ((abs (iir_val) > pow (2, (tmr_lock_value+1)))
    count = 0;
of (count > tmr_lock_time)
    lock = True;
```

Upon detection of the lock condition, the proportional integral loop filter 1111, changes modes from the "acquisition" state in which "acquisition" gain values tmr_i_gain_ac and tmr_p_gain_ac have been used, to the locked condition in which the "run" gain values tmr_i_gain_run and tmr_p_gain_run are used. The acquisition condition is better suited for the broadband case where, for example, the receiver has just been turned on or the channel selector has just been switched. The lock condition is intended for use when a steady state condition has been achieved, i.e. the signal has been locked upon, and a finer, narrow band control over the timing recovery has been made possible.

The gain values used in the proportional-integral loop filter should be chosen to provide the required values of the loop natural frequency $\omega_n$ and damping factor zeta ($\zeta$), given the characteristics of the voltage controlled crystal oscillator, the external analog low pass filter and the input signal magnitude.

Carrier Recovery

The operations of carrier recovery, phase and frequency locking are performed on the discrete time sampling of the signal output from the analog-to-digital converter. These functions are performed by the carrier recovery block 64 shown in FIG. 4.

Figure 4A:
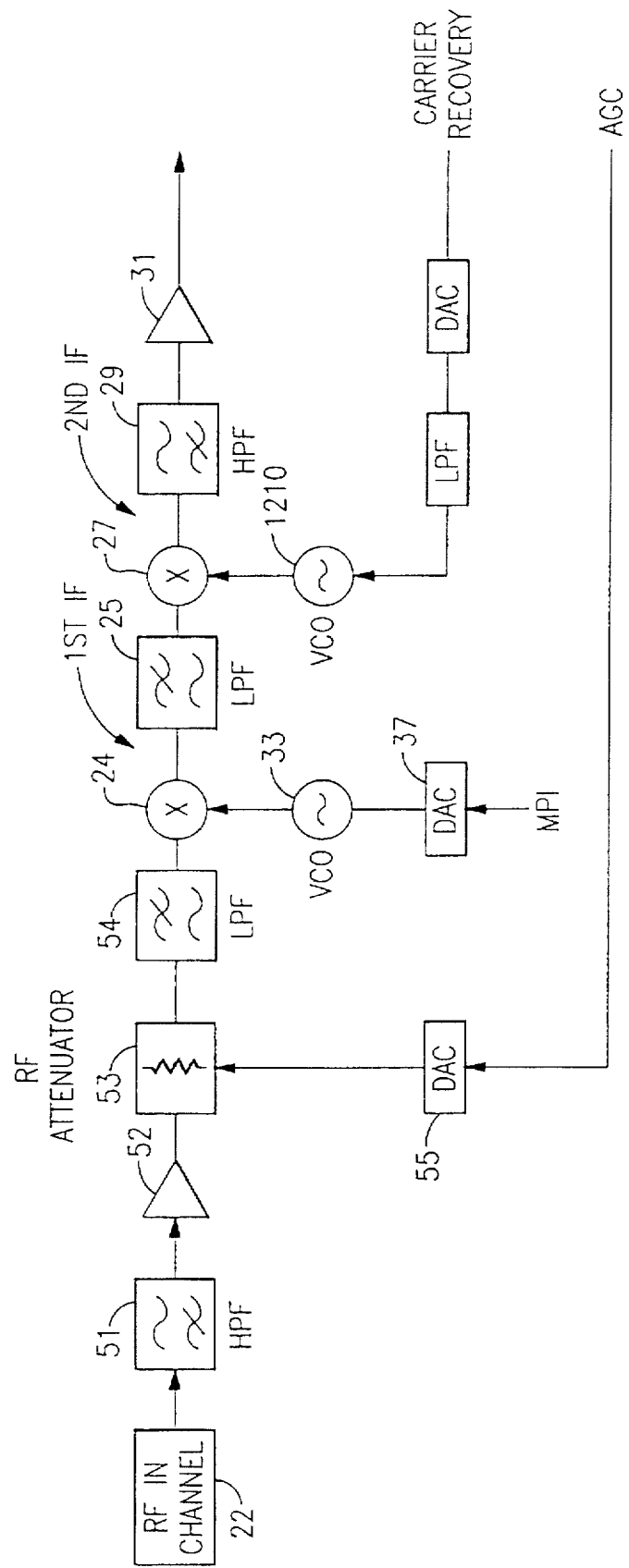
FIG. 4a is a more detailed block diagram of a portion of the receiver shown in FIG. 4.
Figure 48:
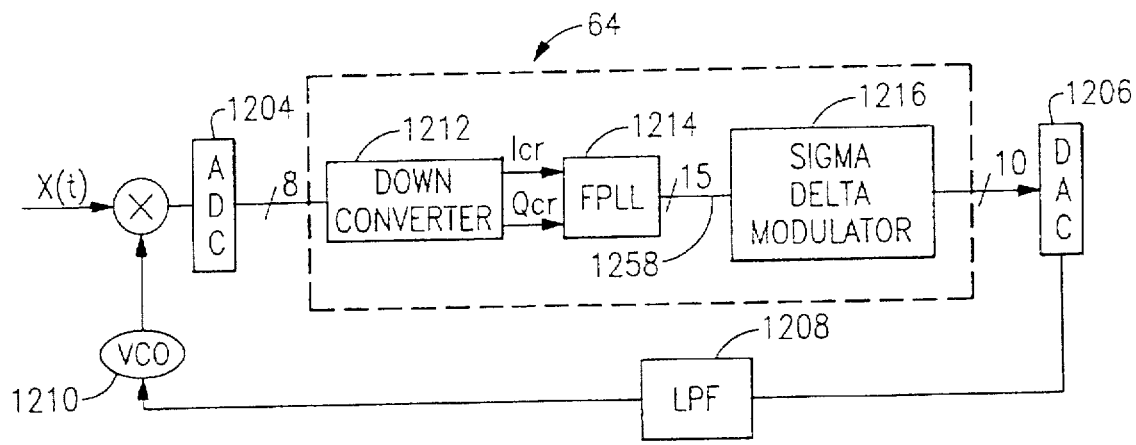
FIG. 48 is a block diagram of the carrier recovery circuit used in the receiver according to the present invention.

The carrier recovery and locking functions are performed with hardware that is similar to that used for the timing recovery operation. FIG. 48 shows a block diagram of the carrier recovery block, 64 as used in the receiving system of the present invention. As is evident from FIG. 48, the carrier recovery block 64 receives input in the form of an 8-bit-wide pulse train at 15 megasamples per second from the analog-to-digital converter 1204 and provides output in the form of a 10-bit-wide data signal to digital-to-analog converter 1206. The output from digital-to-analog converter 1206 is low pass filtered through low pass filter 1208, and provides a control signal to voltage controlled oscillator 1210. The voltage controlled oscillator 1210 in turn is used in the down conversion process of the incoming analog signal as shown in FIGS. 4 and 4a.

The blocks used to perform the functions of the carrier recovery block are a down converter 1212, a frequency and phase locked loop (FPLL) 1214, and a sigma-delta modulator 1216.

Down Conversion

Inside the carrier recovery block 64 (FIG. 48) a down conversion from the third intermediate frequency to baseband is performed. Down conversion is performed in a manner similar to that used by the matched filter, as herein described below with respect to FIGS. 42–46. Successive pulses of the 15 megasamples per second analog-to-digital converter output signal 1204 are multiplied by complex coefficients representative of a 5.625 MHz periodic function in superheterodyne manner to convert the signal down to baseband. The resultant baseband inphase and quadrature components $I_{cr}$ and $Q_{cr}$ are then passed to the frequency and phase locked loop 1214.

Frequency and Phase-Locked Loop

Frequency and phase locked loop 1214 operates upon 8-bit in-phase and quadrature signal components $I_{cr}$ and $Q_{cr}$ to generate a 14-bit wide output signal to sigma-delta modulator 1216 which itself, in turn, outputs a 10-bit wide signal to digital-to-analog converter 1206 for controlling voltage controlled oscillator 1210. The use of a 10 bit wide digital-to-analog converter 1206 permits a relatively high degree of precision to be obtained in controlling voltage controlled oscillator 1210. It is possible that a lower degree of precision will be sufficient, even desirable, for operating the receiver of the present invention. In such case, a fewer bit input digital-to-analog converter can be operated simply by connecting the higher order bits to the digital-to-analog converter and not using the least significant bits of the output of the sigma-delta modulator. Alternatively, the lowest order bits not output to the digital-to-analog converter can be used in the feedback loop of the sigma-delta modulator 1216.

Figure 49:
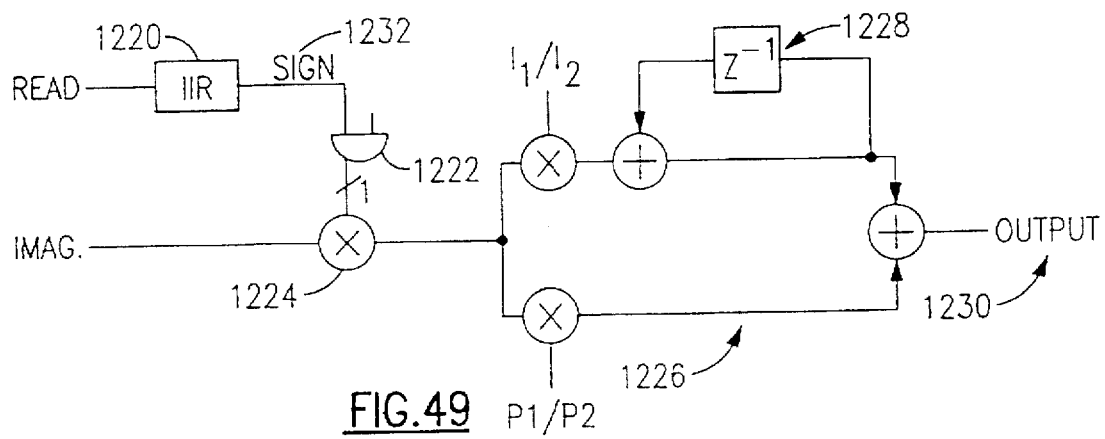
FIG. 49 is a schematic of the carrier recovery circuit shown in FIG. 48.

A block diagram of the frequency and phase locked loop 1214 is shown in FIG. 49. As shown in the figure, the "real" or inphase component of the signal is applied to infinite-impulse response (IIR) filter 1220, while the imaginary or quadrature component of the signal is applied directly to the multiplier. Infinite-impulse response filter 1220 is used as a low pass filter in the path of the real signal components to filter out the double frequency harmonics which remain after the superheterodyne down-conversion. From the output of infinite-impulse response filter 1220, only the sign information of the signal remains important. The sign information is then gated by AND gate 1222 to multiplier 1224 to produce a signal p(t) of value, either "Imag" or "-Imag." The resultant signal p(t) is then applied to a proportional integral loop filter 1226.

The proportional integral loop filter 1226 operates in a manner similar to that described for the proportional integral loop filter 1111 of the timing recovery block. Proportional integral loop filter 1226 has a proportional side wherein signal p(t) is multiplied by a coefficient $P_1$ or $P_2$. Proportional integral loop filter 1226 also has an integral side wherein the signal p(t) is multiplied by a different coefficient $I_1$ or $I_2$ and then integrated by a delay unit plus adder feedback loop. The sum resulting from the addition of signal parts arriving from the proportional and integral sides of the proportional integral loop filter 1226 forms the output 1230 which is transferred to the sigma-delta modulator 1216.

The proportional integral loop filter 1226 is constructed to operate in two different modes. In the first mode, the proportional integral loop filter 1226 is used to lock onto the frequency of the received carrier. In this mode, constant coefficients $I_1$ and $P_1$ are used to tune the receiver to the close frequency range until frequency lock is detected. In the first mode the sign 1232 of the real signal component is passed by AND gate 1222 to multiplier 1224.

After lock is detected, the proportional integral loop filter 1226 operates in a second mode to make finer adjustments to the tuning frequency. In the second (fine) adjustment mode, constant coefficients $I_2$ or $P_2$ are used as inputs to the multipliers. However, in the second mode, the sign of the signal component is not passed by AND gate 1222, and is not used in that mode.

In this discrete time signal filtering embodiment, constant coefficients $I_1$, $I_2$, $P_1$, and $P_2$ are discrete time pulse trains which default on "power-up" to predetermined sequences but which can be altered through manipulation by connected digital devices. As such, the coefficients have the potential to be altered to adjust for different conditions.

Sigma-delta Modulator

Figure 51:
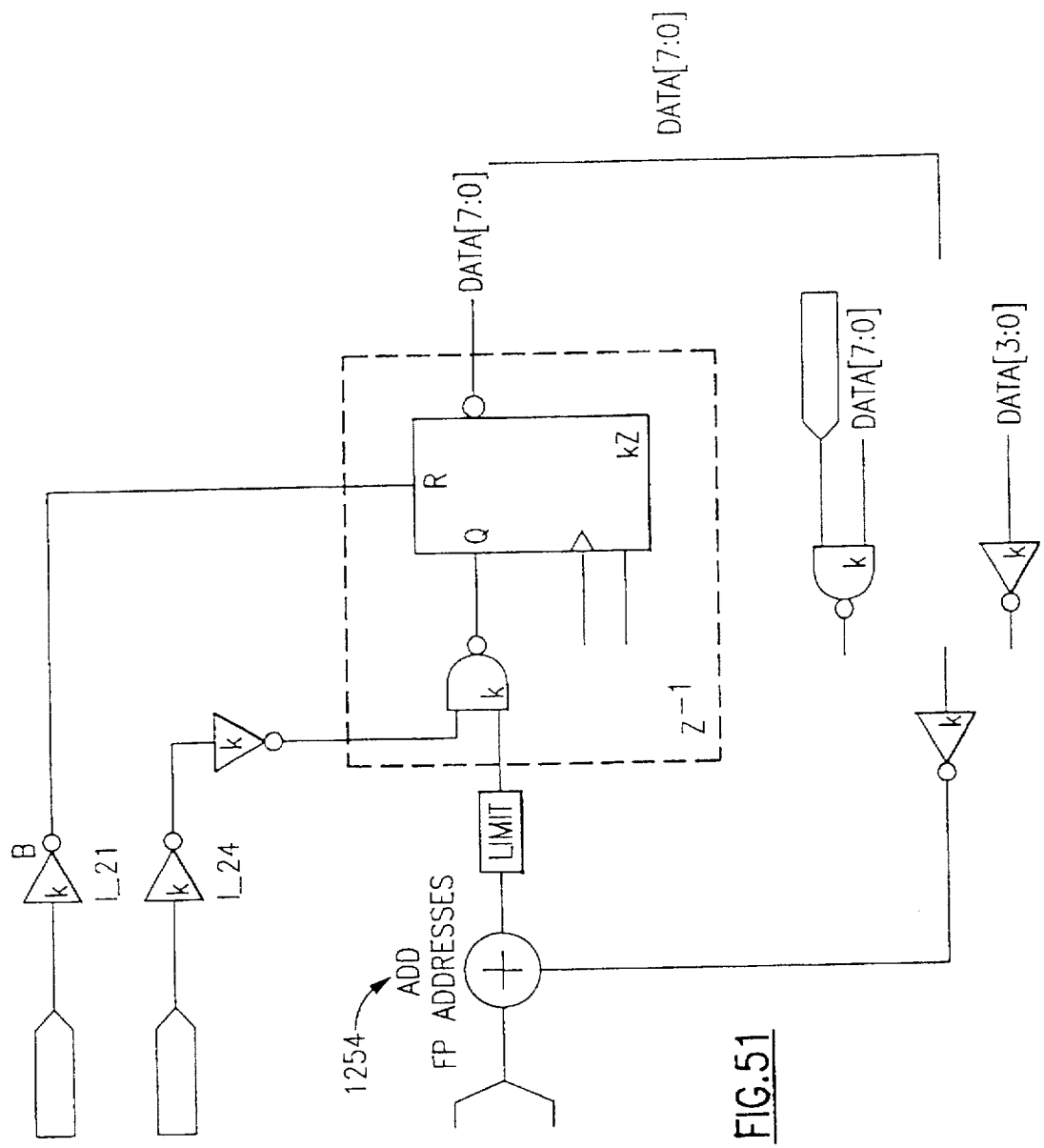
FIG. 51 is an alternate embodiment of portions of the carrier recovery circuit shown in FIG. 49.

Sigma-delta modulator 1216 receives fifteen bit input SDIN(14:0) from frequency and phase locked loop 1214, and outputs a ten bit wide signal to digital-to-analog converter 1206. At the head of the sigma-delta modulator 1216, adder 1254 see FIG. 51 produces a 16-bit wide output. The 16-bit output is fed into a limiter 1262 which saturates when the 16 bit number exceeds 14 bit number capability, outputting the limited 14 bit number. The resultant 14-bit stream [13:0] is then divided into two parts: the ten most significant bits are fed directly into the digital-to-analog converter 1206, while the four least significant bits are fed back to the adder 1254 through delay unit 1266.

Figure 52:
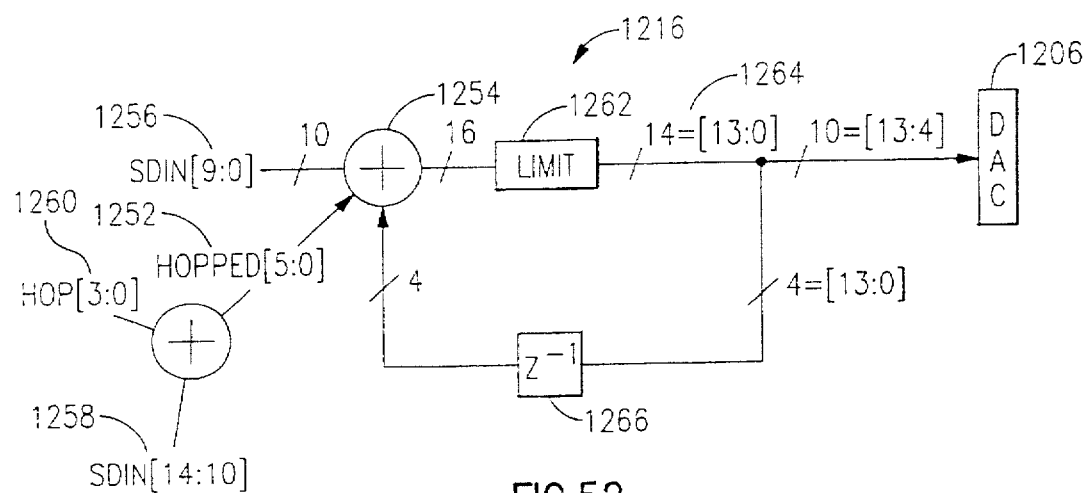
FIG. 52 is a diagram illustrating the sigma-delta modulator in the circuit shown in FIG. 49.

In FIGS. 49 and 52 another feature of the carrier recovery block of the present invention is shown. Should the proportional integral loop filter 1226 be unable to lock onto the frequency of the received intermediate frequency signal, an adder 1260 can be used to add a discrete frequency shift value HOP(3:0) to the five higher order bits of the current frequency value SDIN 1258 in the proportional integral loop filter 1226. Then, the output HOPPED(4:0) 1252 of the adder 1260 is then recombined with the 10 lower order current frequency bits SDIN(9:0) 1256 by the adder 1254 at the input to the sigma-delta modulator.

Derandomization

Figure 41:
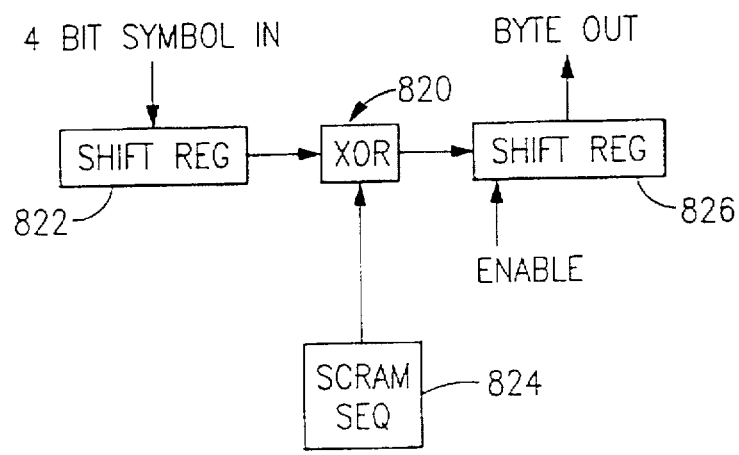
FIG. 41 is a block diagram of the descrambler used in the adaptive equalizer shown in FIG. 34.

Derandomizing is performed on the output of the analog-to-digital converter 60 (FIG. 4) by reversing the randomization performed prior to transmission as discussed above. FIG. 41 is a block diagram of a descrambler 820 which packs the symbols into bytes and derandomizes them. The descrambling function that is performed is the reverse of the randomization performed prior to transmission which was discussed above. The output of a 4 bit shift register 822 is exclusive ORed with the randomization sequence 824. The output is conditionally shifted into a serial-to-parallel shift register 826, enabling unwanted bits in 8-VSB, 4-VSB, and 2-VSB to be discarded as symbols are packed into output bytes. The deinterleaver 69 (FIG. 4) processes the derandomized output.

Deinterleaver

As discussed above with reference to Table 1, data on the channel is 16-way interleaved in order to improve burst error performance. Thus a burst of 16 erroneous bytes (32 symbols) will introduce single byte errors in 16 packets. The error correction circuitry 72 (FIG. 4) disclosed hereinbelow can cope with 10 erroneous bytes in a 208 byte packet. Thus the deinterleaver combined with the error correction circuitry 72 can cope with isolated 32×10 symbol burst errors.

Figure 16:
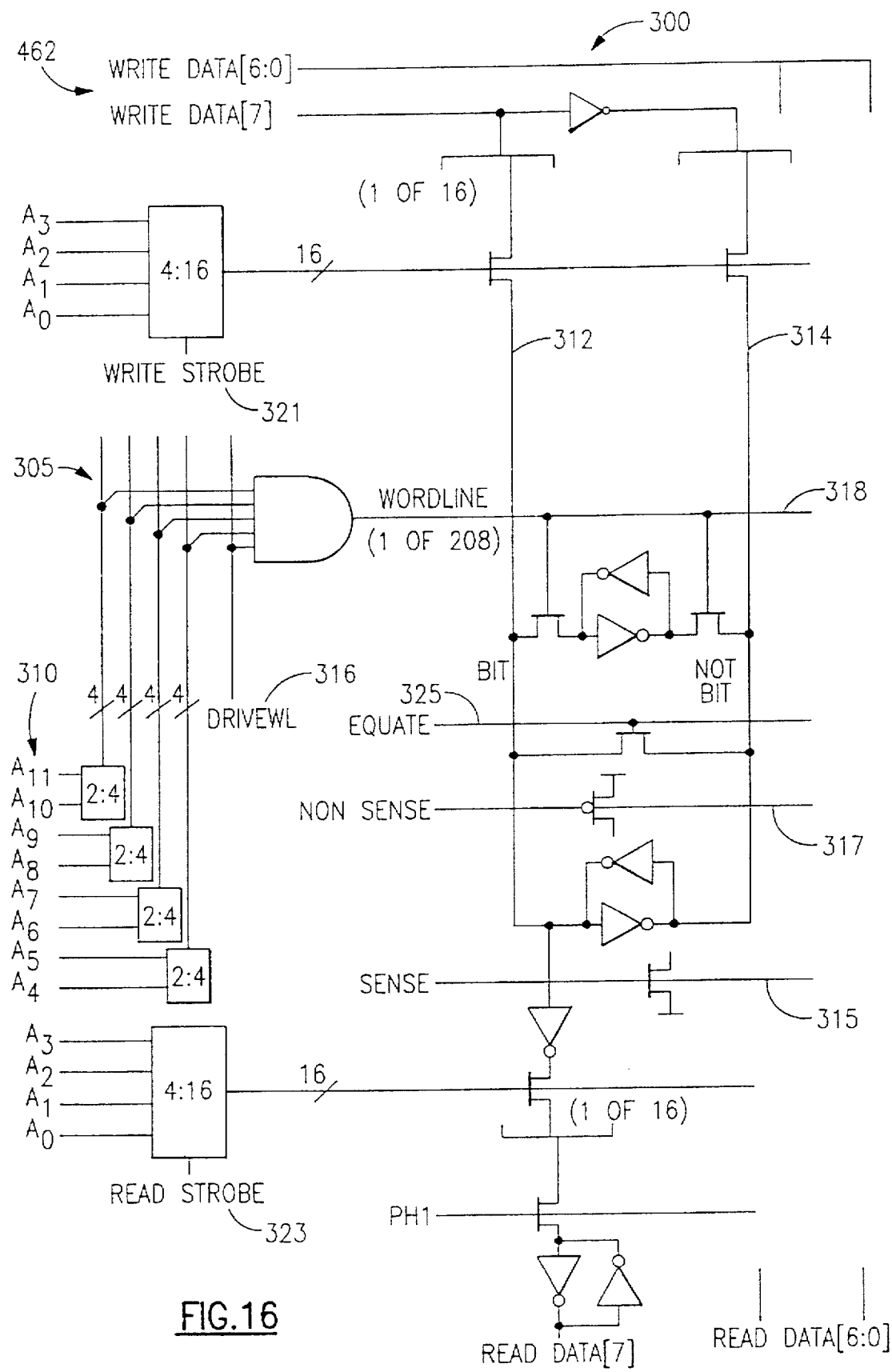
FIG. 16 is a schematic showing aspects of a RAM used in the deinterleaver shown in FIG. 21.
Figure 17:
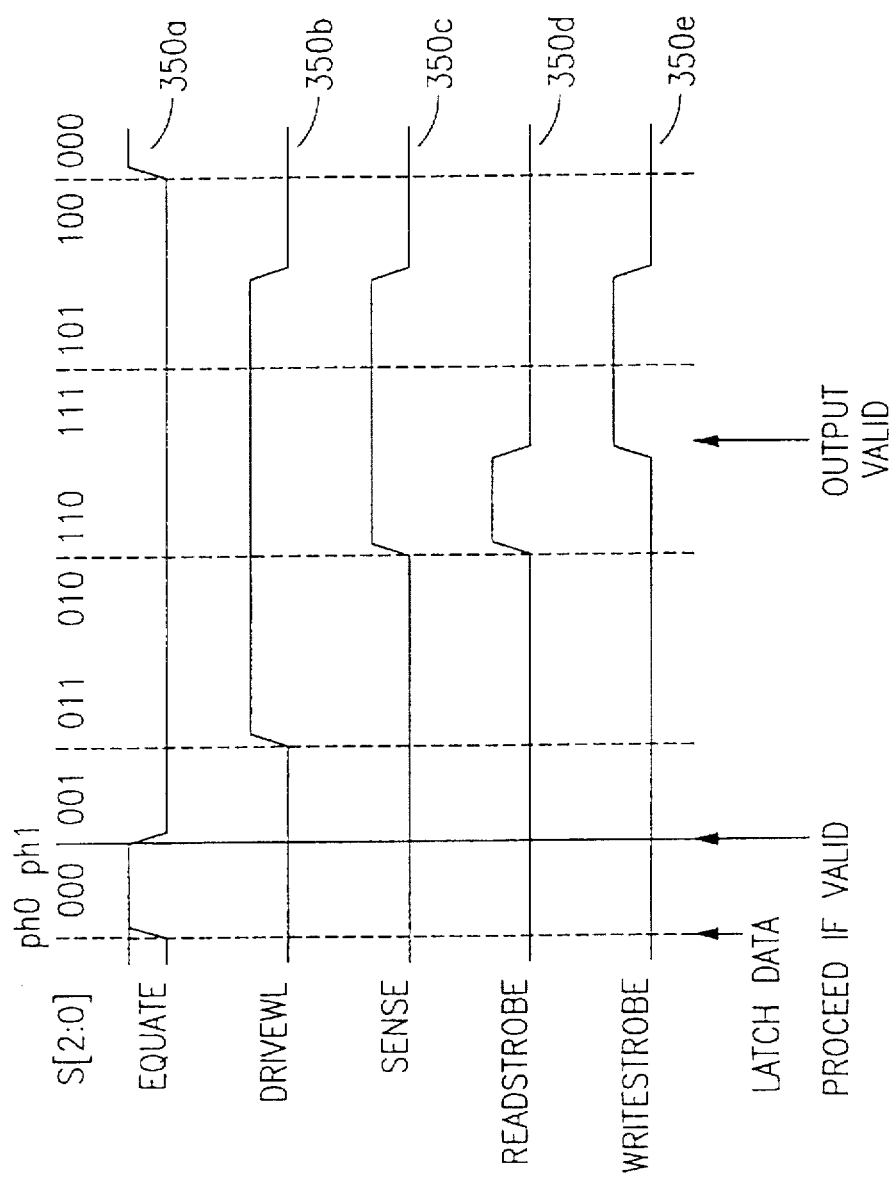
FIG. 17 is a timing diagram that illustrates the operation of the RAM shown in FIG. 16.

The deinterleaver 69 is explained with reference to FIGS. 16–21. FIG. 21 shows a high level schematic. The RAM 300, a component of block 458 of the deinterleaver circuit, is shown in more detail in FIG. 16. FIG. 17 is a timing diagram illustrating the read-write cycle in the RAM 300. The addressing scheme for the RAM 300 is described with reference to FIGS. 18 and 19. Control of the mode of operation for the RAM 300 is discussed with reference to FIG. 20.

The deinterleave buffer reassembles packets from the interleaved data stream. Deinterleaving is discussed with reference to the 16-VSB transmission scheme and FIG. 16, but is similar with other VSB levels. Each frame of data carries a payload of N interleave blocks, wherein each interleave block is 16 packets, or 208×16=3328 bytes long. N=20 for 16-VSB, 15 for 8-VSB, 10 for 4-VSB, and 5 for 2-VSB.

In operation the data is first synchronized by correlation with the 31 frame sync symbol sequence transmitted in the frame header discussed above. Once these are identified, a check is made for the frame sync sequence at expected intervals to assure integrity of the data stream. A block of interleaved derandomized data is read into an internal RAM buffer, elements of which are shown generally at 300. It is an aspect of the invention that only one 3328 byte RAM is required for the deinterleaver, because, as explained in further detail below, as data is being output from the RAM 300, new data from the succeeding interleave block is being written to the same location. This approach nearly minimizes the amount of on-chip RAM required at the expense of a slightly more complicated addressing scheme. Further reduction of RAM could only be attained at the expense of significantly increasing the complexity of the control structure with very little gain. The RAM 300 is organized as 128 columns by 208 rows, and uses a 6T cell and regenerative sense amplifier/precharge circuit. The row decoder 305 is simplified by an additional predecoder 310. Each column has its own sense amplifier. A column multiplexer (not shown) follows the sense amplifiers. Timing is controlled by an eight cycle state machine which is hardwired to perform read-modify-write cycles. No analog timing pulse generators or overlap/underlap circuitry is used.

The RAM requires five timing strobes, which are explained with reference to FIGS. 16 and 17. The output of EQUATE strobe 325 is referenced 350a in FIG. 17. The cycle is initiated by shorting the bit line 312 to the not-bit line 314. The strobe DRIVE WL 316, referenced as line 350b, enables the row decoder 305 to drive one word line 318 high. It is important that EQUATE strobe 325 does not overlap the strobe DRIVE WL 316; hence they are separated by one clock. Otherwise data could be corrupted as the accessed cells would be driving equated lines 312, 314. The address must be held until after the strobe DRIVEWL 316 has been removed, so that other lines do not become corrupted by a changing address. The strobe SENSE 315 should not be enabled until the word line has been asserted long enough to produce a reasonable differential. If the strobe SENSE 315 is enabled too early it can flip incorrectly and corrupt the data.

There is plenty of time available, so the timing generator is a simple eight cycle gray code counter. Its primary outputs, indicated in FIG. 17, are decoded to control the RAM timing strobes.

The standard row decoder 305 is built from 6 input AND gates which limits the number of rows to 64; however RAM 300 requires 208 rows. Adding two more inputs to the AND gate would make the wordline driver difficult to lay out in a desired cell height pitch. Therefore predecoding is employed in predecoder 310. Instead of bussing A0, NOTA0, A1, NOTA1 to all wordline drivers, NOTA0 & NOTA1, NOTA0 & A1, A0 & NOTA1, A0 & A1 are bussed instead. Each wordline driver now connects to one from each group of four, where in the simple case it connected to two in every group of four. Now each wordline driver need only be a 4 input AND gate.

Figure 18:
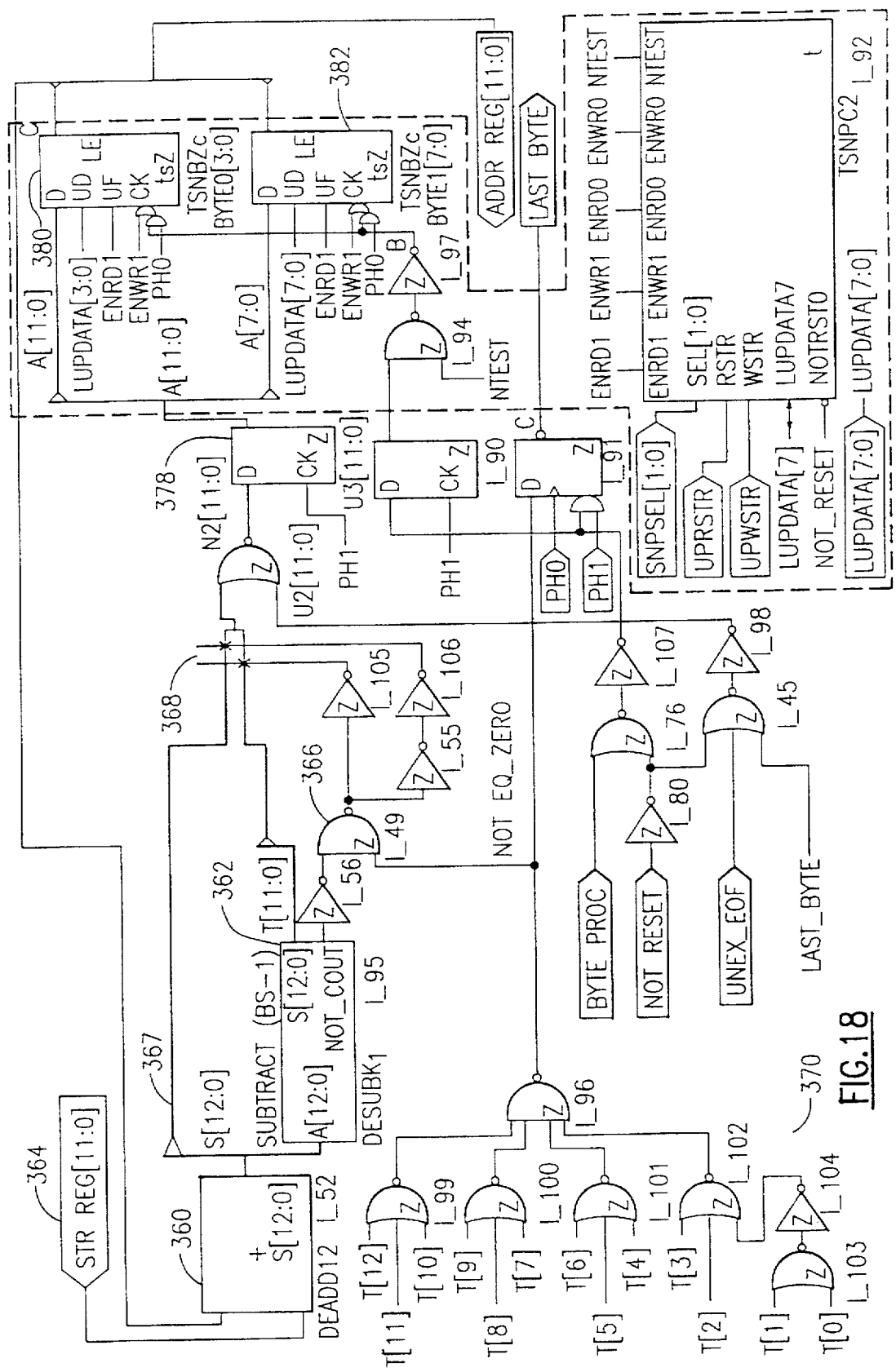
FIG. 18 is a schematic of hardware for implementing an addressing arrangement in the deinterleaver shown in FIG. 21.

The generation of addresses is shown in further detail with reference to FIG. 18. In the addressing scheme according to the invention, addresses in the RAM 300 are selected such that successive selections differ in location by an interval termed the "stride". Initially the stride has a value of 1. On the left hand side, block 360 is an adder which adds the stride to the current address. The stride is input from register STRIDE REG[11:0] 364. The output of block 360 is submitted to a subtracter 362, which subtracts the constant BLOCKSIZE−1 to form a result T [11:0], referenced 366. If the result 366 of the subtraction is less than zero, there will be a carry-out which is used to select whether the value was greater than BLOCKSIZE−1. If the value was greater than BLOCKSIZE−1, the result of the subtraction T[11:0] is used to form the next address. Otherwise the result 367 of the adder 360 is used to form the next address. A multiplexer 368 is used to select between the adder and subtracter outputs. In the special case where the adder output equals the BLOCKSIZE−1, corresponding to the last address in the block, the combinatorial logic 370 detects this case and forces the selection of the adder output. The address value is latched in latch 378, and also snooped latches 380, 382. These snooped latches are used only for testing of the chip. The output of the adder will never be more than twice the blocksize. This is because the maximum address value is BLOCKSIZE−1. The maximum value of register STRIDE REG[11:0] 364 is BLOCKSIZE−1, so the sum is limited. This means that a modulus operation can be easily performed by subtracting zero or subtracting BLOCKSIZE−1.

Figure 19:
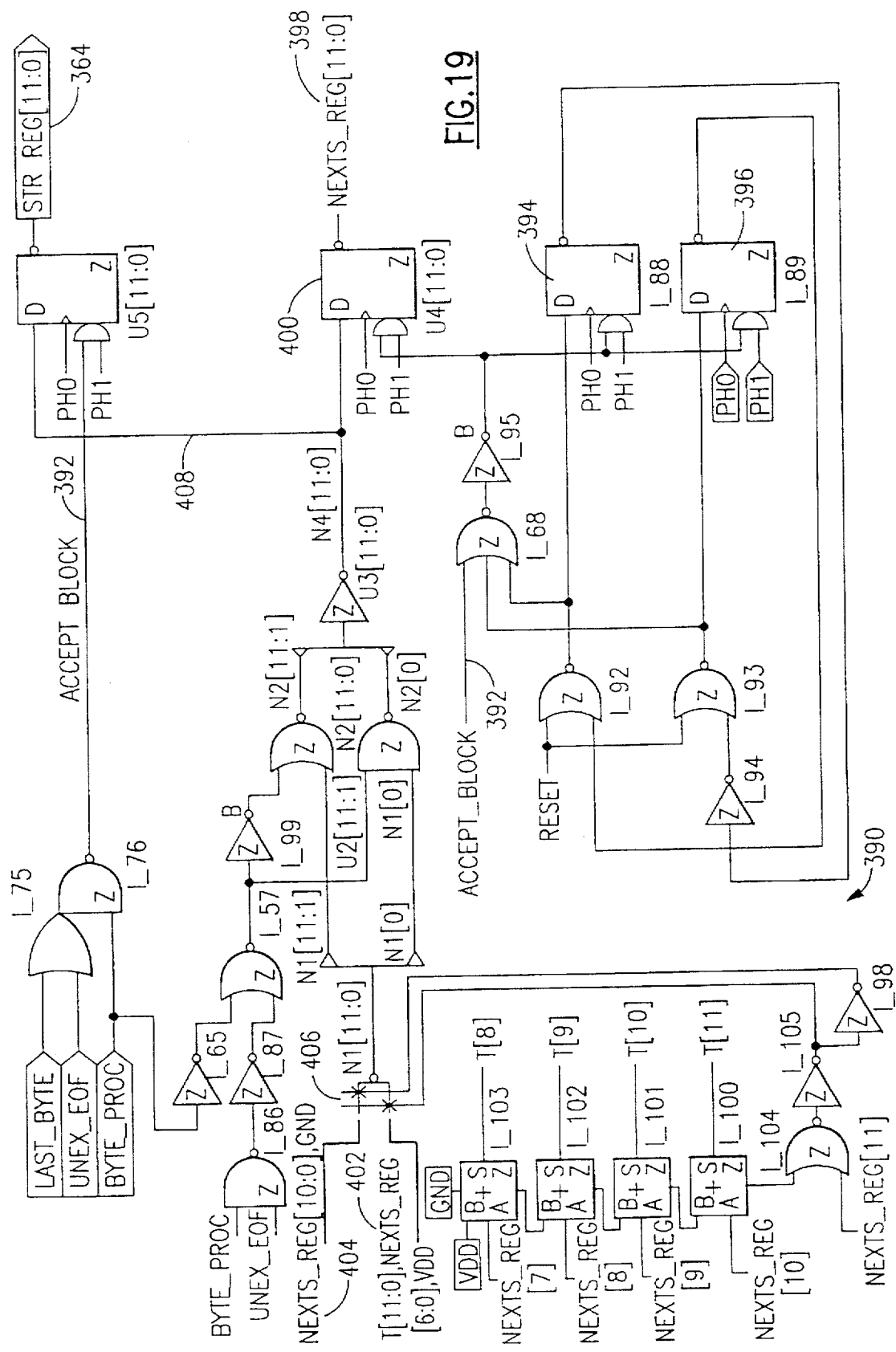
FIG. 19 is a schematic of a circuit for determining the stride rate for the deinterleaver shown in FIG. 21.

Generation of the stride value held in STRIDE REG[11:0] 364 is explained with reference to FIG. 19. The signal ACCEPT BLOCK 392 is generated at the end of each block, and causes STRIDEREG[11:0] 364 to be updated with a new stride value. While a block of data is being read out, a new stride value is being concurrently generated in the circuitry referenced generally at 390. ACCEPT BLOCK 392 triggers the operation of a simple counter state machine, comprising latches 394, 396. This simply counts four times. The stride value is multiplied by 16, the interleave depth, after each block has been processed, and this has been implemented by shifting its value left four times. The purpose of the latches 394, 396 is simply to count four cycles. At each cycle the value of register NEXTS_REG [11:0] 398, the output of latch 400, is multiplied by 2, i.e. shifted left one place and held in register NEXTS_REG [10:0] 404. A multiplexer 406 selects either the register NEXTS_REG[10:0] 404, or the register T[11:8]NEXTS_REG[6;0] 402. The latter represents the output of a subtracter and contains the shifted left value-(BLOCKSIZE−1) to update register NEXTS_REG[11:0] 398. This cycle of doubling and conditionally subtracting BLOCKSIZE−1 is performed four times. The end result, after completion of 4 cycles, is a new value of STRIDEREG[11:0] 364 on bus 408, equal to 16 times the current value of register STRIDEREG[11:0] 364 modulo (BLOCKSIZE−1).

Control of the read-write-modify operation in the RAM 300 is explained with reference to the following fragment of C code:

```
full = empty = (addr == 3327);
unexpected_eof = (eof && !full);
switch (state)
{
    filling : if (full) next_state = running;
    break;
    running : if (change_channel) next_state = emptying;
    break;
    emptying : if (empty) next_state = filling;
    break;
}
if (unexpected_eof) || (filling && change_channel))
{
    next_state = filling;
    next_stride = 1;
    next_addr = 0;
}.
```

Initially the RAM 300 is empty, and state is filling. During filling the buffer is consuming incoming data but not producing any output. When the first block has been read in, addr has reached the value 3227, and a full strobe line (not shown) is asserted. State is then changed to running. Here data from a succeeding block is concurrently consumed while deinterleaved data is output from the RAM 300. The running state persists until a channel change occurs, at which point the RAM 300 is allowed to read out until the end of the current interleaved block. State is changed to emptying and data is output until the end of the interleaved block. No further data is consumed during the emptying state.

Figure 20:
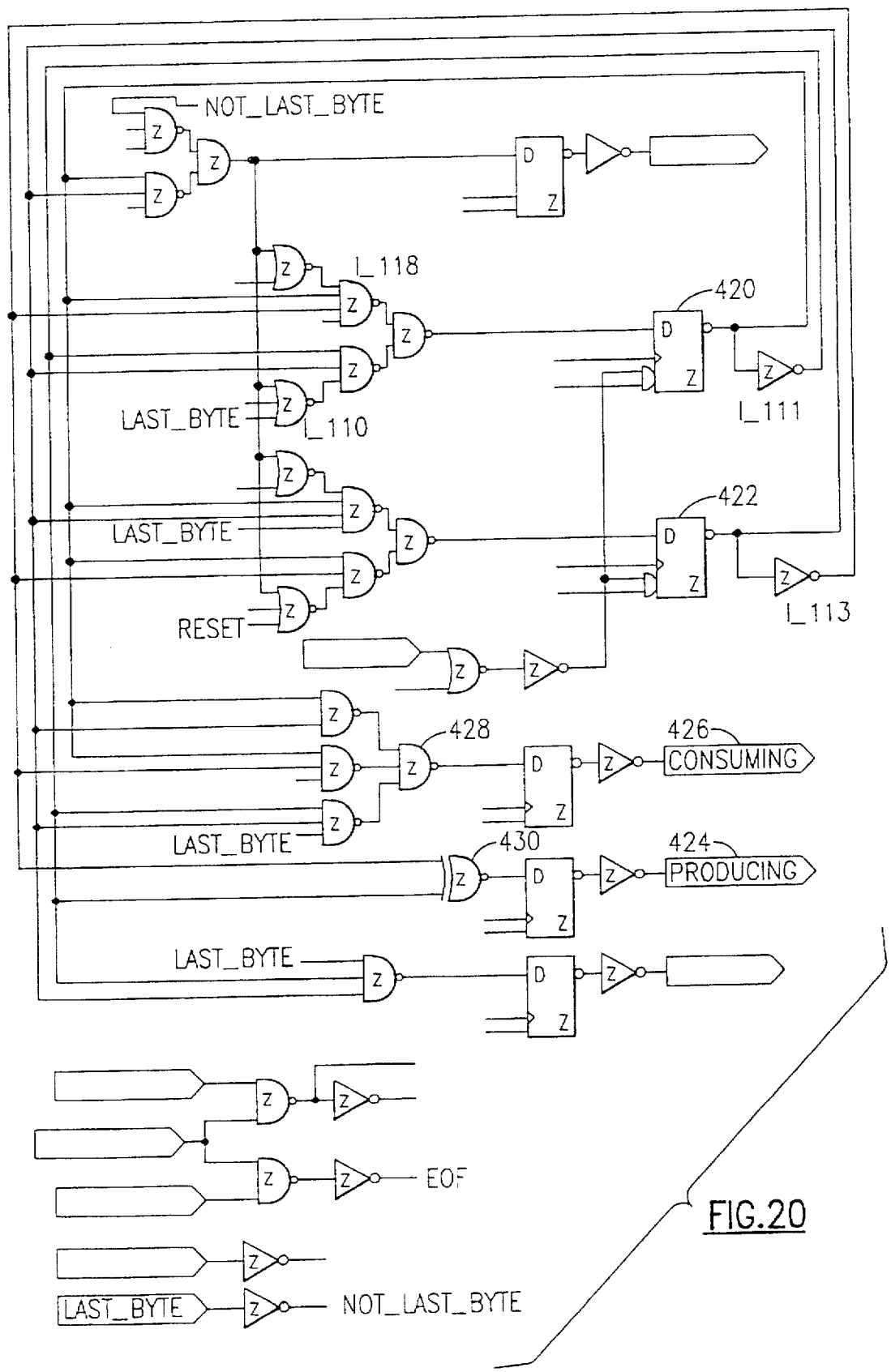
FIG. 20 is a schematic of a circuit for controlling the mode of operation of the RAM illustrated in FIG. 16.
Figure 21:
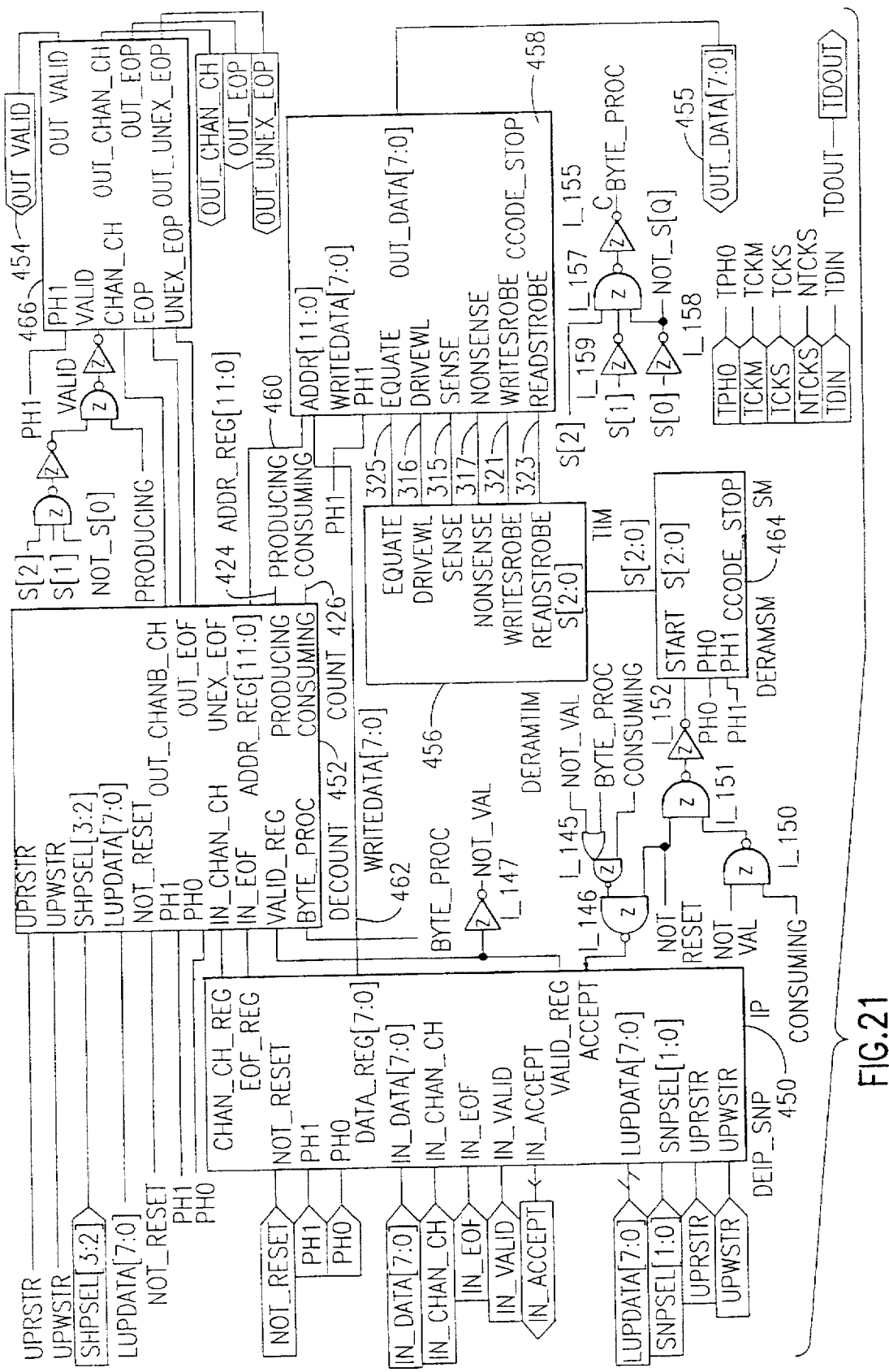
FIG. 21 is a schematic in block form for the deinterleaver used in the process shown in FIG. 4.

Operation of the state logic can also be appreciated with reference to FIG. 20, which illustrates a logical network that is incorporated in block 456 (FIG. 21). The current state is stored in latches 420, 422, encoded as shown in table 6.

TABLE 6

| | |
|---|---|
| 00 | filling |
| 01 | running |
| 10 | emptying |
| 11 | reserved |

The signals CONSUMING 426 and PRODUCING 424 are generated by decoding these states in logical networks 428, 430 (FIG. 20).

Referring now to FIG. 21, the complete deinterleave block 69 (FIG. 4) is shown. A latch module 450 latches the incoming interleaved data. Block 452 is the address generating block, and also generates control signals CONSUMING 426 and PRODUCING 424, as discussed previously. The signal PRODUCING 424 is used to generate the output valid signal OUT_VALID 454. The signal CONSUMING 426 is used to enable the input latch module 450. The address bus ADDR REG 460, the write data bus 462, and control strobes EQUATE 325, DRIVEWL 316, SENSE 315, NONSENSE 317, WRITESTROBE 321, and READSTROBE 323 generated by block 456 control the memory core block 458 containing RAM 300, which was described earlier. Block 464 is the simple 8 cycle counter which is decoded in block 456 to generate the 6 strobes required to control the memory core block 458. Block 466 is an output data latch.

Referring once again to FIGS. 17 and 21, the strobes READSTROBE 323, and WRITESTROBE 321 are asserted while the strobe DRIVEWL 316 and the address held in the address bus ADDR REG 460 is asserted, resulting in the sequential production of deinterleaved data OUT_DATA 455 and consumption of interleaved data 462 from and to the same address in the RAM 300 of the memory core block 458.

Automatic Gain Control

The automatic gain control circuit 66 (FIG. 4) is part of a loop which contains a variable gain amplifier in the radio frequency section of the demodulator. An output (the AGC pin) is provided to feed back the error. The automatic gain control circuit 66 works by causing the gain of the signal to be adjusted until the mean absolute value of the incoming data converges on the set level. The operation of the automatic gain control circuit is explained in more detail with reference to FIGS. 26 and 27.

As explained below with reference to operation of the receiver 50, the automatic gain control circuit 66 operates in an averaging mode in which the outputs are based on a prior knowledge of the mean values of the entire input waveform, and in a training mode in which they are not. Operation is essentially the same in averaging mode or training mode, except that different constants agc_av_gain 604 and agc_train_gain 606 are used respectively, as selected by the mode signal 602 in multiplexer 608. The abs block 610 takes the absolute value of the incoming data 614. The value in the integrator register INTEG_D 672 (FIG. 27), preferably a 16 bit register, is updated as follows:

$$agc\_value = agc\_value + (((abs\ (data) - bias) >> gain) + 1) >> 1$$

where bias is either agc_av_bias 618 or agc_train_bias 620, as selected by the mode signal 602 in multiplexer 616, and gain is either agc_av_gain 604 or agc_train_gain 606, depending on the mode.

The top 11 bits of the agc_value register are used in the sigma-delta circuit 624, and the lock detect circuit 626. The single bit sigma-delta modulated automatic gain control output 628 is preferably filtered externally using an appropriate analog filter (not shown). The automatic gain control output 628 may be inverted by setting the agc_invert bit (see Signals and Registers section below). During averaging mode all incoming data is used in the automatic gain control circuit 66. During training mode the automatic gain control circuit 66 is only enabled while processing the frame header; however the automatic gain control output 628 always remains active.

On channel change the lock signal 631 is set to false. The operation of the lock detect circuit is as described by the following code fragment:

```
if (clock_count == 0)
{
    count = 0;
    latched_val = 0;
    lock = False;
}
if ((clock_count%4096) == 0)
    count++;
agc_val = agc_value>>5;
if ((abs(latched_val - agc_val) > (agc_lock_value<<2))
{
    latched_val = agc_val;
    count = 0;
}
if (count > agc_lock_time)
    lock = True;.
```

Here clock_count is a count of T/2 clock periods and agc_lock_value and agc_lock_time refer to the register values.

Figure 27:
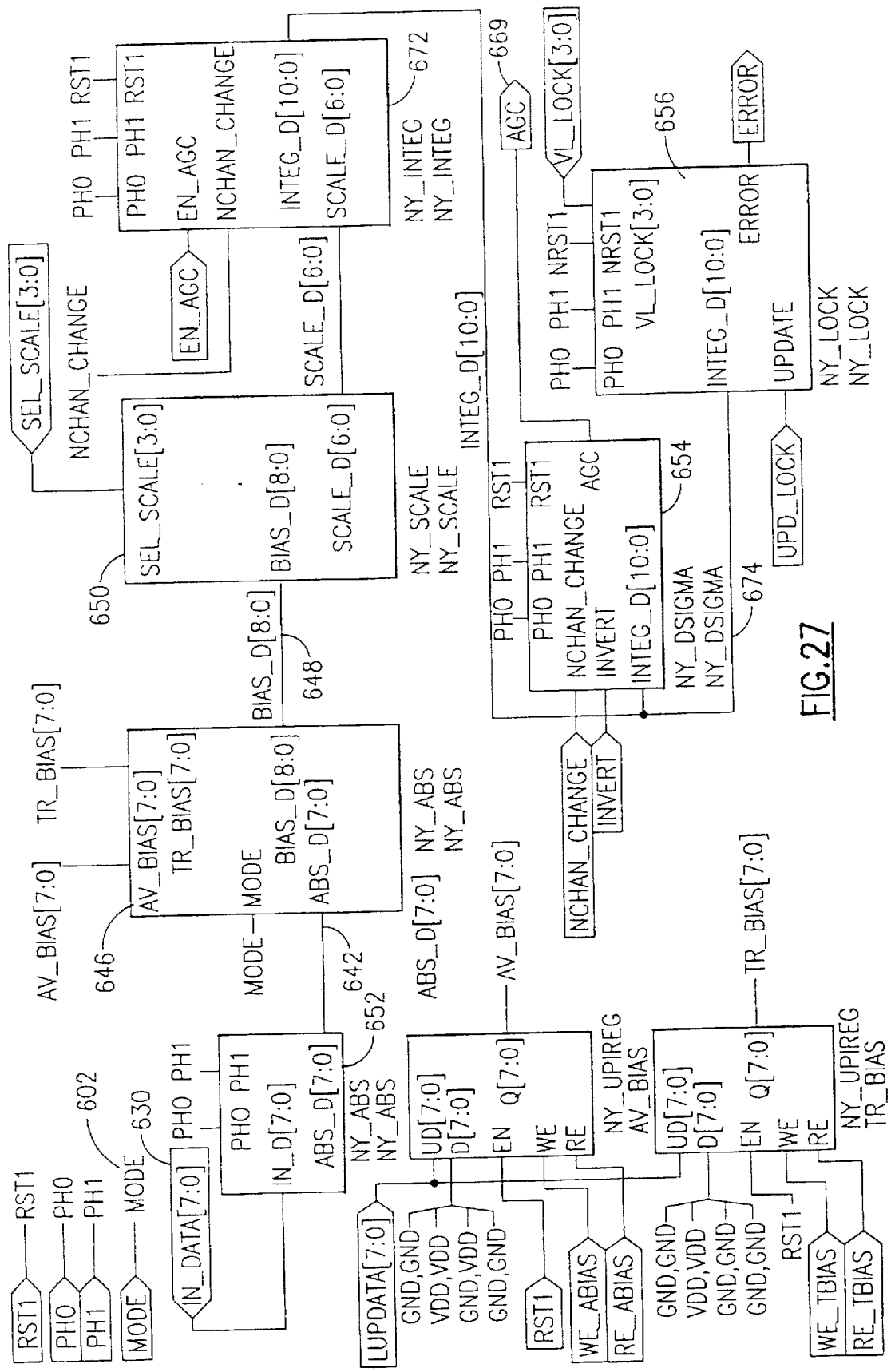
FIG. 27 is an electrical schematic of the circuit shown in FIG. 26.

Referring now to FIGS. 27 and 28, operation of the block 610, and its equivalent representation, block 652 (FIG. 27) is now explained. Input data is clocked into register 630 at 15 MHz, and is held in latch 632. Line 634 is driven according to the sign bit of the input data in latch 632 and is used as a selector for multiplexer 636. If the sign bit is positive, then line 638 is selected, resulting in an output 642 that is identical to the contents of the input register 630. But if the sign bit is negative, the magnitude is converted and appropriately rounded up in block 644, and then passed through the multiplexer 636.

Figure 29:
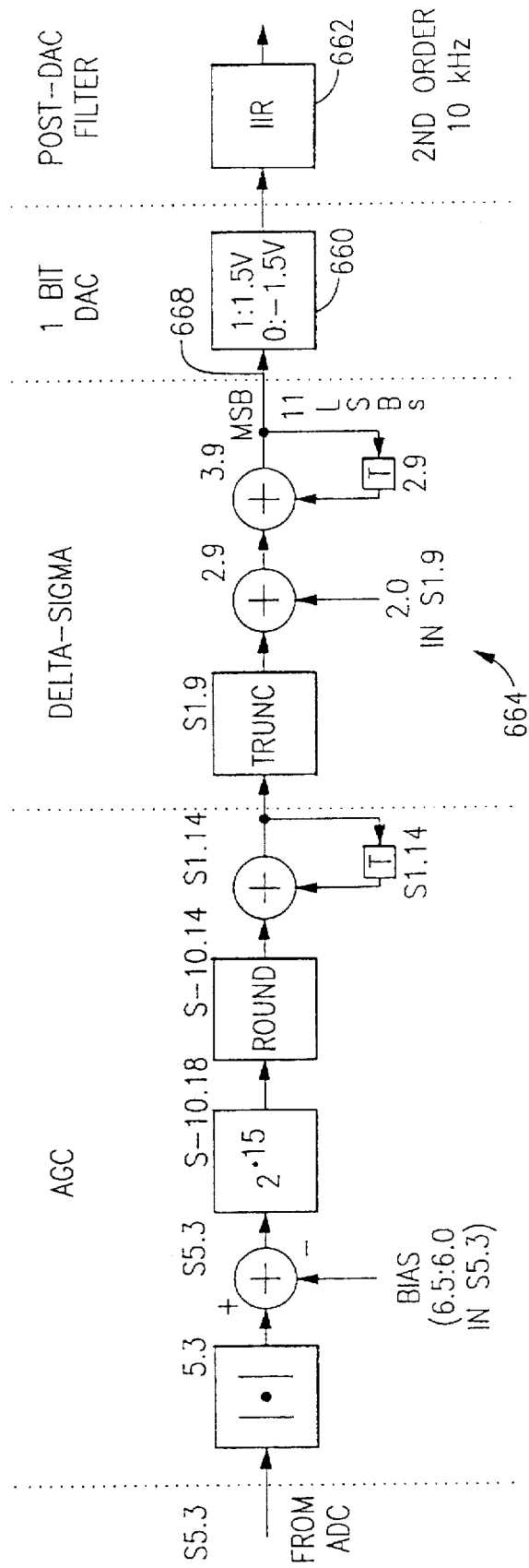
FIG. 29 is a detailed block diagram of the automatic gain control circuit depicted in FIG. 26.

A bias value is subtracted from output 642 in block 646, according to the mode signal 602. This value comprises an average or training bias value. Scaling of the output of the bias adjusted data 648 occurs in scale block 650. The scaled data then enters an integrator 672 where it is initially rounded, and the resulting fractional data added to yield an automatic gain control level which is optionally inverted in block 654. Referring to FIG. 29, the integrated data is also fed to the sigma-delta block 656, corresponding to zone 664 in FIG. 29, where it is truncated, and a one bit error signal 668 is developed, representing the MSB of the modulated sigma-delta output. The error signal is then passed to a 1 bit digital-to-analog converter 660, and pulse shaping of the output of the digital-to-analog converter 660 is accomplished in an infinite impulse response filter 662. The error signal is fed back to adjust the gain of amplifier 52 (FIG. 4).

Figure 30:
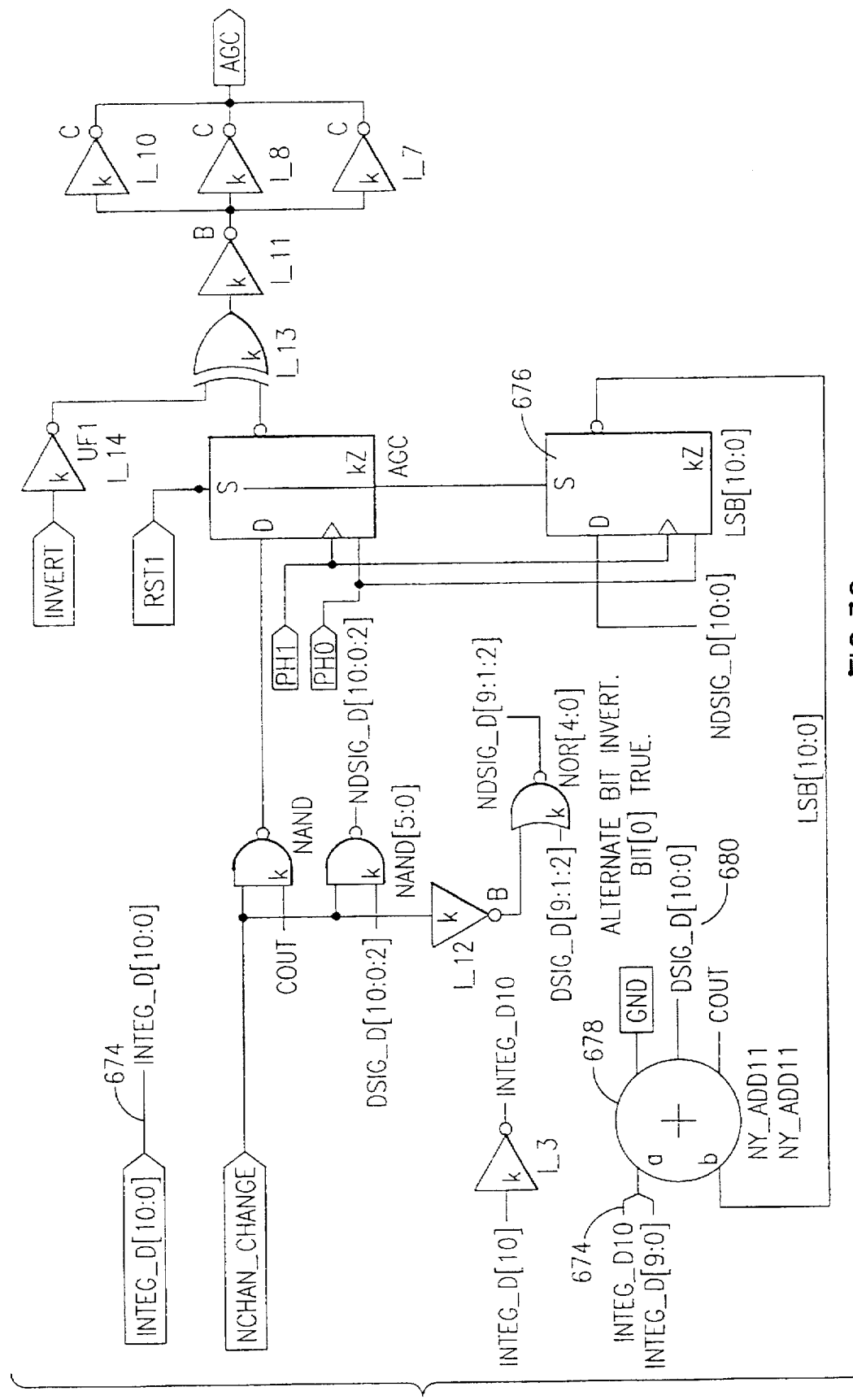
FIG. 30 is an electrical schematic of the sigma-delta block of the automatic gain control circuit of FIG. 26.

The sigma-delta block 656 is shown in greater detail in FIG. 30, wherein the LSB of the integrator output 674 is held in latch 676, where it is added to the truncated integrator output in adder 678 to yield a 10 bit result 680.

Figure 31:
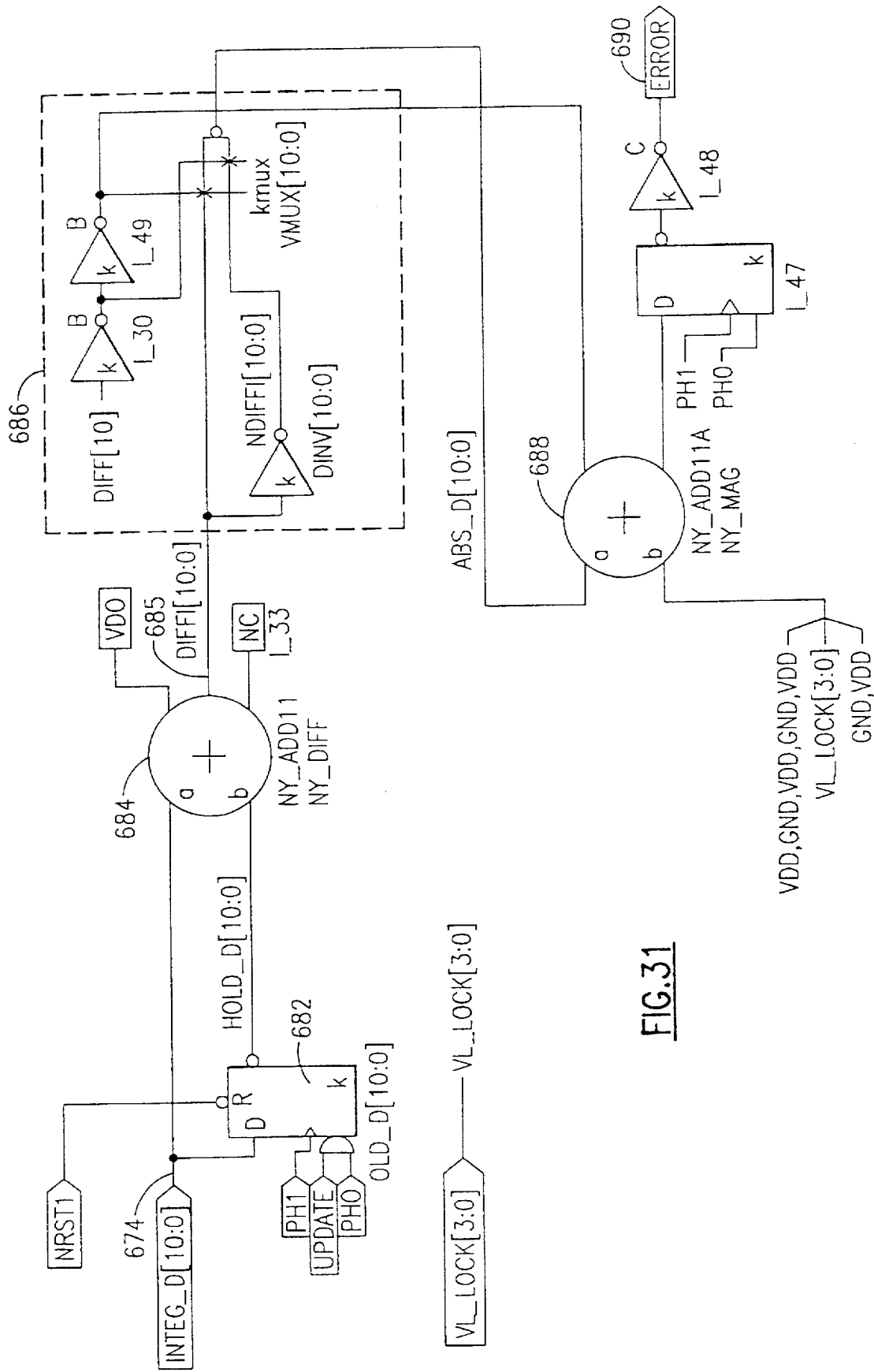
FIG. 31 is an electrical schematic of the lock detector block of the automatic gain control circuit of FIG. 26.

An additional function of the automatic gain control circuit 66 (FIG. 4) is to provide a signal indicating that a lock on the channel signal has effectively been achieved. This is accomplished by the lock detector circuit 626 (FIG. 26), which is shown in greater detail in FIG. 31. A previous version of the integrated data output 674 is held in a latch 682, and is subtracted from the current integrated data output 674 in a subtracter 684. The absolute value of the difference 685 is determined in block 686, similar to the determination described above with reference to block 610 (FIG. 26). This result is subtracted from a constant in subtracter 688, and an error signal 690 produced. When convergence is determined to have occurred as described above, lock has been achieved.

Matched/Nyquist Filter

Referring once again to FIG. 4, a matched filter 63 is placed in the path of the received signal after the analog-to-digital converter 60. The filter 63 is known as a matched filter because its response matches the response of a similar filter in the transmitter and therefore maximizes the signal-to-noise (SNR) ratio for the bandwidth available. The filter 63 is also known as a Nyquist filter because its combined response and the response of the transmit filter 18 obey the Nyquist criterion, i.e. Tie Fourier transform of the combined response satisfies the relation:

$$\frac{1}{T} \sum_{-\infty}^{+\infty} P\left(j\omega - jm\frac{2\pi}{T}\right) = 1$$

Obeying the Nyquist criterion is necessary if the filter is to provide zero intersymbol interference. By having a response which is matched and satisfies the Nyquist criterion, the matched filter provides a signal response which has high SNR.

Figure 42:
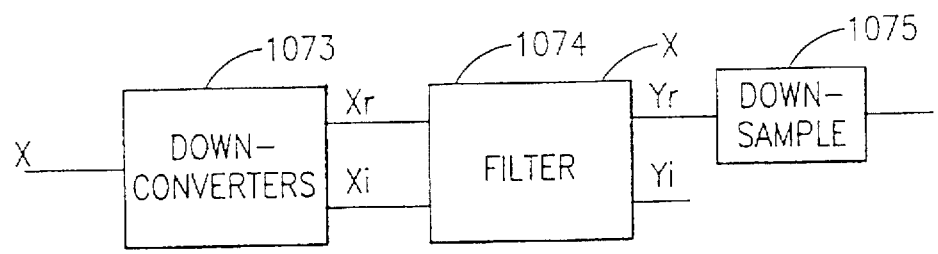
FIG. 42 is a diagram of a digital filter that is helpful in understanding the operation of the invention.

Referring now to FIGS. 4 and 42, the matched filter of the present invention performs several functions. First, in block 1073, it shapes the received pulses so as to minimize intersymbol interference. This is accomplished while the matched filter 63 preserves the SNR at least as high as received. Second, the matched filter 63 down converts the signal received from the analog-to-digital converter 60 from an intermediate frequency down to complex baseband, i.e. from 5.625 MHZ to 0 Hz. Third, in block 1075 the matched filter 63 reduces the number of samples to be passed for further processing in that it receives the input signal from the analog-to-digital converter at the sampling rate higher than minimum Nyquist sampling rates, and selectively eliminates a portion of the samples to provide a signal containing exactly one sample for every symbol.

Nyquist Pulse-shaping

As stated earlier, the preferred transmitting system includes a filter 63 which shapes the received signal pulses so that their amplitude versus time characteristic is optimum for the channel over which the pulses travel. The shape which has been found to be optimum for transmission is that of a raised cosine pulse. The application of such pulse-shaping enables each cycle of the periodic waveform to carry two pulses. To preserve maximum SNR over the bandwidth available without increasing the sampling rate, a filter having identical characteristics, i.e. a "matched filter" must be provided in the receiving system. However, since both the transmitter and receiver have such matched filters, the combination of the shaping performed by the filters of both the transmitter and the receiver must be equal to a raised cosine pulse. Thus, the transmitter and the receiver each contain a 'matched' Nyquist filter which has a square root raised cosine pulse response. An example of a square root raised cosine pulse filter is provided by the time response function of the following equation:

$$h(t) = f(t) = \frac{4\alpha}{\pi\sqrt{T}} \cdot \frac{\cos((1+\alpha)\pi t/T) + T\sin((1-\alpha)\pi t/T)/(4\alpha t)}{1 - (4\alpha t/T)^2}$$

Down conversion

The matched filter 63 also performs a conversion down in frequency from the intermediate frequency used by the analog-to-digital converter and preceding processing blocks to the baseband frequency. Down conversion is accomplished through a superheterodyne method of multiplying the intermediate frequency pulse train by a pulse train which conforms to a complex periodic function at the same (carrier) frequency, 5.625 MHZ. That is, the intermediate frequency pulse train is multiplied by a pulse train which conforms to:

$$\exp(-2\pi \times 5.625 \times 10^6 \times t)$$

and then only the real-valued portion of the resulting signal is propagated for further processing. In the system of the present invention, the pulse-shaping and down conversion operations of the matched filter are performed simultaneously by the same hardware.

Reduction in sample propagation rate

A pulse train representative of the received data arrives at the input to the matched filter from the analog-to-digital converter 60 (FIG. 4) at the rate of 15 megasamples per second. However the data is transmitted at a rate of only 7.5 megasymbols per second. Since two pulses can be transmitted within each cycle of the $f_0=3.75$ MHZ periodic signal bandwidth and only one pulse is required to transmit a symbol, the minimum Nyquist sampling frequency is still $2f_0=7.5$ megasamples per second. Therefore, after down-conversion to baseband, the pulse train signal received from the analog-to-digital converter 60 contains a portion of samples which are not necessary for recovery of the original symbols. These unnecessary samples are known as intersymbol samples because they tend to occur at the time boundary between symbols, and therefore do not contain useful information about the symbol which was transmitted. Only a portion of the samples entering the matched filter are propagated on to further stages, and these are the ones which are required for symbol recovery. The intersymbol samples are not passed on further in the system; they are discarded.

Implementation

Figure 50:
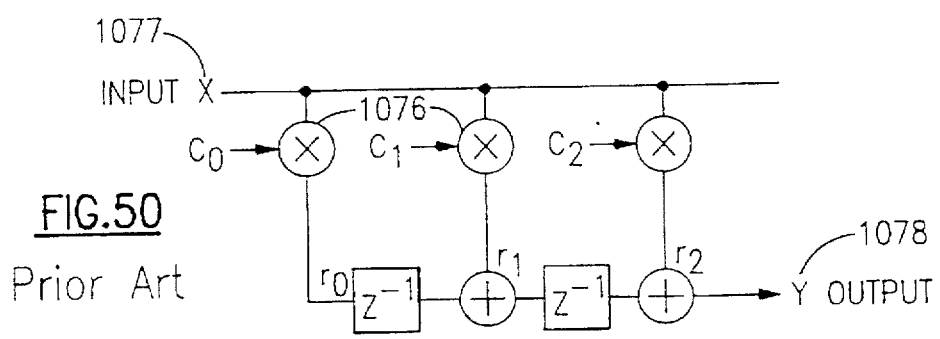
FIG. 50 is a representative prior art discrete time filter.

FIG. 50 shows a representative prior art discrete time signal filter. The filter accepts as input 1077 $x_0, x_1, \ldots x_n$ discrete time signal pulses forming a signal pulse train x(T) and produces output 1078 y(T). The filter has taps 1076. As evident from FIG. 50, the filter performs the following operation to produce each output sample, y(N):

$$y = \sum_{n=0}^{N} x_n c_n$$

where $x_n$ are successive samples and $c_n$ are the coefficients. x, c, and y are all complex. Thus at each tap 1076

$$r_n = (x_{nr} + j x_{ni})(c_{nr} + j c_{ni})$$

where $x_r$ represents the real part of the complex-valued input signal sample x and $x_i$ represents the imaginary part. When the multiplication is completed the result is $$x_r c_r - x_i c_i + j(x_r c_i + x_i c_r).$$

However, further operations with the imaginary part of the result are not necessary, and the imaginary part can be discarded. In fact, the imaginary part of the results need not even be calculated. Therefore, in the system of FIG. 50, for an input stream such as:

$x_0, x_1, x_2, \ldots$ the following output stream would be generated:

$t_0 \ c_2 x_0$ $t_1 \ c_2 x_1 + c_1 x_0$ $t_2 \ c_2 x_2 + c_1 x_1 + c_0 x_0$ $\ldots$ $t_n \ c_2 x_n + c_1 x_{n-1} + c_0 x_{n-2},$ where the product $c_n x_n$ is equal to $c_{nr} x_{nr} + c_{ni} x_{ni}$.

Figure 43:
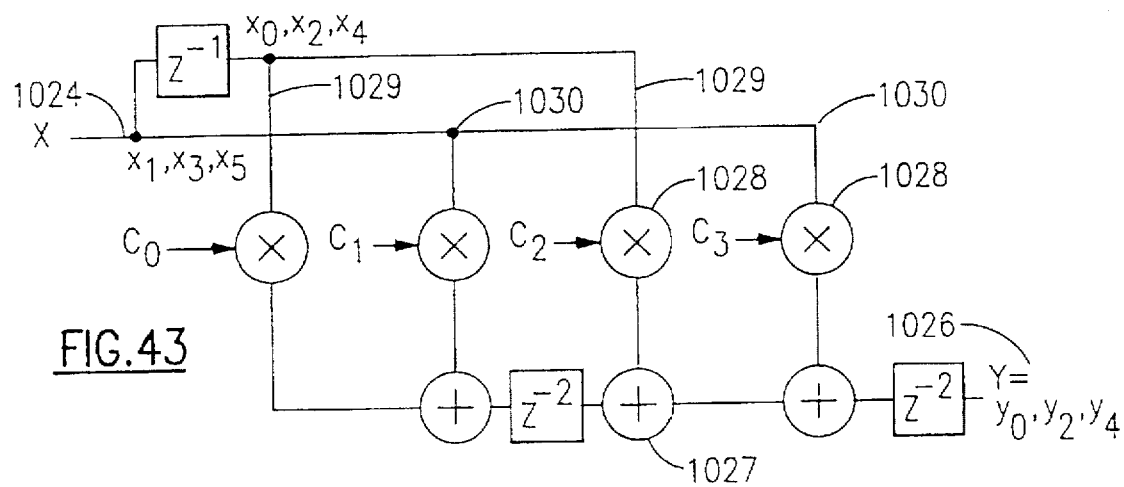
FIG. 43 is a diagram of a digital filter illustrating an optimization process.

In the present invention, the matched filter has been optimized in several important ways. The first reduction occurs in incorporating the down sampler 1075 (FIG. 42) into the filter, reducing the number of output samples by half. Since there is now twice as much time to produce each output, a smaller implementation can be used. The hardware reduction is accomplished by applying the odd-ordered samples of the input signal to one set of multipliers and delay units, doing the same with the even-ordered samples, and then adding the two streams of processed samples back together. FIG. 43 shows an example of such a reduced hardware filter. The filter of FIG. 43 has input x 1024, output y 1026, 1-interval delay unit $z^{-1}$, 2-interval delay units $z^{-2}$, adders 1027 and multipliers 1028. As is apparent from the figure, odd samples $x_1$, $x_3$ and $x_5$ are conducted to one set of multipliers having coefficients $c_1$ and $c_3$ while the even samples are conducted to other multipliers having coefficients $c_0$ and $c_2$. From a review of FIG. 43 it is apparent that the output y 1026 will be as follows:

$t_3 \ x_1 c_3 + x_0 c_2$ $t_4 \ \text{———}$ $t_5 \ x_3 c_3 + x_2 c_2 + x_0 c_0 + x_3 c_1$ $t_6 \ \text{———}$ $\ldots$ Thus, the resultant output signal is composed of a pulse train at intervals of only half the frequency of the original samples. In so doing, the timing recovery and carrier portions of the receiver system of the present invention are so adjusted to operate in conjunction with the matched filter to cause only the intersymbol samples to be discarded.

A second hardware reduction is achieved as follows. As discussed above, the matched filter 1074 (FIG. 42) of the present invention is also combined with a superheterodyne down converter 1073. Down conversion is accomplished by multiplying the train of sample pulses by coefficients which correspond to a complex-valued periodic pulse train at the 5.625 MHz carrier frequency. The complex periodic signal used in the process can be expressed as the sum of real and imaginary coefficients of cosine and sine functions, i.e.:

$$\cos(-2\pi \times 5.625 \times 10^6 x t) + j \sin(-2\pi \times 5.625 \times 10^6 x t)$$

When combined with the 15 megasamples per second pulse train input signal, the time response of the above functions reduces to coefficients to be multiplied with the signal pulses at discrete time intervals ($-0.75 \, n\pi$) with respect to the input signal, as follows:

| n | cos(−0.75nπ) | sin(−0.75nπ) |
|---|---|---|
| 0 | 1 | 0 |
| 1 | −1/√2 | −1/√2 |
| 2 | 0 | 1 |
| 3 | 1/√2 | −1/√2 |
| 4 | −1 | 0 |
| 5 | 1/√2 | 1/√2 |
| 6 | 0 | −1 |
| 7 | −1/√2 | 1/√2 |

Since in the matched filter of the present invention odd input samples are applied only to odd taps of the filter, and even input samples are applied only to even taps, a reduction in multiplier hardware can be readily achieved since even samples are always multiplied by ±1 or 0 and odd samples are always multiplied by ±1/√2. Since the even samples are always multiplied by ±1 or 0, so long as sign bits are managed separately, the even coefficients required for down conversion can be combined with the coefficients of the Nyquist pulse-shaping filter simply by passing or not passing the samples occurring at those intervals. Similarly, the odd coefficients required for down conversion can be combined with the coefficients of the Nyquist pulse-shaping filter simply by scaling those coefficients by 1/√2.

A third way in which the hardware usage is reduced in the present invention is by reusing the same multiplication and addition hardware to reflect the symmetrical nature of the square root raised cosine filter response. The filter coefficients are real and imaginary, which can be represented as even functions and odd functions respectively. Thus, for real coefficients, $c_r[n] = c_r[-n]$ and for imaginary coefficients $c_i[n] = -c_i[-n]$. Since the resultant output at each tap 1029, 1030 is $$r[n] = x[k]c_r[n] - x[k]c_i[n]$$

it follows that $$r[-n] = x[k]c_r[n] + x[k]c_i[n].$$

Thus, the multiplication operation x[k]c[n] need only be performed once for symmetrically situated coefficients, and the real and imaginary results either added or subtracted. Thus, the matched filter can be simplified to the structure 1031 shown in FIG. 44.

Finally, another way in which hardware is conserved is by rearranging the arithmetic performed by the filter to use logic elements which are less costly in terms of area used on a semiconductor device on which the present receiving system can be implemented. The equations for each tap can be re-written as:

$$r[n] = x[k](C_r[n] - C_i[n])$$

$$r[-n] = x[k](C_r[n] + C_i[n])$$

For even taps, it will be noted that for every tap, either $C_r[n]$ or $C_i[n]$ is zero. Therefore, if signs are considered separately, $x[k]C_r[n]$ and $x[k]C_i[n]$ can be calculated and multiplexed according to sign to form the difference and sum terms as required.

For odd taps, $(C_i[n] - C_r[n])$ and $(C_r[n] + C_i[n])$ are used as the coefficients of the multipliers and the results multiplexed to form the sum and difference terms.

Figure 45:
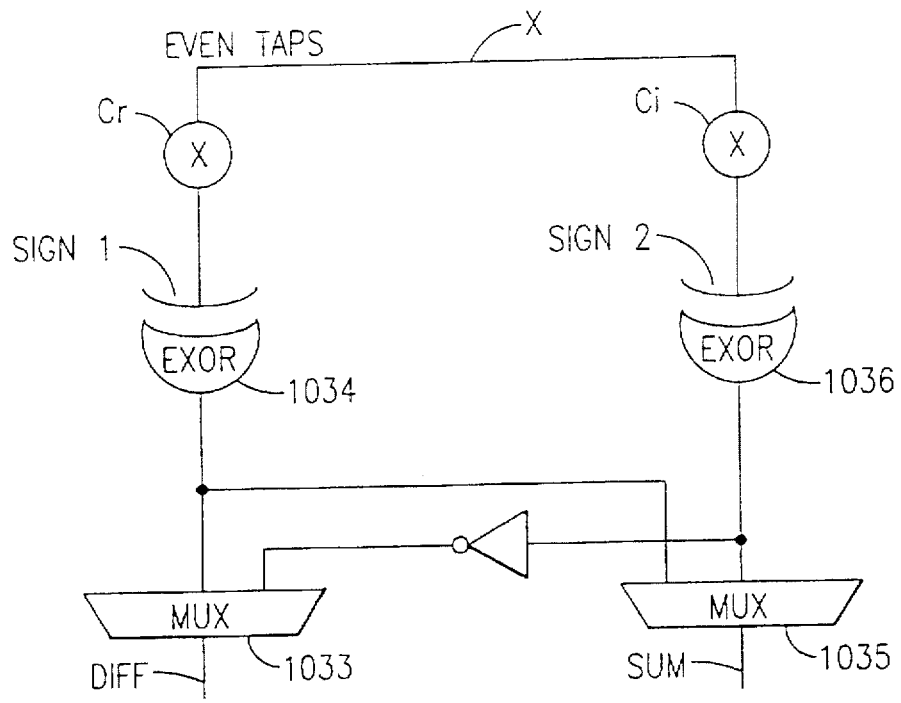
FIG. 45 is a schematic of a portion of the even-numbered taps in the filter shown in FIG. 44.
Figure 46:
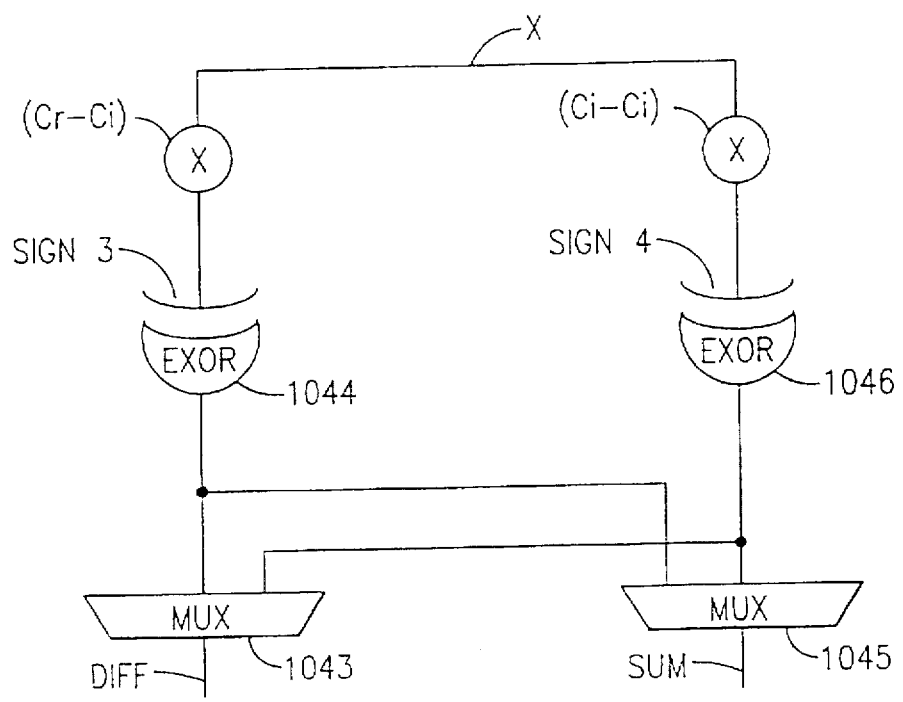
FIG. 46 is a schematic of a portion of the odd-numbered taps in the filter shown in FIG. 44.

The resulting tap structures are shown in FIGS. 45–46, where the sign inputs to the exclusive-or gates 1034, 1036, 1044,1046, and the select lines of the multiplexers, 1033, 1035,1043,1045 are controlled according to a combination of the signs of the data, the real and imaginary coefficients, and the current position of the down-conversion sequence.

The replacement of adders with exclusive-or gates and multiplexers conserves area as these components are smaller than adders. Moreover, no carry chain is present, a factor which significantly reduces the overall delay.

Since the coefficients of each multiplier are always the same, constant coefficient multipliers can be used. These provide a major area saving, especially since $C_i[n]$ and $C_r[n]$ are small for high absolute values of n.

DC Remover

Figure 47:
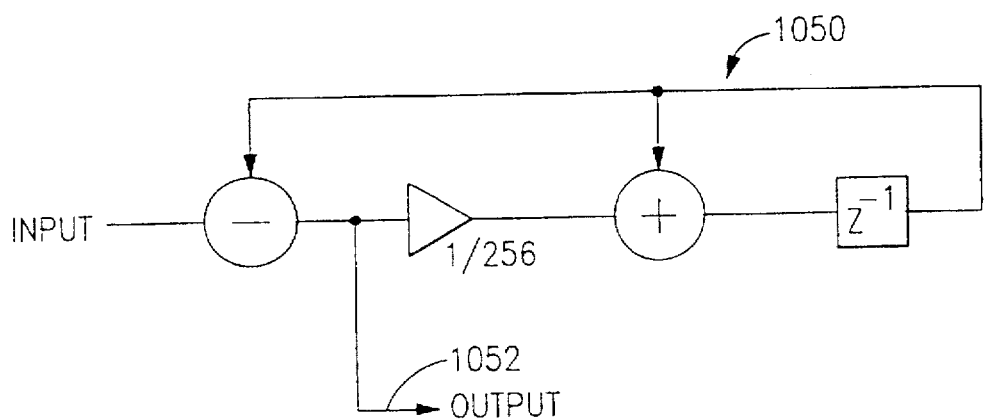
FIG. 47 is a DC removal circuit according to the present invention.
Figure 44:
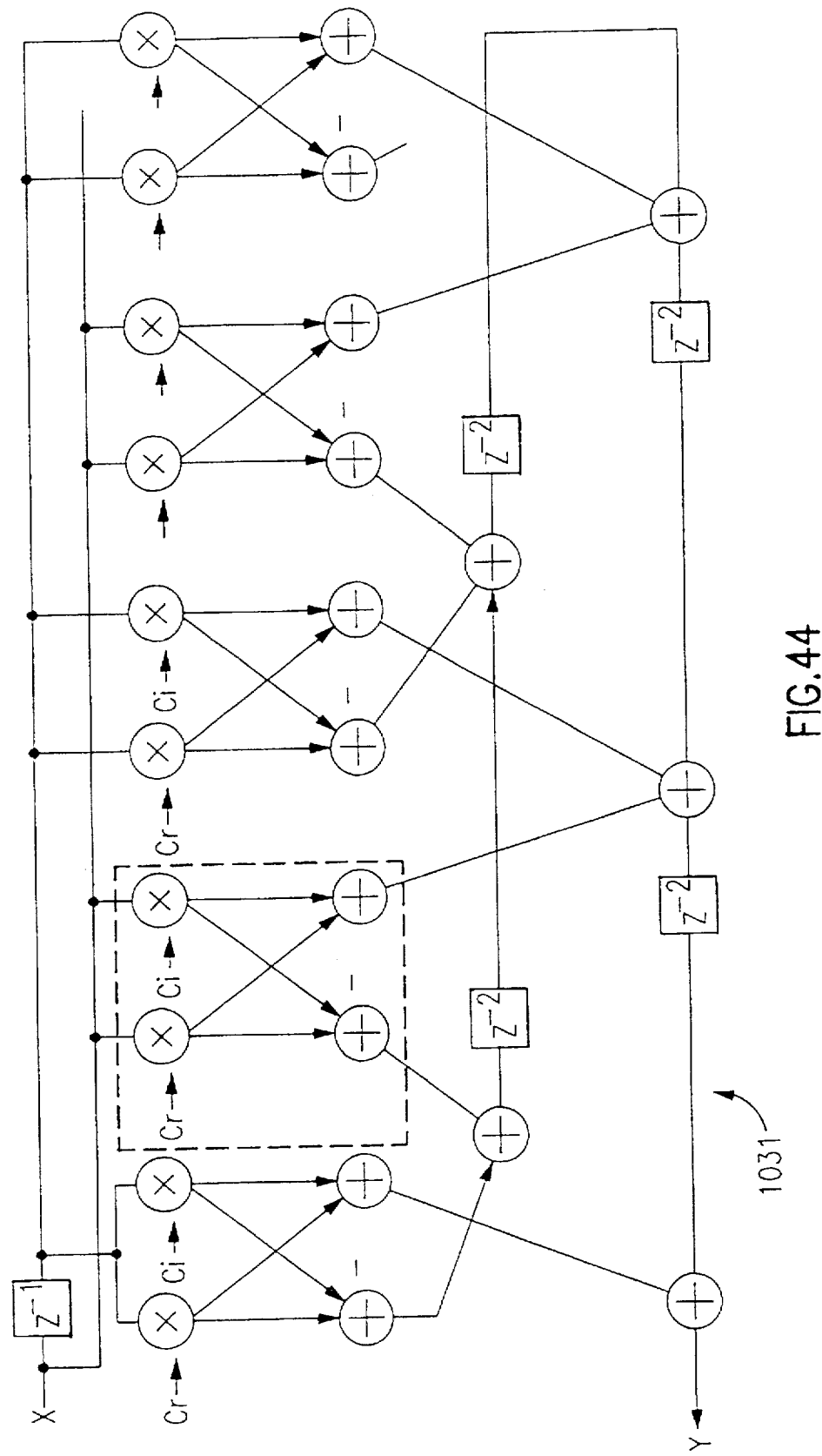
FIG. 44 is a diagram of a matched filter according to the invention.

The signal received by the matched filter from the analog-to-digital converter contains a component which does not vary or varies relatively slowly with time. This is called a DC component. This results from the pilot carrier which has been down-converted to DC. The DC component must be removed from the signal prior to data detection because signal amplitude levels will otherwise be skewed by the amplitude of the DC component. The way in which the DC component is removed in the receiver system, according to the present invention, is by a DC remover 1050, shown in FIG. 47. As can be seen from FIG. 47, the DC remover 1050 operates similarly to a discrete time function integrator in that a portion (1/256) of the signal from the previous interval is used to form the signal output 1052 in the present interval. Thus, the DC remover circuit of FIG. 47 will operate to provide the result:

$$Y_n = X_n - (1/256)z^{-1}x_{n-1} + (1/256)(1/256)z^{-1}z^{-1}x_{n-2} + \ldots$$

Over time, with the feedback loop thus established, an equilibrium will be established in which the DC component of the signal will be subtracted out.

Adaptive Equalizer

The adaptive equalizer 70 (FIG. 4) disclosed hereinbelow essentially comprises a 28 tap finite impulse response (FIR) filter adapted according to the sign least-mean-square (LMS) algorithm. The phase tracker associated with the adaptive equalizer 70 employs a single tap full LMS adapted "phase estimate" to estimate and correct phase errors introduced by local oscillator jitter and carrier noise.

The LMS algorithm and its sign variant is well known, and will not be further explained herein. It is discussed, for example, in *Digital Communication*, Second Edition, by Edward A. Lee and David G. Messerschmitt, Kluwer Academic Publishers, Chap. 11.

Figure 34:
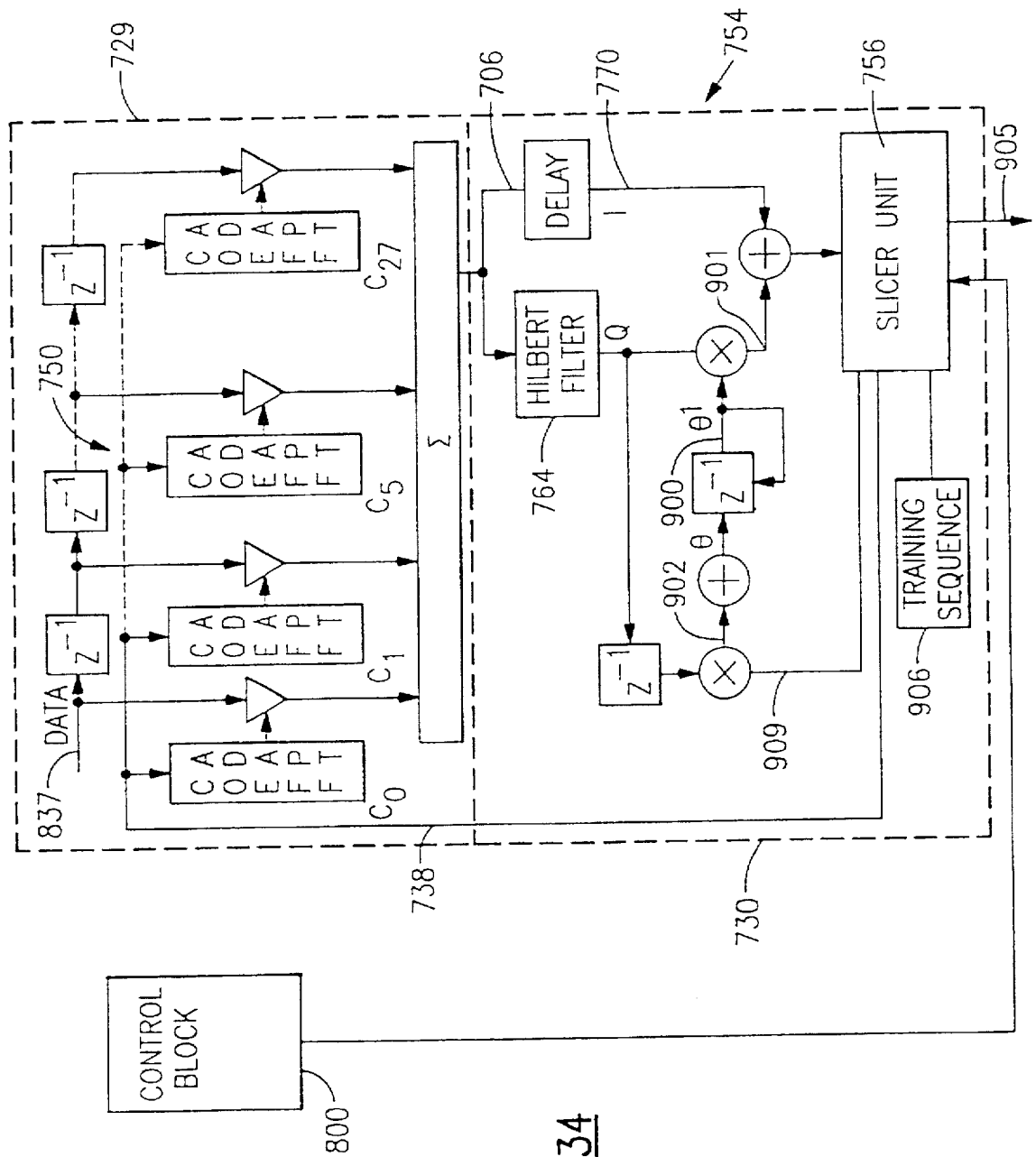
FIG. 34 is a block diagram of the adaptive equalizer of the receiver shown in FIG. 4.

The equalizer and phase tracker 754 is implemented as 3 main blocks as shown in FIG. 34: a finite impulse response filter adaptive equalizer block 729; a derotator and phase tracking block 730; and a general control block 800.

The symbol period T of the data entering the adaptive equalizer 70 is 133.3 ns, corresponding to 7.5 Mbaud. The symbols are input in the format s5.2. Coefficients are stored as 16 bit s1.15 integers.

Figure 32:
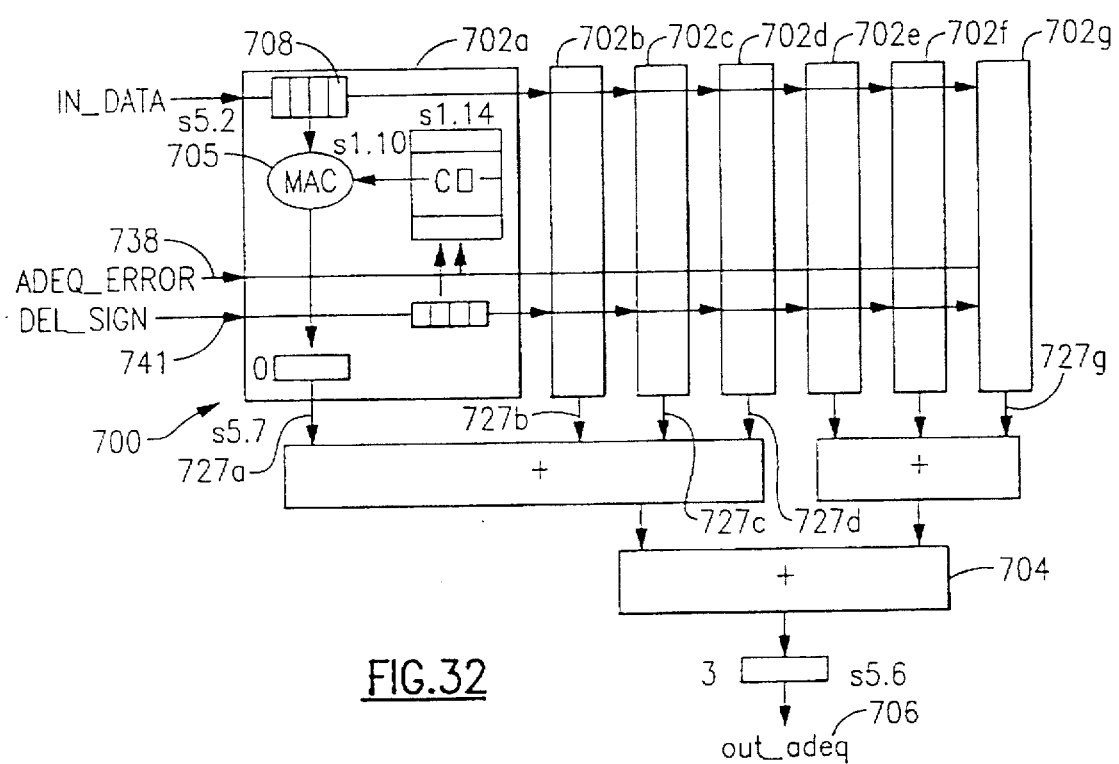
FIG. 32 is a block diagram of a core of the adaptive equalizer of the receiver shown in FIG. 4.
Figure 33:
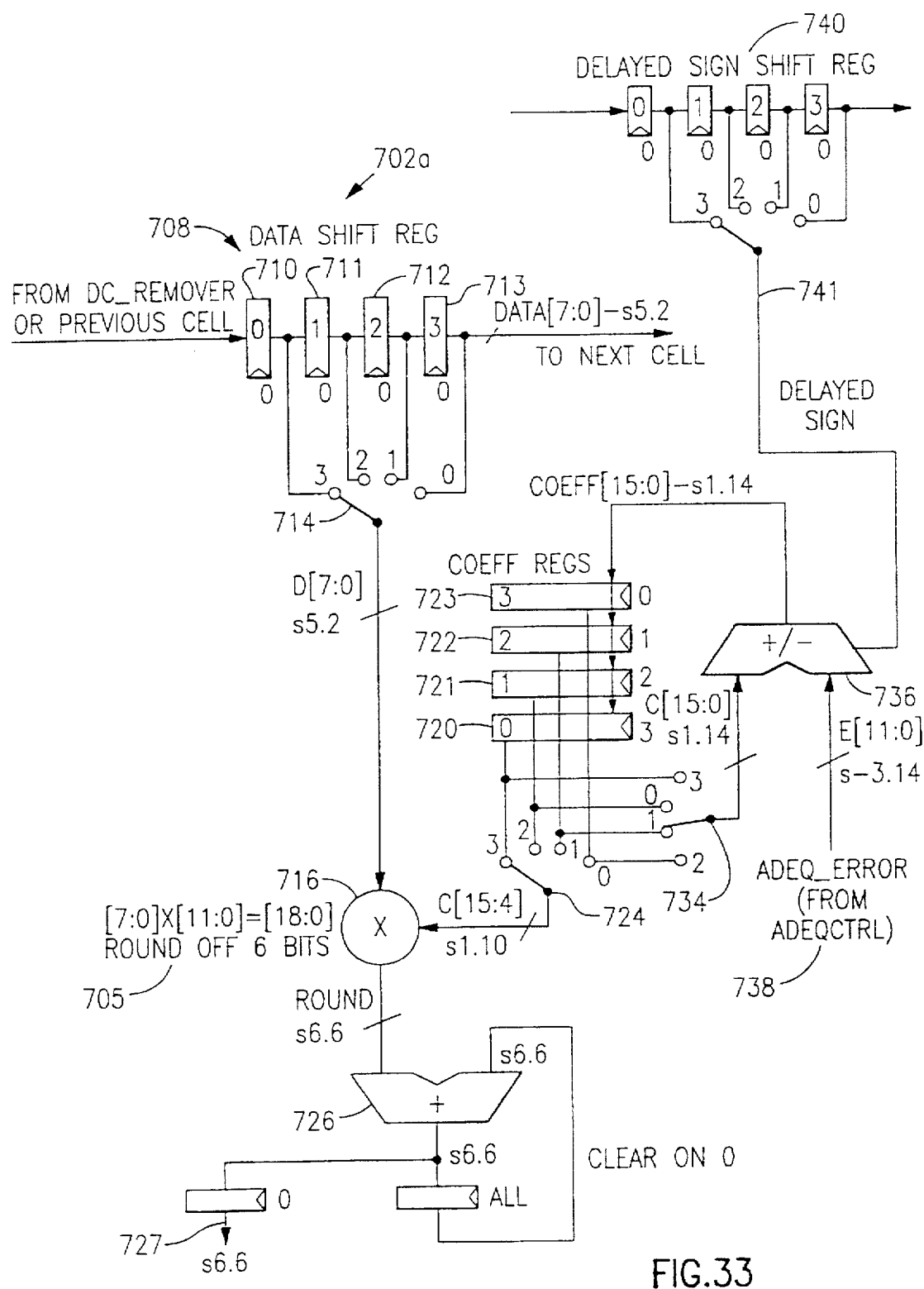
FIG. 33 is a schematic of a portion of the adaptive equalizer finite impulse response filter core illustrated in FIG. 32.

Referring to FIG. 32, a finite impulse response filter core 700 has seven cells 702a–702g, of which cell 702a is illustrated in greater detail and particularly discussed, it being understood that the structure of cells 702b–702g is identical. Each cell corresponds to 4 taps of the finite impulse response filter. The outputs of the cells 702a–702g are summed with a tree of adders 704 to produce the final result out_adeq 706. This is a 12 bit signal, format S5.6. The adaptive equalizer 70 and the cells 702a–702g are clocked at T/4, whereas data arrives at periods T. Referring now to FIG. 33, which shows the cell 702a in greater detail, it will be noted that the cells 702a–702g exploit this fact by sharing a multiplier and accumulation stage for each 4 tap data values and 4 coefficients.

The multiplier-accumulator unit 705 of the cell 702a will now be described in further detail, again with reference to FIG. 33. The data shift register 708 comprises registers 710, 711, 712, and 713, and is also clocked at T. The outputs from the shift registers 710–713 therefore only change every 133 ns. The cell could be implemented by associating a multiplier with each of the registers 710–713, for a total of 4 multipliers. However because the multiplier 716 operates in only 33 ns, that is T/4, the cells 702a–702g have been designed to have one multiplier 716 which is switched by switch 714 between the four data registers 710–713. Four coefficient registers 720–723 are provided to supply the multiplier 716. Of course it is also required that the coefficient registers 720–723 also be switched, as indicated by switch 724 in FIG. 33. The filter structure requires that the cell output 727 be formed according to the equation $$CC_{out} = \sum_{n=0}^{3} D_n C_n$$

where $CC_{out}$ is the cell output 727;

$D_n$ is the contents of the nth data shift register; and $C_n$ is the contents of the nth coefficient register.

The cell output 727 is accumulated using the adder 726. The individual outputs $CC_{out}$ of each of the cells 702a–702g is latched, and summed in the adder tree 704. With this approach only 7 multipliers are required in the finite impulse response filter core 700, instead of 28. As the multiplier requires the largest area of each cell, a large amount of chip area has thus been conserved.

Additional logic, generally referenced 742, is provided in the cells 702a–703g for adaptation. The LMS algorithm feeds back a final error value which is added to or subtracted from each of the coefficients according to the sign of the data that caused the error. For example if a positive data value in a particular tap of the finite impulse response filter produces a positive error on the output, it is assumed that the coefficient associated with that tap is too large. A small amount is therefore subtracted from the coefficient, and an updated value of the coefficient installed in the appropriate coefficient register.

The logic 742 which performs the adaptation is clocked 4 times each symbol period and is thus shared among the data clocked through shift register 708. A delayed version of the sign 741 is used to control an adder or subtracter 736 which increments or decrements a coefficient register value in registers 720–723 by the value of the error adeq__error 738. The delayed sign 741 is there to model the delay between the multiplication of the data in multiplier 716, and tot allow for the time required for the data to flow through the system and generate an error value. It is important that the sign used is the sign that was in the tap when the error was generated, or which caused the error to be generated. A delayed sign shift register 740 operates in parallel with the main data register 708, and is switched by switch 734, which operates similarly to switch 714. The same process is performed on all the taps.

The data flow through the system can be appreciated with reference to FIG. 34, wherein the finite impulse response filter is referenced generally at 750. The data then flows through a phase tracker 754, which requires several cycles. Finally a slicer 756 which samples the data and returns an error signal to cells 702a–702g in the finite impulse response filter 750.

The phase tracker 754 is explained with reference to FIGS. 35 and 37. The principle of the phase tracker 754 is that of derotation of the signal to align the symbol constellation in the I, Q axis. Rotation occurs because the carrier phase and the demodulator phase are not identical and there is noise associated with them. This causes the constellation to rotate slightly. This is corrected with a derotator 760, which requires both the in phase component 770 and the quadrature component 772 to be generated from the original signal in__data 706, the latter initially only having an in phase component. The Hilbert filter 764 produces 90 degrees rotation to generate a quadrature component. Rotation by an angle $\theta$ is performed using the multipliers 774, 780. By exploiting the fact that for small $\theta$, $\sin\theta \approx \theta$, and $\cos\theta \approx 1$, it is thus possible as an approximation to replace the multiplier 774 with a hardwired multiply-by-1, and replace the $\sin\theta$ input to multiplier 780 with its approximation, $\theta$.

Figure 35:
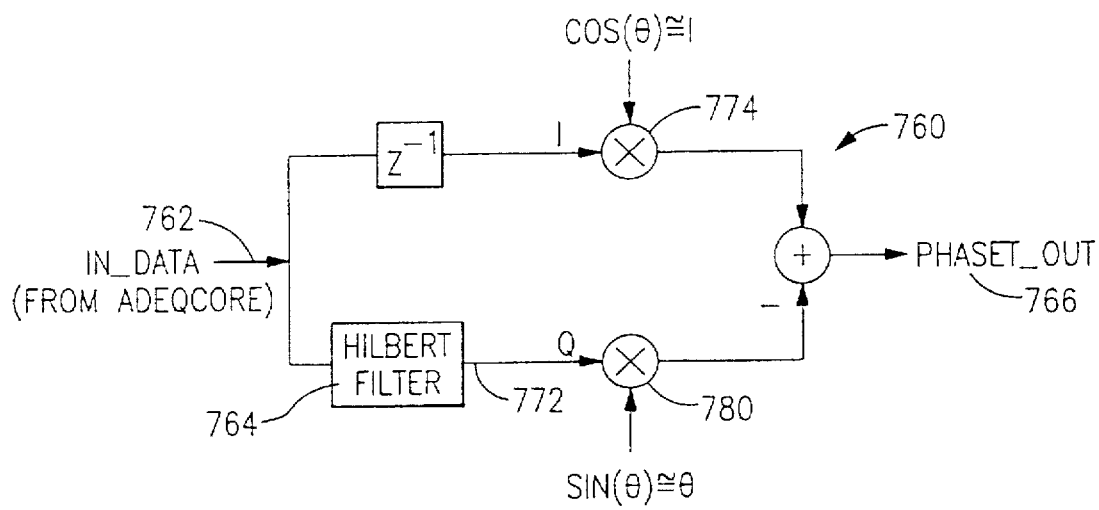
FIG. 35 is a schematic of the derotater employed in the adaptive equalizer shown in FIG. 34.
Figure 37:
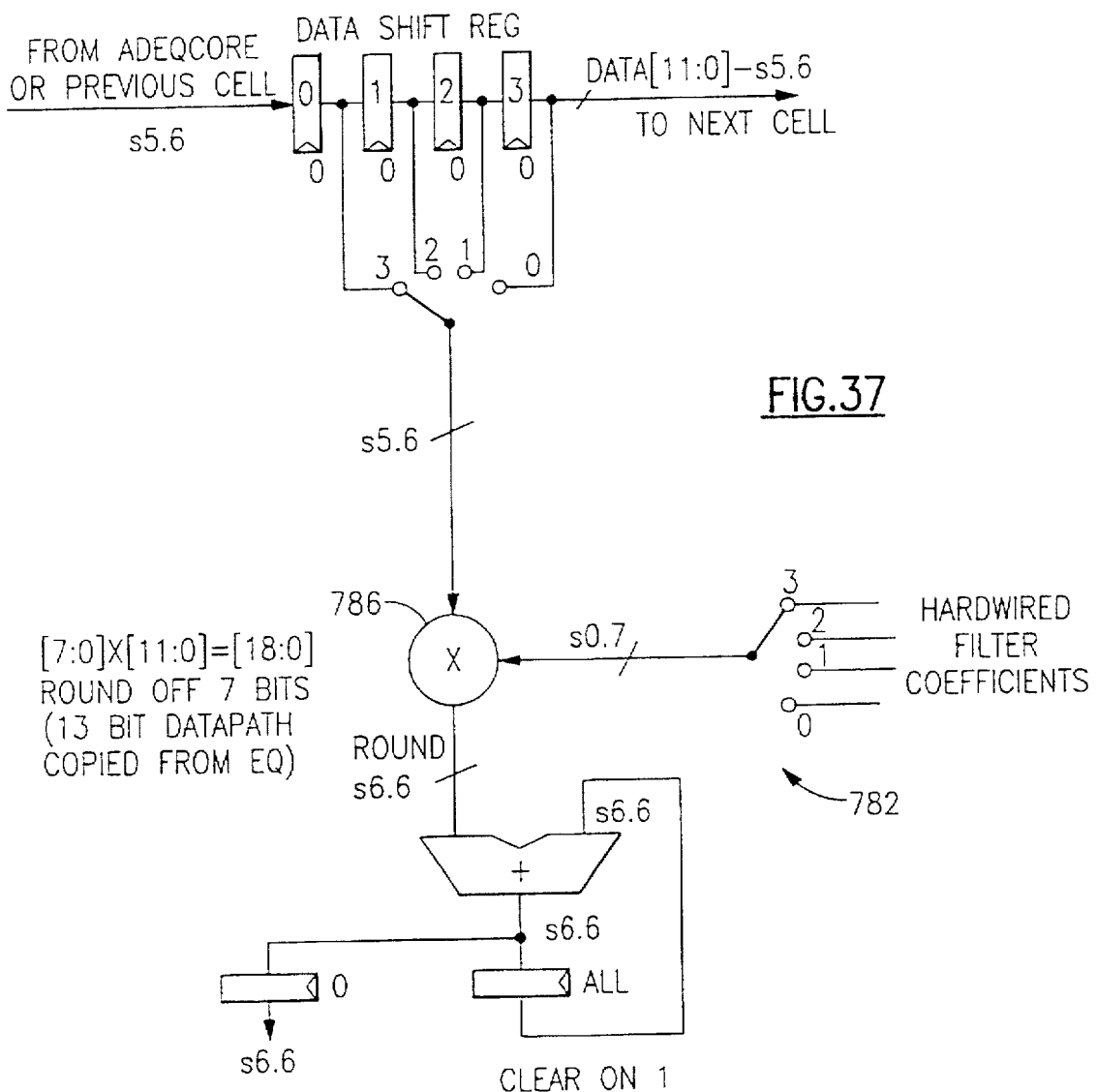
FIG. 37 is a more detailed diagram of a Hilbert filter used in the phase tracker shown in FIG. 35.

The phase tracker 754 adapts the value of $\theta$ using an error signal also derived from the LMS algorithm, as shown in FIGS. 34, 35 and 37. The Hilbert filter is an eleven tap finite impulse response filter which has been implemented in much the same way as the finite impulse response filter 750, except that the coefficient values are hardwired. One cell is referenced generally at 782. Again, to reduce hardware, the multiplier 786 is shared.

Referring again to FIG. 35, the phase estimate is adapted, using the full LMS algorithm: $\theta' = \theta + (Q \times \Delta\text{error})$. With no phase error the input in__data 762 is simply $a(t)$. If there is a phase error in in__data 762, then $$\text{data} = a(t)\cos\phi + \hat{a}(t)\sin\phi$$

where data is in__data 762

$\phi$ is the phase error; and $\hat{a}(t)$ is the quadrature component of $a(t)$.

The Hilbert filter 764 operates on the result out__adeq 706 (FIG. 32), producing a Hilbert transform of data and yielding $$-a(t)\sin\phi + \hat{a}(t)\cos\phi$$

The phase tracker output, phaset__out 766 is given by $$\begin{aligned}\text{output} &= (a(t)\cos\phi + \hat{a}(t)\sin\phi)\cos\theta - (-a(t)\sin\phi + \hat{a}(t)\cos\phi)\sin\phi \\ &= a(t)(\cos\theta\cos\phi + \sin\theta\sin\phi) + \hat{a}(t)(\sin\phi\cos\theta - \cos\phi\sin\theta).\end{aligned}$$

If $\theta = \phi$, then the first term becomes $\cos^2\theta + \sin^2\theta = 1$, and the second term becomes 0, so that phaset__out 766=$a(t)$.

Figure 38:
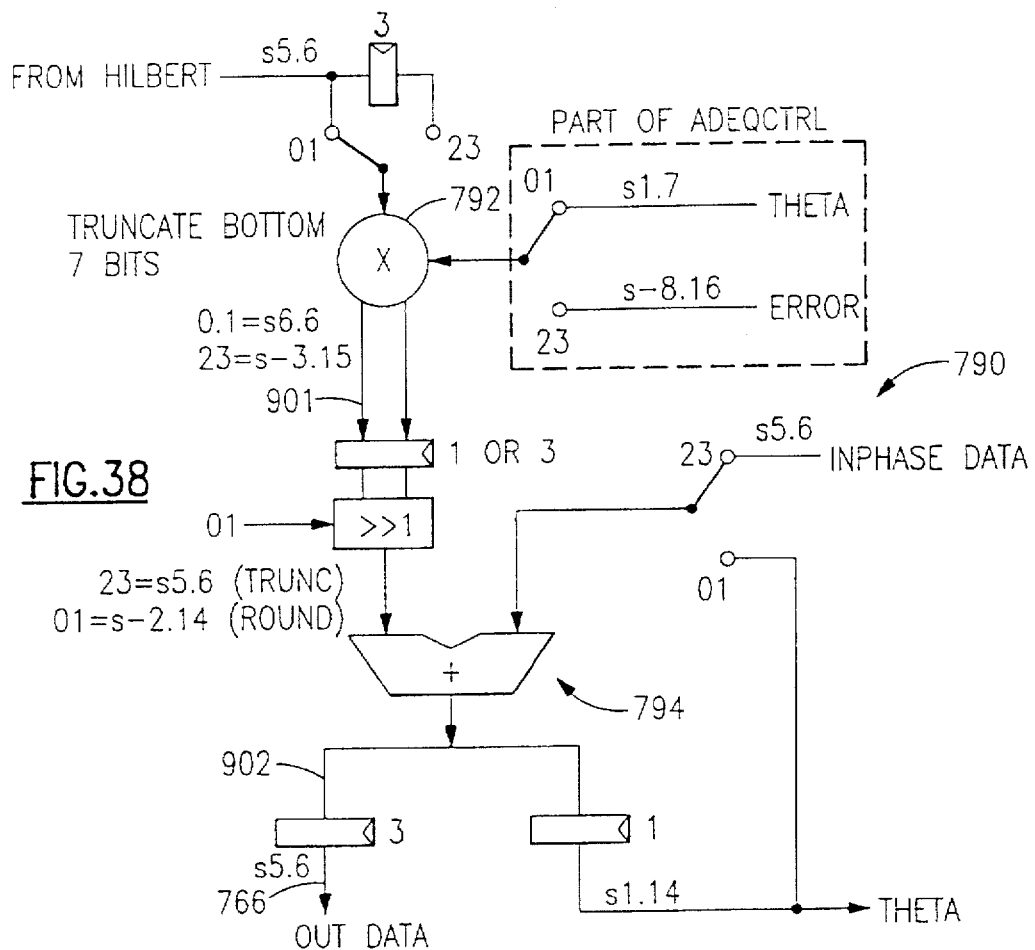
FIG. 38 is a more detailed schematic of another portion of the phase tracker shown in FIG. 35.

Referring to FIGS. 34 and 38, the multiplier and adder unit 790 is shared to do both the generation of the phase corrected output 766, and also adapt the estimate of $\theta$, referenced at 900. It is clocked at T/4. During the first two T/4 cycles the multiplier 792 is used to generate Hilbert output x $\theta$ 901, and the adder 794 adds Hilbert output x error 902 to the old value of $\theta$ to give a new value of $\theta$. During the second two T/4 cycles the multiplier 792 generates Hilbert output x error 902, and the adder 794 adds Hilbert output x $\theta$ 901 to the in–phase data 770 to generate the phase corrected output 766.

Figure 39:
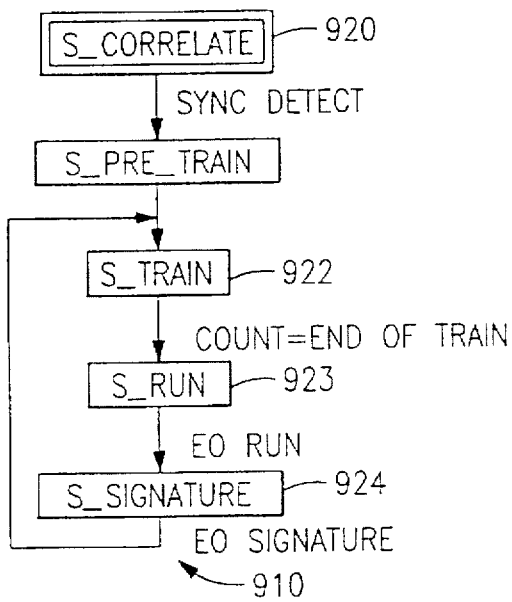
FIG. 39 is a block diagram of a state machine which controls the adaptive equalizer and the phase tracker shown in FIGS. 35 and 37-38.

The state machine which controls the adaptive equalizer, phase tracker, and descrambler is shown in FIG. 39. The state machine 910 changes state as symbols enter the equalizer. The state is reset to s__correlate 920 after a channel change. In this state the sync detector uses correlation to locate the synchronization signature. When found the state machine behaves as a counter, counting symbols to determine whether the input data is training sequence s__train 922, data s__run 923, or s__signature 924. There is an implicit delay in the equalizer and in the phase tracker which must be accounted for in assertion of control signals which control later stages of the system. Delayed versions of the state are used.

Figure 40A:
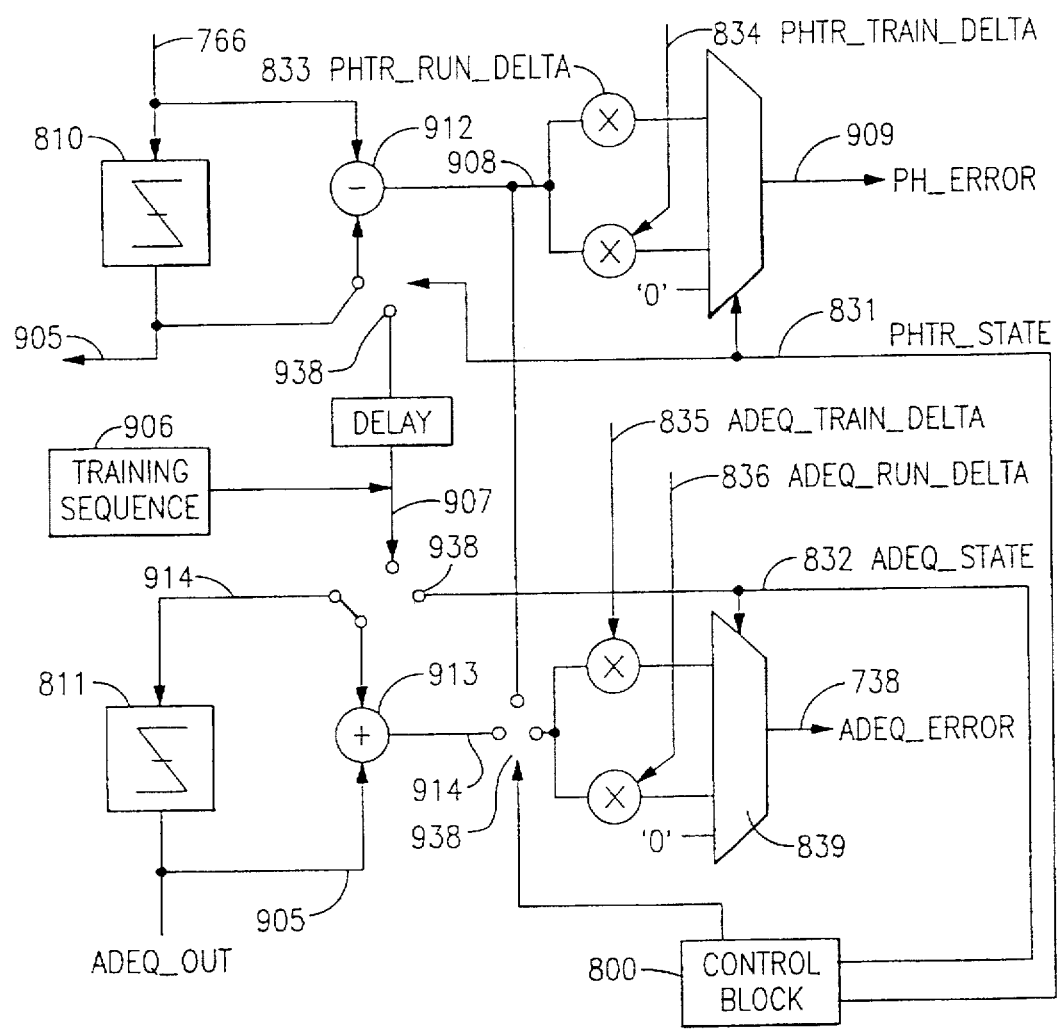
FIG. 40a is a detailed schematic of the adaptive equalizer shown in FIG. 34.
Figure 40B:
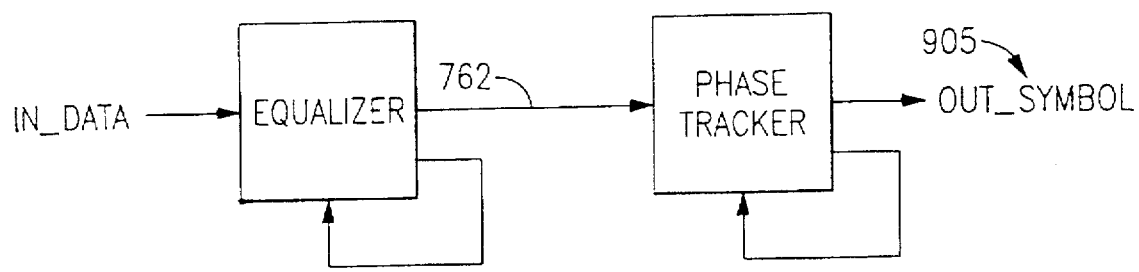
FIGS. 40b and 40c show independent and joint adaptation mode of operation of the adaptive equalizer and phase tracker shown in FIG. 34.
Figure 40C:
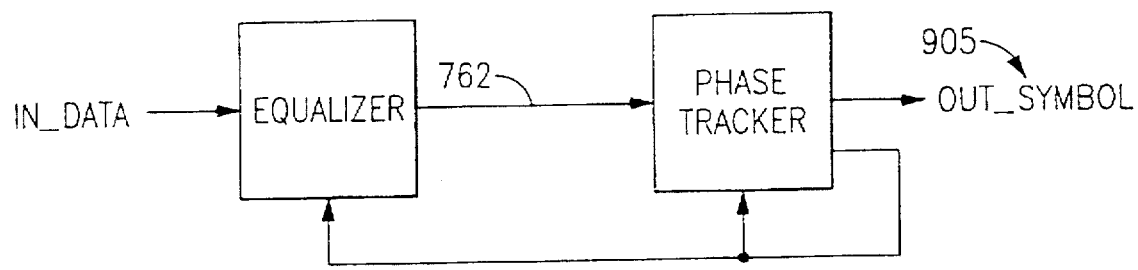

The slicer unit 756 is shown in further detail in FIGS. 40a–40c. A slicer 810 generates a 4 bit output symbol 905. A training sequence generator 906 generates a reference training sequence 907. Subtracter 912 takes the difference between the phase tracker output 766 (FIG. 35) and the sliced data, output symbol 905, or the reference training sequence 907 during training mode, to produce an error value 908. The error is multiplied by the appropriate scaling factor to generate the phase tracker error 909, which is used to adapt the estimate of $\theta$ 900 (FIG. 34).

Referring again to FIG. 34, error value 908, or a similarly derived error based on the adeq__output value 706, is multiplied by the appropriate scaling factors to generate the equalizer error 738 used to adapt the adaptive equalizer block 729.

Switches 938, operated by the control block 800, control the mode of operation, determining whether the equalizer and phase tracker adapt independently or jointly, as shown in FIGS. 40b and 40c respectively.

Figure 36:
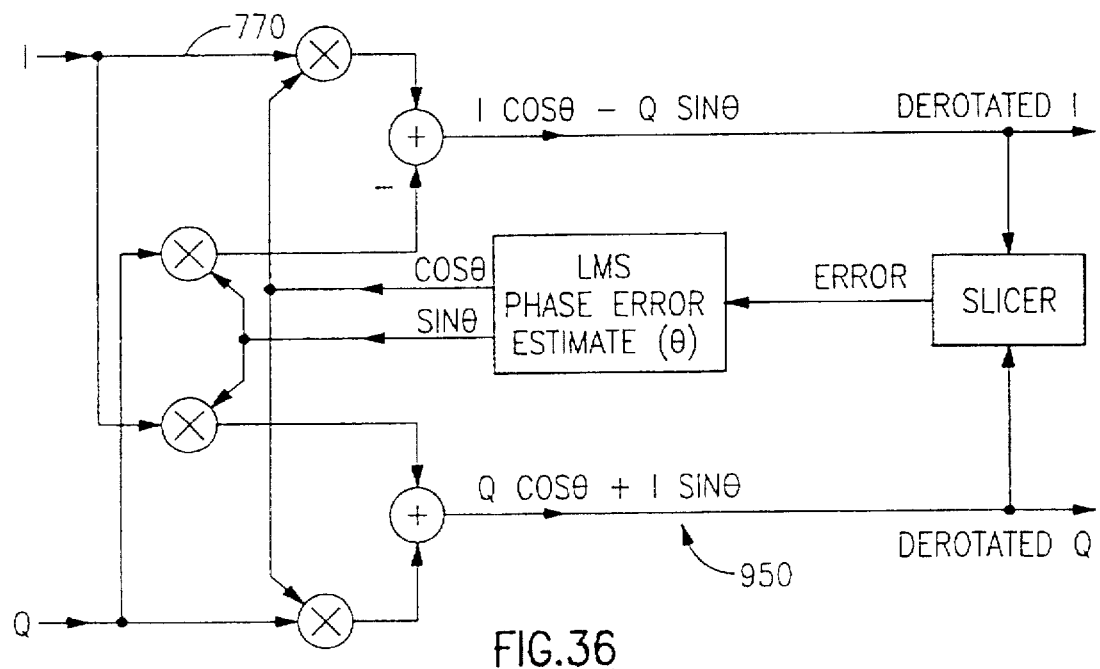
FIG. 36 is a block diagram generally showing a derotater.

FIG. 36 shows an alternative embodiment of a derotator and phase tracker circuit 950 which could be used in a quadrature based modulation system.

Reed-Solomon (208,188) Decoding

Error correction herein is disclosed with reference to Reed-Solomon decoding. As is known to those skilled in the art, Reed-Solomon decoding is a specialized block code. Other block codes could be employed without departing from the spirit of the invention.

Figure 7:
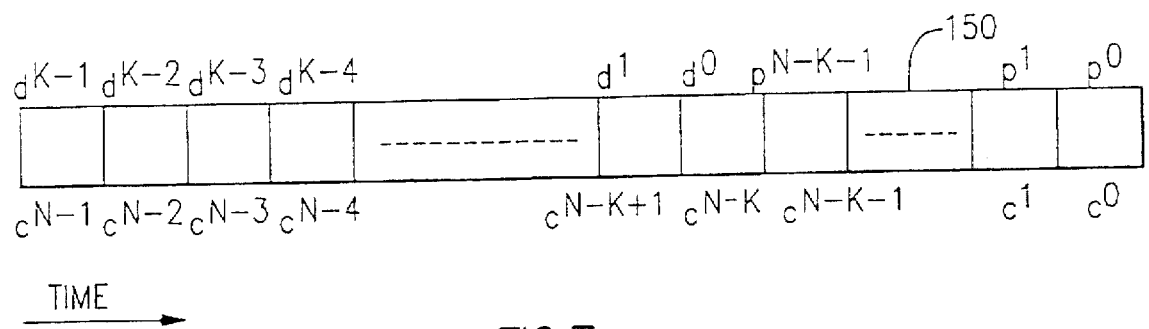
FIG. 7 is a diagram indicating the format of a packet of data that is processed by the system illustrated in FIG. 1.

Reed-Solomon decoding of a 208 byte packet is explained with reference to FIGS. 8–15. Unless otherwise noted, it will be understood that all arithmetic is Galois Field arithmetic. As submitted to the error correction circuitry 72 (FIG. 4), a packet 150 of (N, K) data has the general format shown in FIG. 7, wherein d is an information byte;

p is a parity check byte;

c is a byte of the transmitted packet; and

N is the number of bytes in the packet.

In the preferred embodiment, (N, K) are (208, 188). It will be evident that there are 20 parity check bytes.

$$(N-K)=20$$

Also, the maximum number of bytes that can be corrected are $$T=(N-K)/2=10.$$

In the discussion, the following notation is used.

C(x) is the transmitted packet;

E(x) is the error injected between assembly of the packet and its reception;

R(x) is C(x)+E(x)

S(x) is the syndrome polynomial of order 2T-1;

$\Lambda(x)$ is the locator polynomial; and $\Omega(x)$ is the evaluator polynomial.

Those skilled in the art will appreciate that S(x) contains information on corruption of R(x). $\Lambda(x)$ has a maximum order of T, and its roots determine the error locations in R(x). The evaluation of $\Omega(x)$ at the error location leads to the error value at that location.

Figure 8:
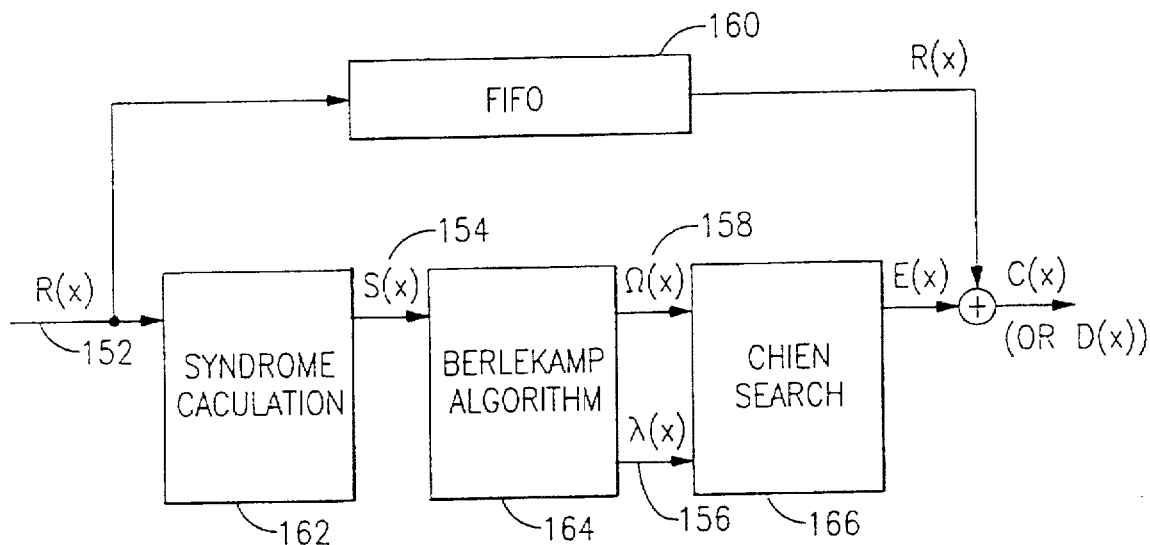
FIG. 8 is a functional block diagram of the Reed-Solomon decoder that is incorporated in the system illustrated in FIG. 1.
Figure 9:
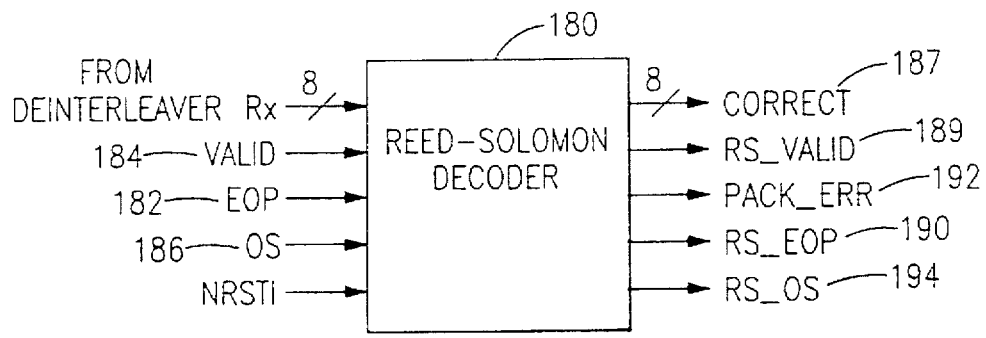
FIG. 9 is a block diagram of the Reed-Solomon decoder which operates according to the process illustrated in FIG. 8.
Figure 10:
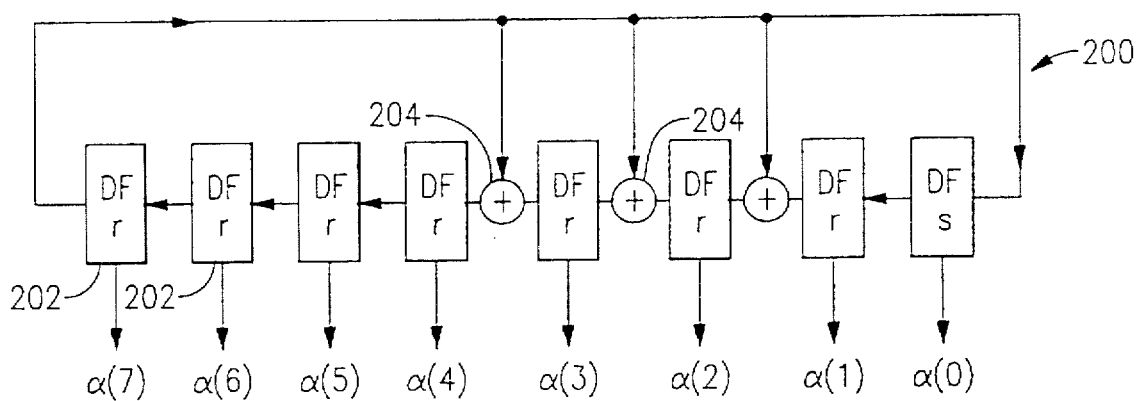
FIG. 10 is a diagram of a hardware arrangement for generating entries of a Galois Field.

The approach selected for decoding is explained with reference to FIGS. 8 and 9. A 208 byte packet R(x) 152 is input into a FIFO 160, which is realized as a RAM capable of storing 448 bytes. The FIFO 160 simply acts as a delay while the decoding proceeds. Only the 188 information bytes are required to be stored. The 20 parity bytes may be discarded as they are not employed after calculation of the syndromes S(x) 154. The decoder 180 receives deinterleaved data R(x) 152. a VALID flag 184 indicates that the current byte of R(x) 152 is a valid byte in the current packet. The end–of–packet flag EOP 182 is raised at the same time as the Valid flag 184 indicates that the last byte of a packet has been received. An error flag OS 186 is raised in the event that a packet was prematurely terminated by the deinterleaver. This results in a resetting operation for the entire decoder 180. Bus CORRECT 187 contains corrected data. Line RS-VALID 189 indicates that data is on the bus CORRECT 187. This line is only raised when data bytes are on the line. Line RS_EOP 190 is a line indicating that the end of a packet has been detected. The line PACK_ERR 192 goes high when line RS_EOP 190 is raised. It indicates that the decoder 180 has been unable to correct a previously released packet. The Line RS_OS 194 signifies that a significant error condition has occurred within the packet. This signal is propagated through the system, and indicates that the current block will not provide any more valid data.

Figure 11:
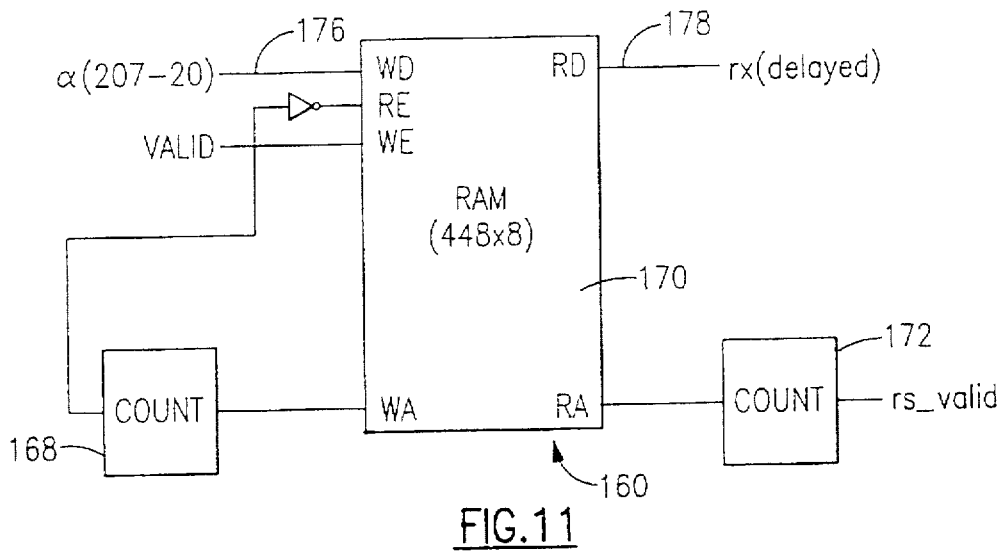
FIG. 11 is a block diagram of a FIFO that is incorporated in the decoder illustrated in FIG. 8.
Figure 12:
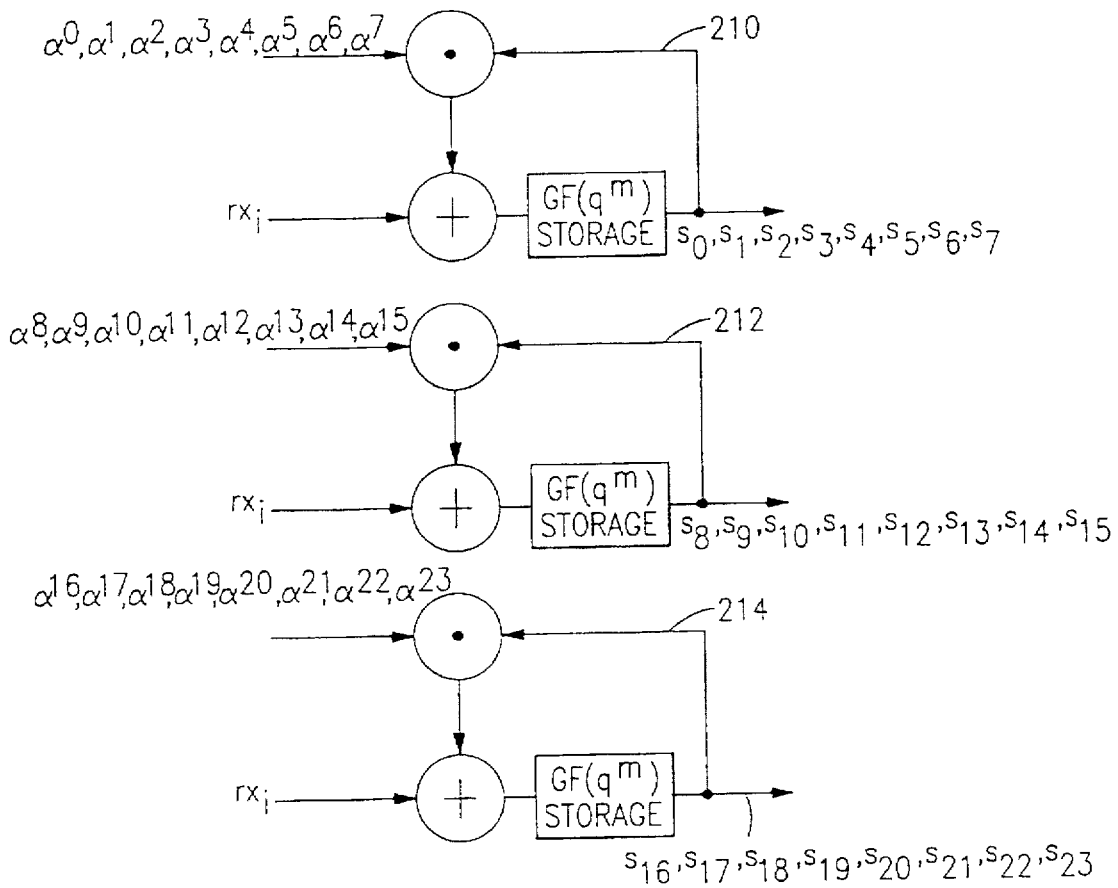
FIG. 12 shows a hardware arrangement for generating syndromes in the process illustrated in FIG. 8.

Referring to FIG. 11, The first 188 bytes of R(x) appear on line WD 176 of the FIFO 160, and are written into an address of RAM 170 according to the state of counter 168. Similarly a delayed version of R(x) is read on line RD 178 from addresses selected according to the state of counter 172.

Syndromes are calculated in syndrome calculation block 162 according to the following equation.

$$S_j = \sum_{i=0}^{n-1} rx_i \alpha^{i(j+m_0)}$$

wherein $S_j$ is the jth syndrome;

n is the number of bytes in a packet;

$m_0$ is an arbitrary integer (which equals zero);

$rx_i$ is the ith byte in a packet; and $a^x$ is the xth $\alpha$ in a Galois Field.

The syndrome is generated by a bank of three units 212, 212, 214 operating in parallel, as shown with reference to FIGS. 8–14. The Galois Field entries $\alpha^i$ are produced by a tapped feedback shift register 200, comprising a plurality of flip-flops 202 having adders 204,204, the positions of which are determined by the generator polynomial, $x^8+x^4+x^3+x^2+1$. While 24 syndromes are determined for convenience, only $S_0$–$S_{19}$ are actually used by the rest of the decoder 180.

Figure 13:
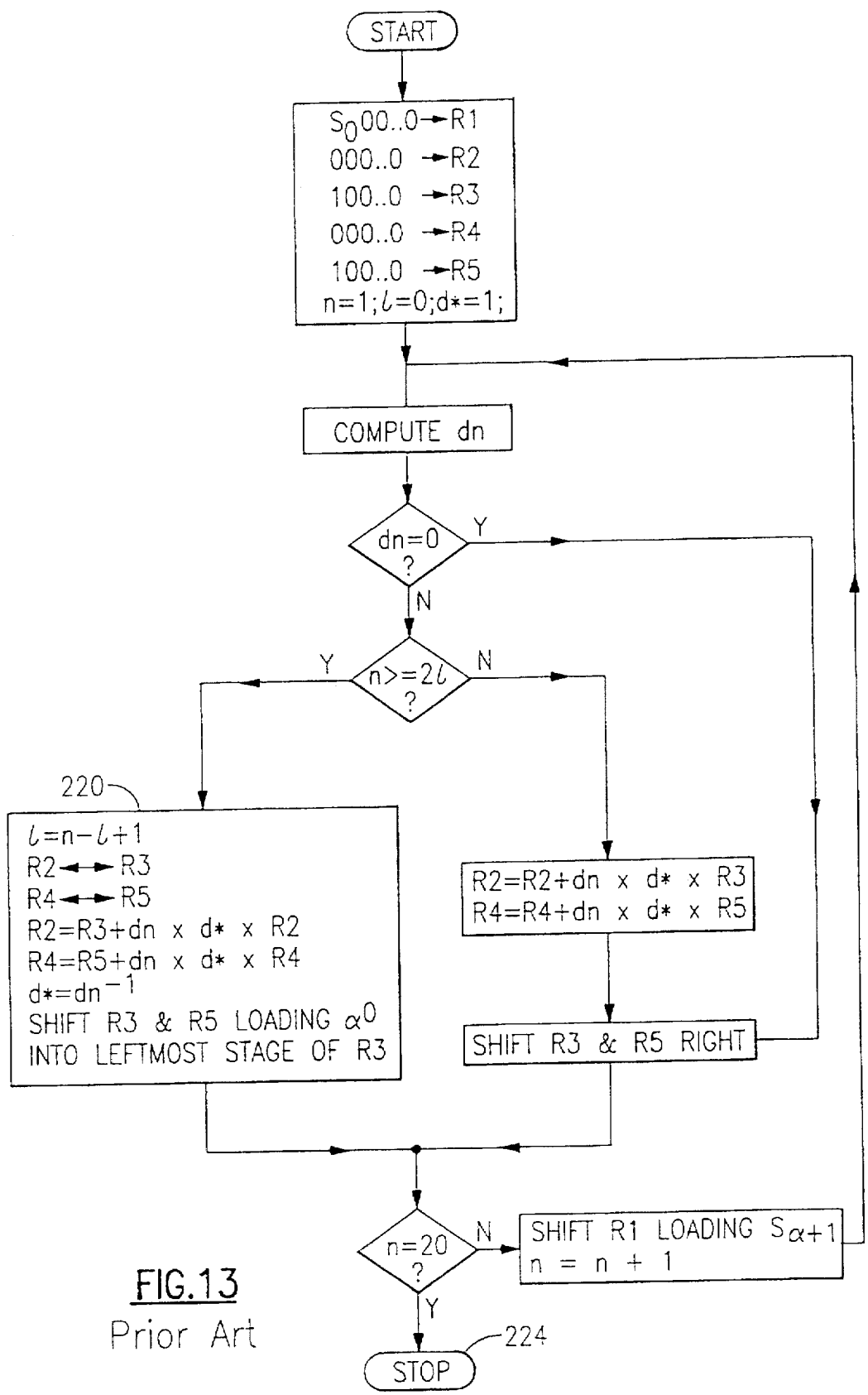
FIG. 13 shows a flow diagram of the Berlekamp algorithm used in a Reed-Solomon decoder in the prior art.

The Berlekamp algorithm executed in block 164 is a known method used to derive the locator polynomial, $\Lambda(x)$ 156, and the evaluator polynomial, $\Omega(x)$ 158. Its flow diagram is shown in FIG. 13. The following notation is used:

R1 is the Shift Register containing Syndrome bytes produced by the previous Syndrome block;

R2 contains the locator polynomial, $\Lambda(x)$, with $\Lambda_0=1$;

R3 contains the D polynomial;

R4 contains the evaluator polynomial, $\Omega(x)$, with $\Omega_{10}=0$;

R5 is temporary storage for the A polynomial;

$d_n$ is delta;

l is the order of the polynomial in RI; and n is a counter.

Figure 14:
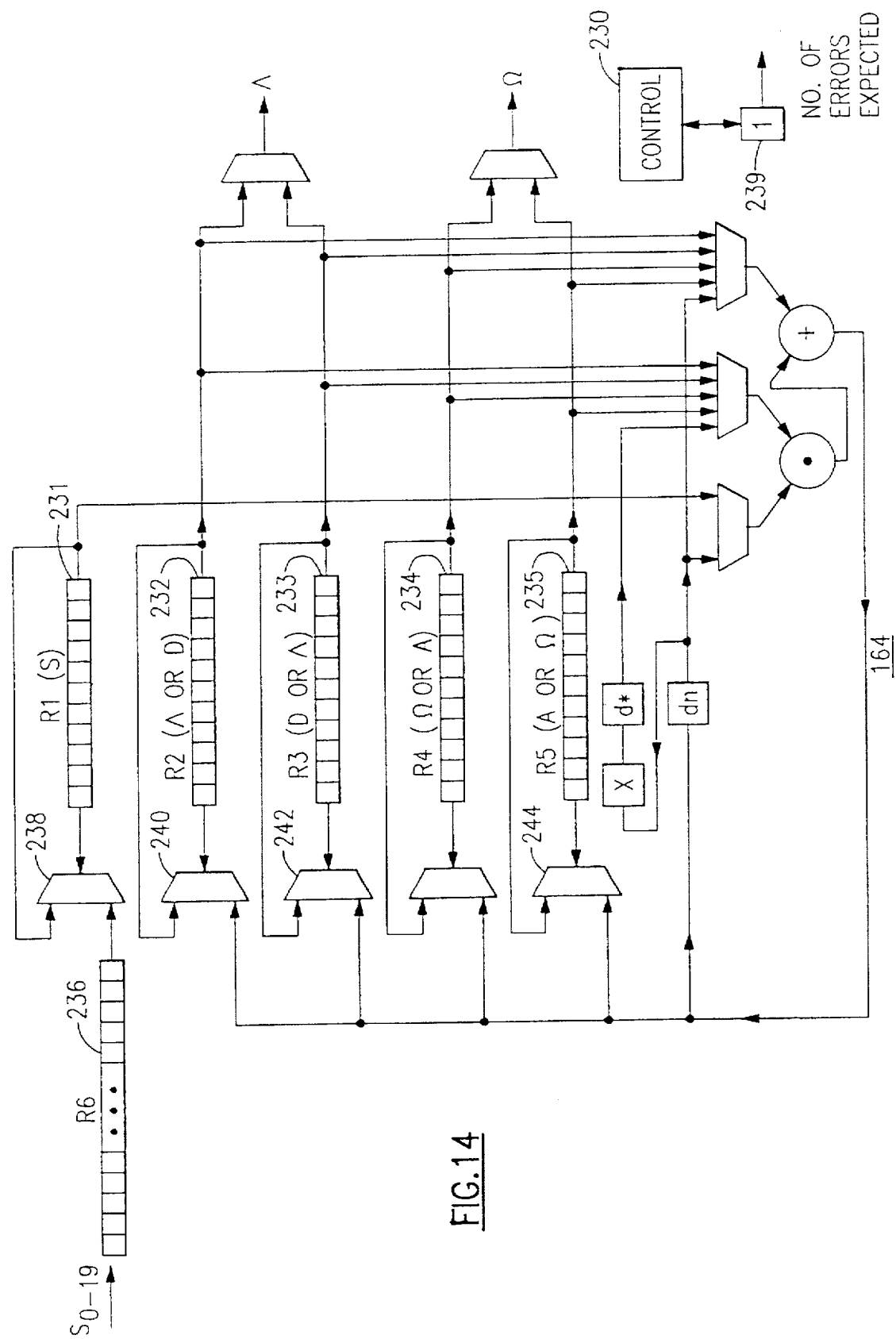
FIG. 14 shows a block diagram of an apparatus used to perform the Berlekamp algorithm used in a Reed-Solomon decoder in accordance with the process illustrated in FIG. 8.

On STOP 224, l represents the number of errors found by the algorithm, and is maintained in register 239 (FIG. 14). In block 220, it is necessary to repetitively exchange the contents of registers R2 232 and R3 233 for subsequent iterations of the algorithm.

The value $d_n$ is calculated according to the formula $$d_n = \sum_{i=0}^{10} \Lambda_{n,i} S_{n-i}$$

FIG. 14 differs from the algorithm in FIG. 13. Instead of exchanging the contents of register R2 232 with register R3 233, and exchanging register R4 234 with register R5 235, a toggle switch is used to remember which register contains the respective polynomial. This approach is economical, as temporary storage is not required. Control block 230 is a 5 bit state machine, with decoding from each state determining (a) the next state; (b) enables of each of the shift registers 231–236; (c) the multiplexer selects for multiplexers 238, 240, 242, 244 to select input to registers 231–235, corresponding to R1–R5 in block 220; (d) controlling the time during which each state is active; (e) recalculating the variables n and l as necessary; (f) and maintaining an indication of which registers contain $\Lambda(x)$ and $\Omega(x)$.

The Chien Search block 166 exhaustively evaluates every possible location to determine if it is a root of $\Lambda(x)$. Evaluation at a location is accomplished according to the equation $$\Lambda(\alpha^{-i}) = \sum_{k=0}^{10} \Lambda_k \alpha^{-ik}$$

Although only 208 locations have been received, checking is done for all 255 possible locations, beginning at $x=\alpha^{254}$; for example $\Lambda(\alpha^{-254})=\Lambda(\alpha^1)=\Lambda_{10}(\alpha^{10})+\Lambda_9(\alpha^9)+\ldots+\Lambda_2(\alpha^2)+\Lambda_1(\alpha^1)+1$ $\Lambda(\alpha^{-253})=\Lambda(\alpha^2)=\Lambda_{10}(\alpha^{20})+\Lambda_9(\alpha^{18})+\ldots+\Lambda_2(\alpha^4)+\Lambda_1(\alpha^2)+1$ $\Lambda(\alpha^{-252})=\Lambda(\alpha^3)=\Lambda_{10}(\alpha^{30})+\Lambda_9(\alpha^{27})+\ldots+\Lambda_2(\alpha^6)+\Lambda_1(\alpha^3)+1$, etc.

Figure 15:
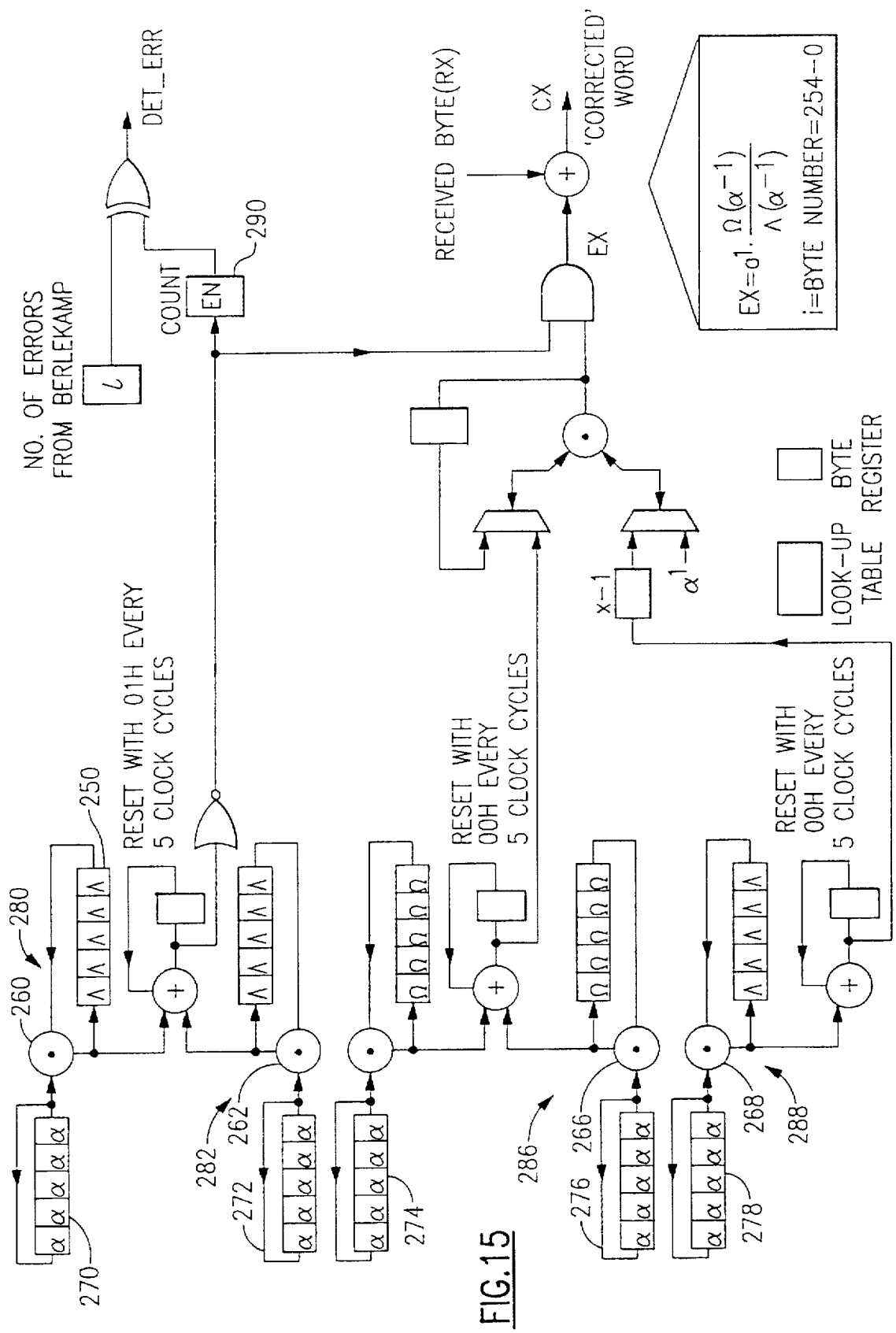
FIG. 15 shows a block diagram of the arrangement for accomplishing a Chien search in the process shown in FIG. 8.

The Chien Search Block 166 (FIG. 8) is shown in greater detail in FIG. 15. The terms of Λ(x) are computed using two parallel units. The top unit 280, having a pair of shift registers 250,270 that feed into a multiplier 260 concerns the coefficients $\alpha^1$–$\alpha^5$ will be discussed. The other units 282, 286, 288 operate identically. The two top units in FIG. 15 are used to compute Λ(x).

In each iteration the products are subjected to a rotate operation, so that they recycle through the shift registers. Thus In the sixth iteration the next location is being evaluated, and the rightmost cell of the shift register contains the product $\Lambda_5(\alpha^5)$. The product $\Lambda_5(\alpha^{10})$ is immediately required, and it is only now necessary to multiply the product of the first iteration by a $\alpha^5$.

Counter 290 is incremented each time Λ(x)=0, in order to count the number of error locations found. There are two checks performed to determine if the received packet contained more than the maximum of 10 erroneous bytes. Firstly the value in the counter 290 is compared with the value in register 239 (FIG. 14). A difference between these two values indicates a packet having more than 10 errors. Secondly an error in bytes 254–208 found in the Chien search would invalidate the block. These are bytes not received, but only used to simplify the Chien search block 166.

The equation used to calculate the magnitude of error is given by $$E(x) = \frac{\Omega(\alpha^{-i})}{\Lambda'(\alpha^{-i})} \alpha^i$$

This result is only added to the received byte if the evaluation of Λ(x) at that location equals zero. The evaluation of Ω(x) and Λ'(x) is performed similarly to Λ(x), using the lower two units 286, 288. Unit 288 produces Λ'(x), and the reciprocal is obtained with a look-up table in a ROM (not shown).

Output Interface

The output interface of the present invention performs the following functions: resynchronization, buffering and handshaking control with the external processing environment.

Figure 55:
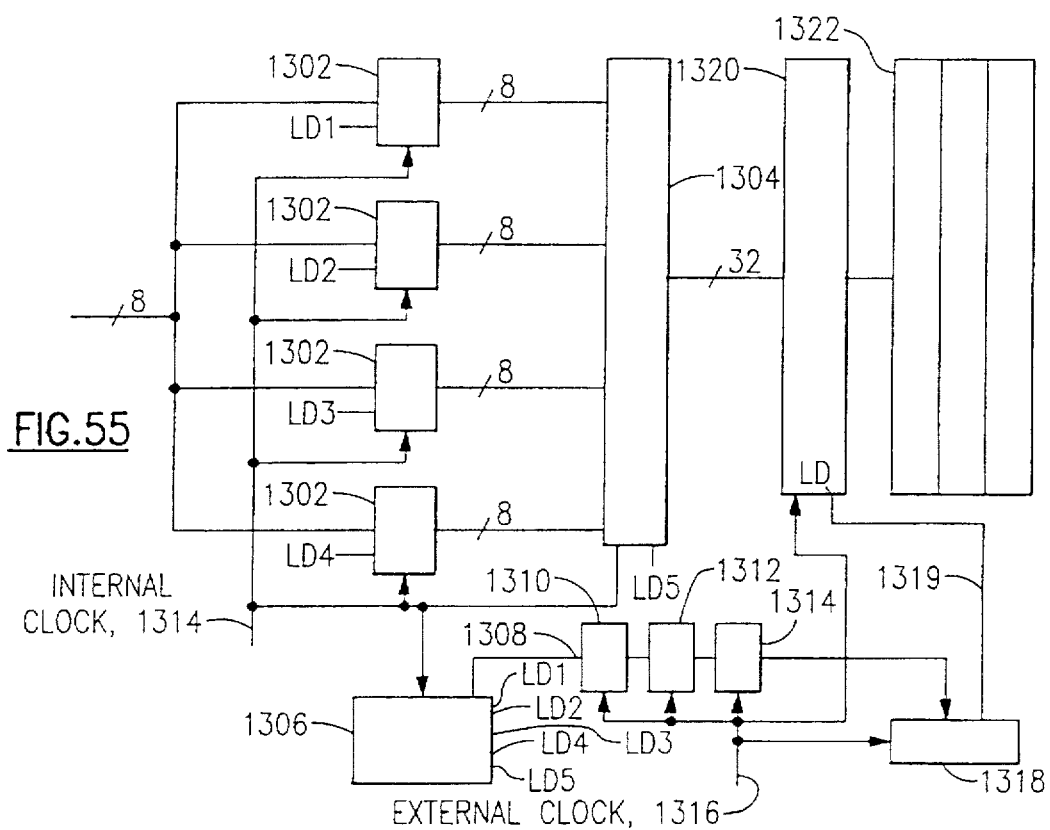
FIG. 55 is a schematic of a portion of the output interface in the receiver according to the present invention.

Resynchronization is necessary in order to correctly transfer data from the Reed Solomon decoder at the 7.5 MHz symbol rate clock into the external processing environment which may operate at a different clock rate. Buffering is necessary because the data is received from the channel at a relatively slow speed in relation to the transfer speed required by the external processing environment. Handshaking control is necessary to ensure that the data is properly transferred from the receiving system of the present invention to the external processing system. The output interface first assembles bytes together into 32-bit words. With reference to FIG. 55, bytes arrive one at a time from the Reed Solomon decoder 72 (FIG. 4) over an 8-bit data path once every second cycle at the 7.5 MHz decoder clock rate, (except during gaps corresponding to discarded frame headers and check bytes), i.e. once every eighth cycle at the 30 MHz internal clock. Each byte that arrives is gated into one of four latches 1302, in sequence by selector inputs LD1, LD2, LD3, and LD4 by a control 1306, until all four latches have been loaded. Then the contents of latches 1302 are loaded with the internal clock signal 1316 into a 32-bit-wide latch 1304. The resynchronization process continues, as is evident from FIG. 55, with the propagation of a control signal DATA_VALID 1308 from the control 1306 into latch 1310, which is clocked at the external processing environment's clock rate, e.g. 27 MHz. Because of the difference between the clock rates of the receiving system and the external processing environment, the possibility exists at the time that the outgoing signal DATA_VALID 1308 is accepted into latch 1310, the signal has not yet settled to a definite level. The signal condition at such times can be referred to as indeterminate. The potential propagation of an indeterminate signal condition (and the resultant error that can be induced thereby) is avoided in the output interface according to the present invention by gating the outgoing control signal DATA_VALID 1308 from the receiving system's internally clocked control element, control 1306, through a series of latches 1310,1312 and 1314 which are all clocked by the external processing environment's clock 1316. After passing through the series of latches 1310, 1312, and 1314, the likelihood that the signal emerging from the final latch 1314 will remain in an indeterminate condition becomes vanishingly low. Once the signal DATA_VALID 1308 is fully propagated through latches 1310, 1312 and 1314, it is input into another control element 1318. In response to receipt of the signal DATA_VALID 1308 from latch 1314, the control element 1318 activates a signal LD 1319 which, in combination with the external clock 1316, signals the 32-bit latch 1320 that it is time to latch the data in from latch 1304.

For reasons of efficiency, data words received in latch 1320 are preferably placed in an output buffer and then transferred to the external processing environment as needed. The data words are transferred over a 32-bit wide data path into a FIFO buffer 1322. Once a full packet of data words has been loaded into the FIFO buffer 1322, the external processor can then draw upon the data words as needed. Whole packet data buffering in this manner permits the error detection and correction operations to be completed prior to outbound transfer of data to the external processing environment. In the preferred embodiment, as the data is being written into the FIFO buffer 1322, it is simultaneously being processed by the error correction circuitry 72 (FIG. 4). Upon completion of the error correction and detection operation by the decoder 180 (FIG. 9) of the error correction circuitry 72, the signal PACK_ERR 192 is asserted in the event an uncorrectable error is detected. An appropriate error bit is then set in the packet to inform the external processing environment of the fact that the packet currently in the FIFO buffer 1322 is corrupted. For example, in the case of MPEG 2 transport packets, the first bit of the second byte of the packet is set when the signal PACK_ERR 192 is asserted. Thus, error indicators such as may be found in appropriate bytes of the transport packet are identified to the external processing environment before actual packet transfer has occurred. It will be apparent that without buffering in the FIFO buffer 1322, the second byte of the MPEG 2 packet would have already been transmitted to the external processing environment before the fact that the packet was corrupted had been determined. But with the use of a buffer in the manner described, unnecessary processing time and/or other error handling can be avoided.

Published European patent application number EP A-057-6749 provides a description of the preferred structure of the output interface between FIFO buffer 1322 and the external processing environment, including handshaking signals which control the transfer of data between the FIFO 1322 and the external processing environment for use in an external processing environment such as MPEG-2 (ISO/IEC JTC1/SC29/WG11N0702).

Operation

Figure 24:
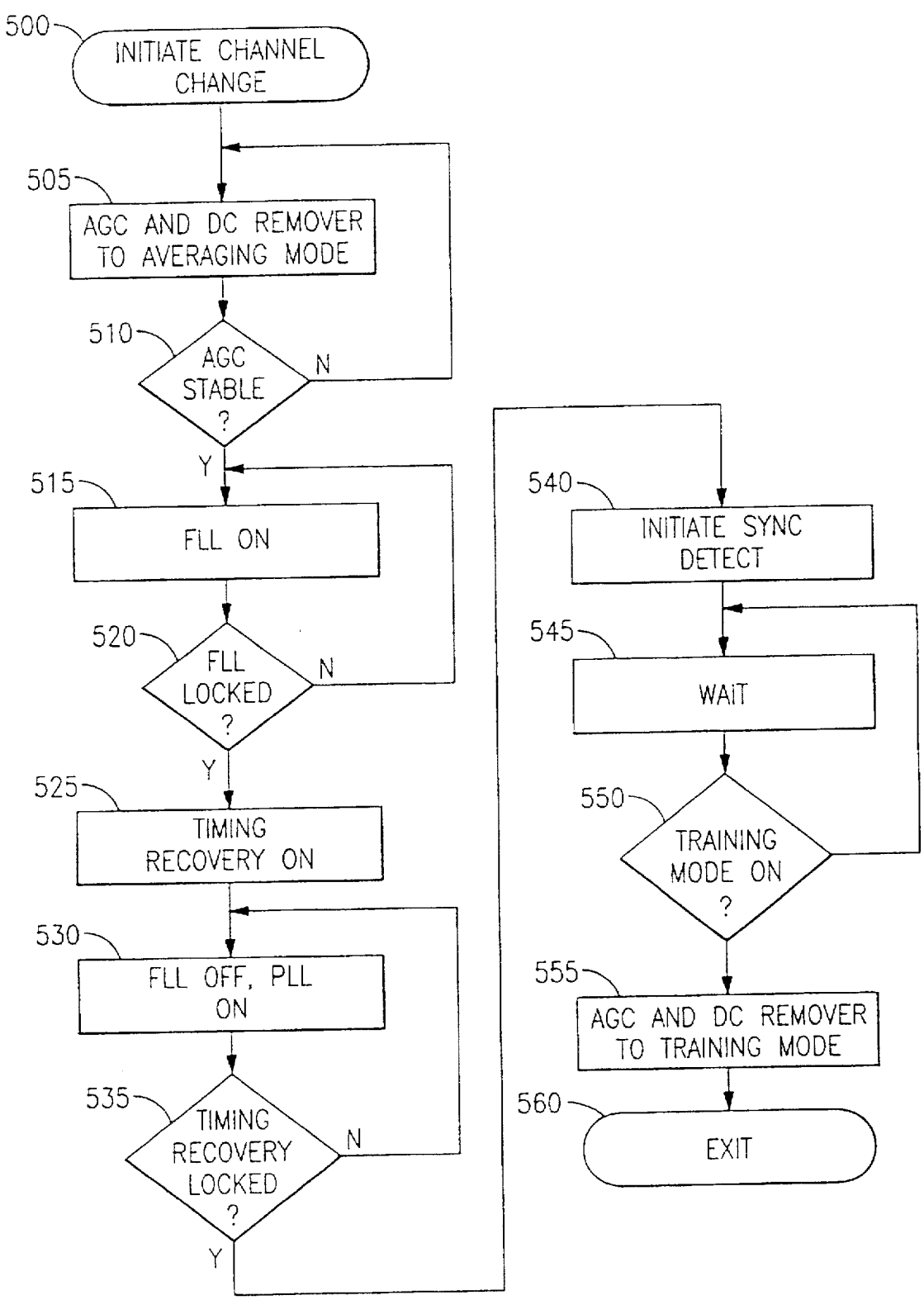
FIG. 24 is a flow diagram illustrating the process of channel acquisition by the receiver shown in FIG. 4.

Acquisition of a channel, or a channel change is explained with reference to FIG. 24. The process is initiated at step 500. In step 505 the automatic gain control is set into averaging mode, in which the outputs are based on a prior knowledge of the mean values of the entire input waveform. Once the frame sync has been detected, the values are adjusted on the basis of the known characteristics of the training sequence. This mode provides improved accuracy. Stability of the automatic gain control is tested at decision step 510. If the automatic gain control has not tracked to a stable value, then step 505 is repeated. It is possible to override decision step 510 if the system is operating under microprocessor control.

When the automatic gain control has been determined to be stable, the frequency lock loop circuitry is enabled at step 515. An initial frequency offset of ±450 KHz is permitted. As this is outside the pull range of the carrier recovery phase lock loop circuit, a separate frequency lock loop is used. Frequency lock is evaluated at decision step 520. If this test succeeds, the frequency lock loop circuitry is switched out, and timing recovery is initiated at step 525. The timing recovery lock detect operates similarly to the frequency lock loop detect, as has been discussed above. Then, at step 530 the phase lock loop circuit switched in for accurate phase tracking.

Figure 25:
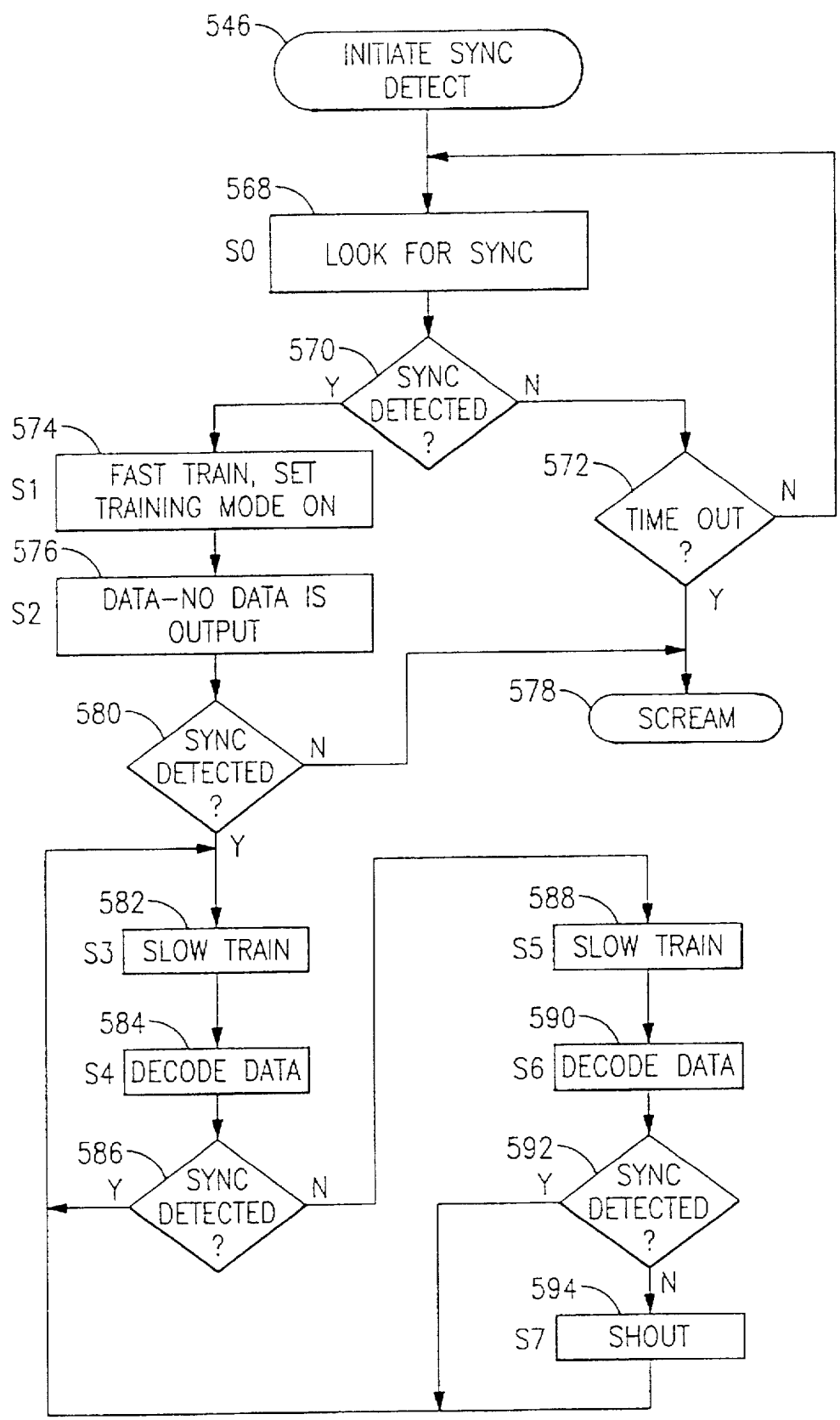
FIG. 25 is a detailed flow diagram illustrating synchronization detection in the process illustrated in FIG. 24.

The sync detect sequence is initiated at step 540. This is explained in further detail with reference to FIG. 25. In step 568 a search is carried out for a frame sync during the time required to transmit a complete frame. The result of the search is tested at decision step 570. If the test fails a further test is conducted at step 572 to determine if the maximum time allotted to the search has elapsed. If not the process returns to step 568. Otherwise it is assumed that there was an error in steps 500–535 of the channel change sequence. The process then exits at step SCREAM 578, and the channel change sequence then restarts at step 500.

If sync was successfully detected at step 570 then the adaptive equalizer is trained at step 574 using a large step size. Also a "training mode on" signal is announced. This signal has concurrently been tested at step 550 (FIG. 24), and when it is detected at step 555, the automatic gain control and DC remover are switched into their more accurate training modes. The channel changing process then exits at step 560.

Referring again to FIG. 25, it should be noted that in training mode the automatic gain control and DC remover only adapt during the second and subsequent training sequences following sync detection. The adaptive equalizer may take two training sequences to adapt. Data in the first frame is regarded as unreliable, and is therefore discarded in step 576.

Following the first frame, a second sync sequence is expected in the frame header of the second frame, and this is tested at decision step 580. If the second sync does not appear correctly, it is assumed that the first sync was falsely detected, or there was an error in the channel change sequence in steps 500–535. The sync detection sequence is then terminated at step SCREAM 578 and control then returns to step 500 to restart the channel change sequence.

If a second sequence is detected, then the adaptive equalizer is trained in step 582 using a fine step size. Data from this and subsequent frames is decoded and output in step 584. Sync is tested in a third sequence in decision step 586.

The sync detect process normally will recycle through steps 582, 584, and decision step 586; however if at any time a frame sync does not appear as expected for two successive frames, as indicated in steps 588, 590, and decision step 592, wherein the process of steps 582, 584, and decision step 586 is repeated, then a signal SHOUT is generated in step 594. This can have two optional effects, depending on whether the system is under microprocessor control. In one embodiment, a signal NO_SYNC_EVENT (not shown) is generated, which interrupts a host microprocessor. In another embodiment, the channel change sequence is restarted at step 500.

Electrical Specifications

The electrical specifications are given in the following tables:

TABLE 7

Absolute maximum ratings

| Symbol | Parameter | Min. | Max. | Units |
|---|---|---|---|---|
| $V_{DD}$ | Nominal 5V supply voltage relative to GND | −0.5 | 6.5 | V |
| $V_{IN}$ | Input voltage on any pin. | GND − 0.5 | VDD + 0.5 | V |
| $T_A$ | Operating temperature | −40 | +85 | xC. |
| $T_S$ | Storage temperature | −55 | +125 | xC. |

TABLE 8

DC Operating conditions

| | | | | |
|---|---|---|---|---|
| $V_{DD}$ | Nominal 5V supply voltage relative to GND | 4.75 | 5.25 | V |
| GND | Ground | 0 | 0 | V |
| $T_A$ | Operating temperature | 0 | 70 | xC. |
| $I_{DD}$ | RMS power supply current | | 500 | mA |
| $I_{VCCref}$ | RMS current drawn by $V_{CCref}$ | | 5 | mA |

Two different signal interface types are implemented. Standard (5 V) TTL levels are employed by the microprocessor interface. 5 V CMOS levels are used by the other interfaces. In the following tables, where a signal type is indicated, the meaning of each symbol is as shown in Table 9.

TABLE 9

Signal types

| Type | Logic levels employed |
|---|---|
| C | 5V CMOS levels |
| T | 5V TTL levels |
| T o/c | 5V TTL levels (open collector signal) |

TABLE 10

TTL (5V) DC Characteristics

| Symbol | Parameter | Min. | Max. | Units | @ | Notes |
|---|---|---|---|---|---|---|
| $V_{IL}$ | Input LOW voltage | GND − 0.5 | 0.8 | V | | a |
| $V_{IH}$ | Input HIGH voltage | 2.0 | VDD + 0.5 | V | | |
| $V_{OL}$ | Output LOW voltage | | 0.4 | V | $I_{OL}$ max | |
| $V_{OLoc}$ | Open collector output LOW voltage | | 0.4 | V | $I_{OLoc}$ max | |
| $V_{OH}$ | Output HIGH voltage | 2.4 | | V | $I_{OH}$ min | |
| $I_{OL}$ | Output current, LOW | | 16 | mA | $V_{OL}$ max | |
| $I_{Ooc}$ | Open collector output current, LOW | 4.0 | 8.0 | mA | $V_{OLoc}$ max | |
| $I_{OH}$ | Output current, HIGH | −400 | | mA | $V_{OH}$ min | |
| $I_{OZ}$ | Output off state leakage current | | ±20 | mA | | |
| $I_{IN}$ | Input leakage current | | ±10 | mA | | |
| $C_{IN}$ | Input capacitance | | 5 | pF | | |
| $C_{OUT}$ | Output/IO capacitance | | 5 | pF | | |

TABLE 11

CMOS (5 V) DC Characteristics

| Symbol | Parameter | Min. | Max. | Units | @ | Notes |
|---|---|---|---|---|---|---|
| $V_{IL}$ | Input LOW voltage | GND−0.5 | 1.4 | V | $V_{DD}$ = 4.75 | a |
| $V_{IH}$ | Input HIGH voltage | 3.7 | $V_{DD}$ + 0.5 | V | $V_{DD}$ = 5.25 | |
| $V_{OL}$ | Output LOW voltage | | 0.4 | V | ≦4mA | |
| | | | 0.1 | V | ≦1mA | |
| $V_{OH}$ | Output HIGH voltage | $V_{DD}$ − 0.4 | | V | ≧−4mA | |
| | | $V_{DD}$ − 0.1 | | V | ≧−1mA | |
| $I_{OZ}$ | Output off state leakage current | | ±20 | mA | | |
| $I_{IN}$ | Input leakage current | | ±10 | mA | | b |
| $I_{JIL}$ | Leakage; JTAG with pull-up | −50 | −180 | mA | GND | c |
| $I_{JIH}$ | Leakage; JTAG with pull-up | | 10 | mA | VDD | |
| $C_{IN}$ | Input capacitance | | 5 | pF | | |
| $C_{OUT}$ | Output/IO capacitance | | 5 | pF | | | a. AC input parameters are measured at a 2.5 V measurement level.
b. Except JTAG signals with internal pull-up resistors (TRST, TDI, and TMS).
c. For JTAG pins with pull-up resistors (TRST, TDI, and TMS).

TABLE 12

OUT_CLK requirements

| Num. | Characteristic | Min. | Max. | Unit |
|---|---|---|---|---|
| #1 | Clock period | 33 | 53 | ns |
| #2 | Clock high period | 10 | | ns |
| #3 | Clock low period | 10 | | ns |

RESET is the main chip reset signal, all circuitry is reset and adopts the reset state indicated in the various tables in this data sheet. RESET must be asserted (LOW) for at least four IN_CLK cycles after the power and clocks are stable to ensure a correct reset.

TABLE 13

Signals and registers
Signals

| Signal Name | I/O | Type | JTAG | Description |
|---|---|---|---|---|
| IN_DATA[7:0] | I | C | I | A/D Converter Interface |
| SAMPLE | O | C | T | |
| VSB_IN | I | — | A | Analog signal input |
| POS_REF | I | — | A | ADC positive reference voltage |
| NEG_REF | I | — | A | ADC negative reference voltage |
| IN_CLK | I | C | I | Sample timing control |
| TCTRL | O | C | T | |
| TCLK | O | C | T | Symbol rate clock |
| AGC | O | C | T | Sigma-delta modulated AGC |
| FCTRL[9:0] | O | C | T | Carrier recovery feedback. |
| OUT_DATA[15:0] | O | T | T | Output interface pins. |
| OUT_VALID | O | T | T | |
| OUT_ACCEPT | I | T | I | |
| OUT_MODE | I | C | I | |
| OUT_WIDTH | I | C | I | |
| OUT_CLK | I | C | I | |
| RESET | I | C | R | Micro processor interface (MPI). |
| ME[1:0] | I | T | I | |
| MR/W | I | T | I | |
| MA[7:0] | I | T | I | |
| MD[7:0] | I/O | T | B | |
| IRQ | O | T o/c | D | |
| VSB_LEVEL[1:0] | O | C | T | |
| TCK | I | C | J | JTAG test access port. |
| TDI | I | C | J | |
| TDO | O | C | J | |
| TMS | I | C | J | |
| TRST | I | C | J | |
| VDD | — | — | A | 5 V power rail |
| GND | — | — | A | Ground |
| TPH0 | I | C | I | Test clocks |
| TPH1 | I | C | I | |
| MONSEL[1:0] | I | C | I | Monitor bus source select |
| MONITOR[8:0] | O | C | T | Monitor bus |

TABLE 14

Register Overview Map

| Address (hex) | Register name |
|---|---|
| 0x00 ... 0x01 | Interrupt service |
| 0x02 ... 0x27 | Operation control |
| 0x28 ... 0x5f | Adaptive equalizer coefficients |

TABLE 14-continued

Register Overview Map

| Address (hex) | Register name |
|---|---|
| 0×60 ... 0×7e | Test and diagnostic registers |
| 0×7f | Revision register |

TABLE 15

Interrupt Service Area

| Address (hex) | Bit no. | Register name |
|---|---|---|
| 0×00 | 7 | chip_event |
|  | 6 | output_overflow_event |
|  | 5 | packet_error_event |
|  | 4 | no_sync_event |
|  | 3 | user_data_event |
|  | 2 | time_out event |
|  | 1:0 | (not used) |
| 0×01 | 7 | chip_mask |
|  | 6 | output_overflow_mask |
|  | 5 | packet_error_mask |
|  | 4 | no_sync_mask |
|  | 3 | user_data_mask |
|  | 2 | time_out mask |
|  | 1:0 | (not used) |

TABLE 16

Operation control registers

| Addr (Hex) | Bit no. | dir/reset | Register name | Description |
|---|---|---|---|---|
| 2 | 0 | R/W/1 | change_channel | Writing 1 causes to initiate the channel change sequence. All other operation is terminated, but output will always stop at a packet boundary. If this bit is read, it will be 1 during channel change (channel change state machine is active. |
| 3 | 5 | R/W/0 | agc_lock_mode | If agc_lock_mode is set to 0 the internal AGC lock detect circuit is used in the channel change sequence. If it is set to 1 then the channel change sequence will proceed to the next state when set_agc_lock is set to 1 (or immediately if set_agc_lock is already set to 1). |
|  | 4 | R/W/0 | set_agc_lock | |
|  | 3 | R/W/0 | fll_lock_mode | If fll_lock_mode is set to 0 the internal FLL lock detect circuit is used in the channel change sequence. If it is set to 1 then the channel change sequence will proceed to the next state when set_fll_lock is set to 1 (or immediately if set_fll_lock is already set to 1). |
|  | 2 | R/W/0 | set_fll_lock | |
|  | 1 | R/W/0 | tmr_lock_mode | If tmr_lock_mode is set to 0 the internal FLL lock detect circuit is used in the channel change sequence. If it is set to 1 then, depending on whether the PLL is locked the channel change sequence may proceed |
|  | 0 | R/W/0 | set_tmr_lock | |

TABLE 16-continued

Operation control registers

| Addr (Hex) | Bit no. | dir/reset | Register name | Description |
|---|---|---|---|---|
|  |  |  |  | to the next state when set_tmr_lock is set to 1 (or immediately if set_tmr_lock is already set to 1). |
| 4 | 2 | R | agc_locked | AGC internal lock detect. 1 if AGC is AGC is in lock, 0 if it is not |
|  | 1 | R | fll_lock | FLL internal lock detect. 1 if FLL is in lock, 0 if it is not. |
|  | 0 | R | tmr_locked | Timing recovery internal lock detect. 1 if timing recovery is in lock, 0 if it is not. |
| 5 | 3:2 | R/W/00 | adc_selec | 00 selects the external Analog to Digital converter (digital input on IN_DATA[7:0]) 01 selects the internal Analog to Digital converter (analog in put on VSB_IN) |
|  | 1 | R/W/1 | sync_err_action | Controls the effect of failing to detect two frame syncs in a row in their expected locations). 0 selects no action. 1 causes the channel change sequence to be initiated. |
|  | 0 | R/W/1 | fec_err_action | Controls the effect of the Reed-Solomon decoder finding uncorrectable errors in two adjacent packets. 0 selects no action. 1 causes the channel change sequence to be initiated. In both cases the packet_error_event bit is set. |
| 6 | 6:4 | R/W/ 0×4 | fll_time_out | The frequency "hop" time out used during frequency acquisition. The number specified is a multiple of 4096*T/2 (15 MHz) clock periods. i.e. fll_time_out = 1 gives a time out of about 0.27 μs. |
|  | 3:0 | R/W/ 0×8 | seq_time_out | The time out for the channel change sequence in multiples of 32768 × T/2 clock periods. |
| 7 | 7:0 | R/W/0x00 | fec_err_count | This value in this register is incremented by one every time the Reed Solomon decoder corrects an error in the data stream. If the value 0×00 is written to this register immediately after it has been read then the value will be the number of errors since the last read. The value has no meaning if an uncorrectable error has occurred. |
| 8 | 7:0 | R/W/? | nyq_gain | Gain applied to the output of the Nyquist filter. |
| 09 | 7:0 | R/W/? | dc_key_value | The value used by the DC remover in keyed mode. |
| 0a |  |  |  | (not used) |
| 0b |  |  |  | (not used) |
| 0c | 4 | R/W/0 | agc_invert | Setting this bit to 1 causes the sigma-delta modulated AGC output to be inverted. |
|  | 3:2 | R/W/ 0b11 | agc_av_gain | The gain constant used in the AGC circuit in averaging mode. 00 selects $2^{-13}$ 01 selects $2^{-14}$ 10 selects $2^{-15}$ 11 selects $2^{-16}$ |

TABLE 16-continued

Operation control registers

| Addr (Hex) | Bit no. | dir/reset | Register name | Description |
|---|---|---|---|---|
| | 1:0 | R/W/ 0b10 | agc_train_gain | The gain constant used in the AGC circuit in training mode. 00 selects $2^{-13}$ 01 selects $2^{-14}$ 10 selects $2^{-15}$ 11 selects $2^{-16}$ |
| 0d | 7:0 | R/W/ 0x34 | agc_av_bias | The mean constellation value used by the AGC circuit in averaging mode. |
| 0e | 7:0 | R/W/ 0x30 | agc_train_bias | The mean constellation value used by the AGC circuit in averaging mode. |
| 0f | 7:4 | R/W/0x4 | agc_lock_value | These values are used by the internal AGC lock detect circuit to determine whether the AGC is in lock. agc_lock_time is in units of symbol periods × 64. |
| | 3:0 | R/W/ 0x4 | agc_lock_time | |
| 10 | 5:3 | R/W/0b011 | tmr_p_gain_acq | Proportional gain of the timing recovery loop filter used during acquisition 000 selects $2^3$ 001 selects $2^4$ 010 selects $2^5$ 011 selects $2^6$ 100 selects $2^7$ 101 selects $2^7$ 110 selects $2^7$ 111 selects $2^7$ |
| 10 | 2:0 | R/W/ 0b110 | tmr_i_gain_acq | Integral gain of the timing recovery loop filter used during acquisition 000 selects $2^{-14}$ 001 selects $2^{-13}$ 010 selects $2^{-12}$ 011 selects $2^{-11}$ 100 selects $2^{-10}$ 101 selects $2^{-9}$ 110 selects $2^{-8}$ 111 selects $2^{-7}$ |
| 11 | 5:3 | R/W/ 0b001 | tmr_p_gain_run | Proportional gain of the timing recovery loop filter used once lock has been established. Selections as for tmr_p_gain_acq. |
| | 2:0 | R/W/ 0b01 | Otmr_i_gain_run | Integral gain of the timing recovery loop filter used once lock has been established. Selections as for tmr_i_gain_acq. |
| 12 | 5:4 | R/W/ 0x3 | tmr_lock_value | Used for timing recovery lock detect. |
| | 3:0 | R/W/ 0x2 | tmr_lock_time | Used for timing recovery lock detect. |
| 13 | | | | (not used) - timing recovery address space |
| 14 | 0 | R/W/ | fll_p_gain | The proportional gain of the PLL loop filter. |
| 15 | 7:0 | 0x0c5 | | |
| 16 | 0 | R/W/ | pll_p_gain | Integral gain of the PLL loop filter. |
| 17 | 7:0 | 0x01d | | |
| 18 | 2:0 | R/W/ | fll_i_gain | Integral gain of the PLL loop filter. |
| 19 | 7:0 | 0x24a | | |
| 1a | 2:0 | R/W/ | pll_i_gain | Integral gain of the PLL loop filter. |
| 1b | 7:0 | 0x00d | | |
| 1c | 4:0 | R/W/ 0x08 | fll_lock_value | Used for FLL lock detect. |
| 1d | 3:0 | R/W/ 0x4 | fll_lock_time | Used for FLL lock detect. |
| 1e | 3:0 | R/W/ | dac_bits | Number of bits output by the FPLL Sigma-Delta. |
| 1f | | | | (not used) |
| 20 | 7:0 | R/W/ 0x00 | user_reg0 | User byte 0. |
| 21 | 7:0 | R/W/ 0x00 | user_reg1 | User byte 1. |
| 22 | 1 | R/W/0 | vsb_levels_mode | 0 selects automatic mode; the VSB modulation is set automatically from the information in the user data field of the frame header. 1 selects manual mode; the VSB modulation is the value written to the vsb_levels register. |
| 23 | 7:5 | R/W/0b 100 | adeq_run_step | The step size used to train the adaptive equalizer during the data portion of the frame (i.e. not during the training sequence) 000 selects 0 (adaptation disabled) 001 selects 1/2 * 1/4096 010 selects 3/4 * 1/4096 011 selects 7/8 * 1/4096 100 selects 1 * 1/4096 101 selects 9/8 * 1/4096 110 selects 5/4 * 1/4096 111 selects 3/2 * 1/4096 |
| | 4:2 | R/W/0b 100 | adeq_train_step | The step size used to train the adaptive equalizer during "slow train" training sequences 000 selects 0 (adaptation disabled) 001 selects 1/2 * 1/512 010 selects 3/4 * 1/512 011 selects 7/8 * 1/512 100 selects 1 * 1/512 101 selects 9/8 * 1/512 110 selects 5/4 * 1/512 111 selects 3/2 * 1/512 |
| | 1:0 | R/W/0b 00 | vsb_levels | The VSB constellation to be used. If vsb_levels_mode is 0, this value is loaded from the user data field of the frame header. If vsb_levels_mode is 1 the value should be written from the MPI (if the reset value of 16 VSB is not to be used). 00 selects 16 VSB 11 selects 8 VSB6 (not used) 10 selects 4 VSB 01 selects 2 VSB |
| 24 | 7 | R/W/0 | indy_loops | When set to 0, the adaptive equalizer and phase tracker are jointly adaptive. When set, adaptive equalizer and phase tracker are adapted independently using independent error values. |
| | 6 | | | (not used) |
| 24 | 5:3 | R/W/0b 100 | adeq_fast_step | The step size used to train the adaptive equalizer during "fast train" training sequence. 000 selects 0 (adaptation disabled) 001 selects 1/2 * 1/4696 010 selects 3/4 * 1/4096 011 selects 7/8 * 1/4096 100 selects 1 * 1/4096 101 selects 9/8 * 1/4096 110 selects 5/4 * 1/4096 111 selects 3/2 * 1/4096 |

TABLE 16-continued

Operation control registers

| Addr (Hex) | Bit no. | Dir/reset | Register name | Description |
|---|---|---|---|---|
| | 2:0 | R/W/0b 011 | sync_mask | The number of signature symbols whose sign must be correctly detected in order for the signature to be correctly detected: 000 selects 31; 001 selects >= 30; 011 selects >= 28; 111 selects >= 24; values other than these should not be used. |
| 25 | 7:5 | R/W/0b 100 | phtr_run_step | The step size used to adapt the phase tracker during the data portion of the frame (i.e. not during the training sequence) 000 selects 0 (adaptation disabled); 001 selects 1/2 * 1/1024; 010 selects 3/4 * 1/1024; 011 selects 7/8 * 1/1024; 100 selects 1 * 1/1024; 101 selects 9/8 * 1/1024; 110 selects 5/4 * 1/1024; 111 selects 3/2 * 1/1024 |
| | 4:2 | R/W/0b 100 | phtr_train_step | The step size used to adapt the phase tracker during training sequence. Selections as for phtr_run_step. |
| | 1 | R/W/0 | input_double | If set to 1 the input data to the adaptive equalizer will be multiplied by 2. Use to increase the dynamic range of the data used in the adaptive equalizer if the dynamic range would otherwise be less then a half of the range available. |
| | 0 | R/W/0 | scramble_disable | 0 selects descrambler enabled 1 selects descrambler disabled (use if the transmitted data has not been scrambled. |
| 26 27 | 7:0 7:0 | R/W/0x 0000 | phase_estimate | The phase estimate of the phase tracker. |

TABLE 17

Adaptive Equalizer Coefficient Register

| Addr (Hex) | Bit no. | Dir/reset | Register name | Description |
|---|---|---|---|---|
| 28 | 7:0 | R/W | adeq_coeff_0 | Adaptive equalizer coefficient value. |
| 29 | 7:0 | R/W | | |
| 2a | 7:0 | R/W | adeq_coeff_1 | Adaptive equalizer coefficient value. |
| 2b | 7:0 | R/W | | |
| 2c | 7:0 | R/W | adeq_coeff_2 | Adaptive equalizer coefficient value. |
| 2d | 7:0 | R/W | | |
| 2 | 7:0 | R/W | adeq_coeff_3 | Adaptive equalizer coefficient value. |
| 2f | 7:0 | R/W | | |
| 30 | 7:0 | R/W | adeq_coeff_4 | Adaptive equalizer coefficient value. |
| 31 | 7:0 | R/W | | |
| 32 | 7:0 | R/W | adeq_coeff_5 | Adaptive equalizer coefficient value. |
| 33 | 7:0 | R/W | | |
| 34 | 7:0 | R/W | adeq_coeff_6 | Adaptive equalizer coefficient value. |
| 35 | 7:0 | R/W | | |
| 36 | 7:0 | R/W | adeq_coeff_7 | Adaptive equalizer coefficient value. |
| 37 | 7:0 | R/W | | |
| 38 | 7:0 | R/W | adeq_coeff_8 | Adaptive equalizer coefficient value. |
| 39 | 7:0 | R/W | | |
| 3a | 7:0 | R/W | adeq_coeff_9 | Adaptive equalizer coefficient value. |
| 3b | 7:0 | R/W | | |

TABLE 17-continued

Adaptive Equalizer Coefficient Register

| Addr (Hex) | Bit no. | Dir/reset | Register name | Description |
|---|---|---|---|---|
| 3c | 7:0 | R/W | adeq_coeff_10 | Adaptive equalizer coefficient value. |
| 3d | 7:0 | R/W | | |
| 3 | 7:0 | R/W | adeq_coeff_11 | Adaptive equalizer coefficient value. |
| 3f | 7:0 | R/W | | |
| 40 | 7:0 | R/W | adeq_coeff_12 | Adaptive equalizer coefficient value. |
| 41 | 7:0 | R/W | | |
| 42 | 7:0 | R/W | adeq_coeff_13 | Adaptive equalizer coefficient value. |
| 43 | 7:0 | R/W | | |
| 44 | 7:0 | R/W | adeq_coeff_14 | Adaptive equalizer coefficient value. |
| 45 | 7:0 | R/W | | |
| 46 | 7:0 | R/W | adeq_coeff_15 | Adaptive equalizer coefficient value. |
| 47 | 7:0 | R/W | | |
| 48 | 7:0 | R/W | adeq_coeff_16 | Adaptive equalizer coefficient value. |
| 49 | 7:0 | R/W | | |
| 4a | 7:0 | R/W | adeq_coeff_17 | Adaptive equalizer coefficient value. |
| 4b | 7:0 | R/W | | |
| 4c | 7:0 | R/W | adeq_coeff_18 | Adaptive equalizer coefficient value. |
| 4d | 7:0 | R/W | | |
| 4e | 7:0 | R/W | adeq_coeff_19 | Adaptive equalizer coefficient value. |
| 4f | 7:0 | R/W | | |
| 50 | 7:0 | R/W | adeq_coeff_20 | Adaptive equalizer coefficient value. |
| 51 | 7:0 | R/W | | |
| 52 | 7:0 | R/W | adeq_coeff_21 | Adaptive equalizer coefficient value. |
| 53 | 7:0 | R/W | | |
| 54 | 7:0 | R/W | adeq_coeff_22 | Adaptive equalizer coefficient value. |
| 55 | 7.0 | R/W | | |
| 56 | 7:0 | R/W | adeq_coeff_23 | Adaptive equalizer coefficient value. |
| 57 | 7:0 | R/W | | |
| 58 | 7:0 | R/W | adeq_coeff_24 | Adaptive equalizer coefficient value. |
| 59 | 7:0 | R/W | | |
| 5a | 7:0 | R/W | adeq_coeff_25 | Adaptive equalizer coefficient value. |
| 5b | 7:0 | R/W | | |
| 5c | 7:0 | R/W | adeq_coeff_26 | Adaptive equalizer coefficient value. |
| 5d | 7:0 | R/W | | |
| 5e | 7:0 | R/W | adeq_coeff_27 | Adaptive equalizer coefficient value. |
| 5f | 7:0 | R/W | | |

TABLE 18

Operation data
Input interface signals

| Signal Name | Type | Description |
|---|---|---|
| IN_DATA[7:0] | Input | The input signal, as sampled by the A/D converter. |
| SAMPLE | Output | Generated by dividing IN_CLK by 2 inside. |
| VSB_IN | Analog | The analog equivalent of IN_DATA. This is sampled using the internal A/D converter. |
| POS_REF | Analog | Reference voltages for the A/D converter. |
| NEG_REF | Analog | |
| IN_CLK | Input | Generated by an external VCXO which is controlled by the timing recovery block to produce an accurate sample clock. Sampling is at twice the symbol rate. |
| TCTRL | Output | Feedback signal to control the timing recovery VCXO. This signal is 1-bit signal-delta modulated. |
| AGC | Output | Feedback signal to control the gain of the RF section. 1-bit sigma-delta modulated |
| FCTRL[9:0] | Output | Feedback signal to control the frequency of the RF demodulator. Sigma-delta modulated 14 bit value |
| VSB_LEVEL[1:0] | Output | VSB modulation level. |

TABLE 19

FPLL data widths

| Signal | Conceptual bit positions | Note |
|---|---|---|
| ADC output | s5.2 | Input to chip |
| I, Q inputs | s5.3 | |
| Error signal (Err) | s5.3 | |
| I coefficient | −9.20 | |
| I coeff*Err | s-4.18 | Rounded result of multiplication |
| Integrator register | s1.18 | |
| I-integrator output | s1.12 | Truncated integrator register value |
| P coefficient | −3.12 | |
| P coeff*Err | s2.12 | |
| I + P | s2.12 | |
| Sigma-delta input | s2.12 | Limited to allow larger excursions of I+P than DAC dynamic range allocation. The sigma-delta modulator outputs the 10 MSBs and feeds back the 4 LSBs. |

TABLE 20

Timing recovery data widths

| Signal | Conceptual bit positions | Note |
|---|---|---|
| ADC output | S5.2 | |
| Itr, Qtr | s5.6 | |
| IIR filter states | s1.14 | |
| Multiplier inputs | s1.6 | Truncated filter state. |
| Multiplier output = Error | s0.12 | |
| Integrator register | Programmable shift in the range $2^{-7} \ldots 2^{-14}$ | |
| Error*I coefficient | s–6.18 | Actual data is shifted right by value selected by tmr_i_gain and truncated |
| Integrator register | s4.18 | |
| Integrator output | s3.7 | Truncated register value |
| Proportionality coefficient | Programmable shift in the range $2^3 \ldots 2^7$ | |
| P coeff*Err | s6.7 | |
| P + I | s6.7 | |
| Delta-sigma input | s1.7 | Limited to allow larger excursions than DAC dynamic range during acquisition |

TABLE 21

Output interface Specifications
Output interface signals

| Signal Name | Type | Description |
|---|---|---|
| OUT_DATA[15:0] | Output | Output data bus. This may be used in either 8-bit or 16-bit mode. In 8-bit mode only bits 7:0 are used. |
| OUT_VALID | Output | Output data valid. |
| OUT_ACCEPT | Input | Data accept from MPEG2 System Demux. |
| OUT_CLK | Input | Output data clock. All output interface signals are synchronous to this clock. |
| OUT_WIDTH | Input | Selects width of out_data, 0 => 8 bits, 1 => 16 bits |
| OUT_MODE | Input | 0 => "Fast" mode, 1 => "DMA" mode. |

TABLE 22

Output interface timing

| Num. | Characteristic | Min | Max | Unit | Notes |
|---|---|---|---|---|---|
| #4 | OUT_VALID set-up time | 8 | | ns | |
| #5 | OUT_ACCEPT set-up time | 0 | | ns | Fast Mode |
| #6 | OUT_CLK to data | | 10 | ns | |
| #7 | OUT_ACCEPT high to OUT_CLK rising | | 2 | ns | DMA Mode |
| #8 | OUT_ACCEPT low to OUT_CLK falling | 8 | | ns | |
| #9 | OUT_ACCEPT high to data driven | 0 | 10 | ns | |
| #10 | OUT_CLK to data high impedance | 0 | 10 | ns | |

EXAMPLE

A digital receiver for use in a cable TV system implemented in accordance with the aforedescribed preferred embodiment will acquire lock, and maintain an output symbol error rate of less than $1.0 \times 10^{-12}$ after correction in a channel having the following impairments:

Carrier/Noise (NTSC)>43 dB

Signal/Noise (16-VSB)>33 dB

Composite triple beat and composite second order >51 dB

Microreflections <2.5 μs (for reflections >35 dB)

Burst error duration <38 μs

Figure 4B:
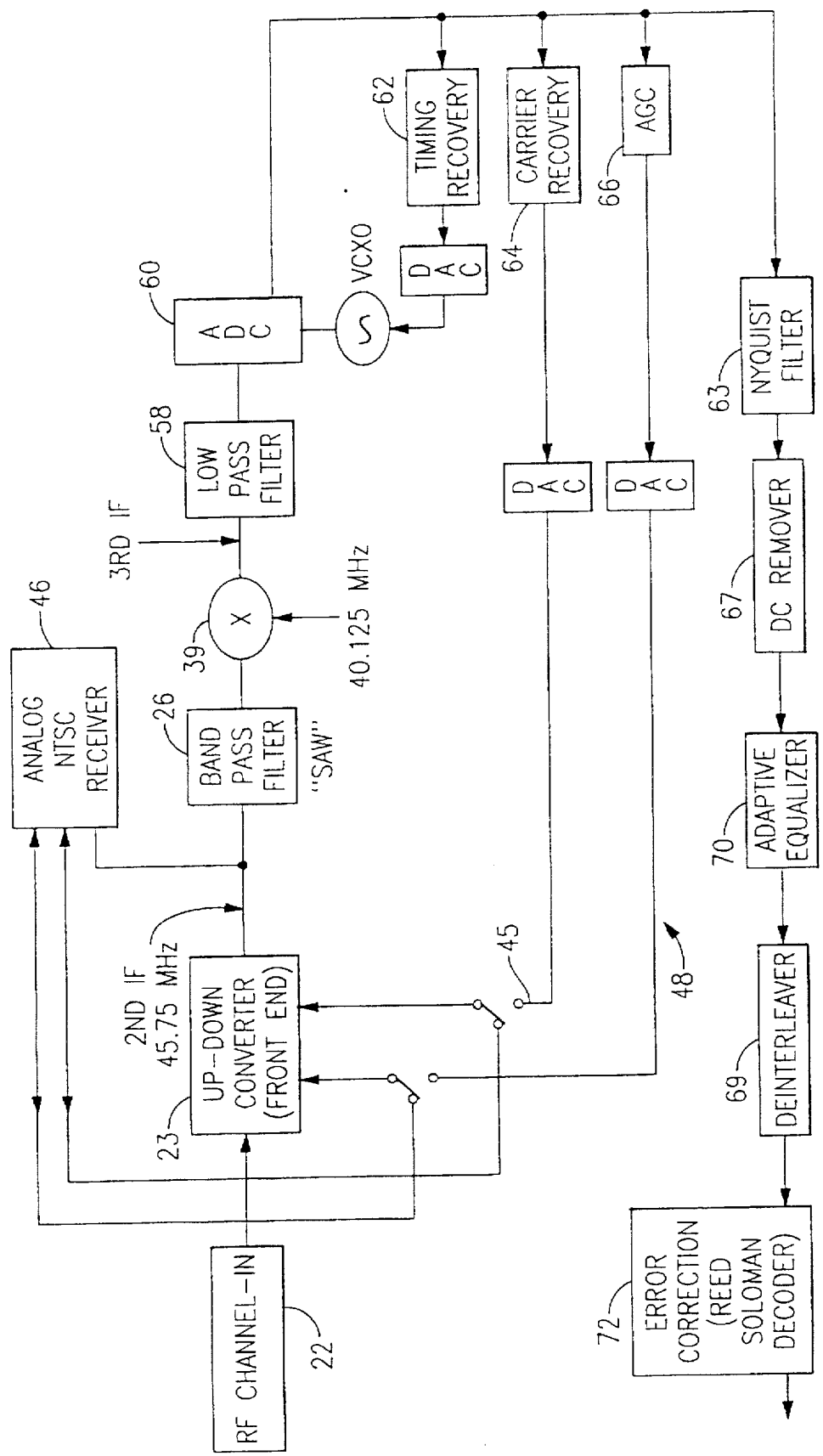
FIG. 4b is a block diagram similar to FIG. 4 of an alternate embodiment of the invention.

Intermediate Frequency Surface Acoustic Wave Filter:
  Passband magnitude ripple <0.75 dB
  Passband group delay <80 ns peak-to-peak Phase noise <81 dBc/Hz @ 20 KHz off carrier FM hum—120 Hz sine wave frequency modulated with peak deviation of 5 KHz Initial frequency offset on channel change <450 KHz Second Embodiment A second embodiment is explained with reference to FIG. 4b. This is constructed in the same manner as the first embodiment, except that the carrier recovery 64 and automatic gain control 66 outputs are multiplexed by selector 45 with corresponding outputs from an analog NTSC receiver 46. In this way the receiver embodiment, referenced generally at 48, can share tuner and analog IF sections for both analog NTSC and digital modes, leading to a lower system cost.

We have herein disclosed a digital receiver that is implemented in an integrated CMOS circuit that is suitable for use in cable systems or other broadcast systems in which some channels are allocated to analog transmissions such as NTSC, PAL, PAL-D, or SECAM, and other channels are allocated to digital transmission using VSB. The receiver is optimized for MPEG 2 transport packets. It shares a tuner and analog IF sections for operation in both analog and digital modes, leading to a low system cost. Using 16-VSB, the system operates at a net data rate of 27 Mbits/sec and has a low framing overhead. In case of unreliable channels, there is provided a progressive fall back to 8-VSB, 4-VSB and 2-VSB. In operation the symbol error rate is less than $1.0 \times 10^{-12}$ after error correction. Acquisition time on channel change is less than 100 ms. While this invention has been explained with reference to the structure disclosed herein, it is not confined to the details set forth and this application is intended to cover any modifications and changes as may come within the scope of the following claims:

What is claimed is:

1. A deinterleaving circuit for processing of a signal comprising blocks of interleaved data packets represented therein, comprising:

a random access memory for memorizing a data stream of said blocks of interleaved packets, wherein a capacity of said memory does not exceed any of said blocks;

a first circuit for generating an address signal representing a sequence of addresses of said random access memory, wherein successive addresses differ by an addressing interval;

a second circuit for successively reading and writing data out of and into said random access memory respectively at a reading address and a writing address of said random access memory, said reading address and said writing address being determined by said address signal, wherein said address signal is constant during an operation comprising reading and writing data at said address; and a third circuit responsive to a signal ACCEPT BLOCK for periodically increasing said addressing interval by a value equal to an interleaving depth of said interleaved packets wherein said signal ACCEPT BLOCK is asserted after completion of an operation comprising a complete deinterleaving of one of said blocks of data.

2. The circuit according to claim 1, wherein said first circuit comprises a row predecoder.

3. The circuit according to claim 1, wherein said random access memory, said first circuit, said second circuit, and said third circuit are integrated in a semiconductor integrated circuit.

4. The circuit according to claim 1, further comprising a control means for second circuit, wherein said second circuit operates in a selected one of a first operating mode, wherein a writing operation is enabled and a reading operation is disabled; a second operating mode, wherein said writing operation is enabled and said reading operation is enabled; and a third operating mode, wherein said writing operation is disabled and said reading operation is enabled.

5. A deinterleaving circuit for processing of a signal having blocks of interleaved data packets represented therein, comprising:

a single, non-interleaved random access memory for memorizing said interleaved packets;

a first circuit for generating an address signal representing a sequence of addresses of said random access memory, wherein successive addresses differ by an addressing interval;

a second circuit for successively reading data of a first packet out of said random access memory and successively writing data of a second packet into said random access memory; wherein said second circuit is responsive to said address signal; and a third circuit responsive to a signal ACCEPT BLOCK for periodically increasing said addressing interval by a value equal to an interleaving depth of said interleaved packets wherein said signal ACCEPT BLOCK is asserted after completion of an operation comprising a complete deinterleaving of one of said blocks of data.

6. The circuit according to claim 5, wherein said random access memory, said first circuit, said second circuit, and said third circuit are integrated in a semiconductor integrated circuit.

7. The circuit according to claim 5, wherein said first circuit comprises a row predecoder.

8. The circuit according to claim 5, further comprising a control means for second circuit, wherein said second circuit operates in a selected one of a first operating mode, wherein a writing operation is enabled and a reading operation is disabled; a second operating mode, wherein said writing operation is enabled and said reading operation is enabled; and a third operating mode, wherein said writing operation is disabled and said reading operation is enabled.

9. A deinterleaving circuit for processing of a signal having blocks of interleaved data packets represented therein, comprising:

a non-interleaved random access memory for memorizing said interleaved packets;

a first circuit for generating an address signal representing a sequence of addresses of said random access memory, wherein successive addresses differ by an addressing interval;

a second circuit for successively reading and writing data out of and into said random access memory respectively at a reading address and a writing address of said random access memory, said reading address and said writing address being determined by said address signal, wherein said address signal is constant during an operation comprising reading and writing data at said address;

a control means for second circuit, wherein said second circuit operates in a selected one of a first operating mode, wherein a writing operation is enabled and a reading operation is disabled; a second operating mode, wherein said writing operation is enabled and said reading operation is enabled; and a third operating mode, wherein said writing operation is disabled and said reading operation is enabled; and a third circuit responsive to a signal ACCEPT BLOCK for periodically increasing said addressing interval by a value equal to an interleaving depth of said interleaved packets wherein said signal ACCEPT BLOCK is asserted after completion of an operation comprising a complete deinterleaving of one of said blocks of data, wherein said random access memory, said first circuit, said second circuit said third circuit, and said control means are integrated in a semiconductor integrated circuit.

* * * * *

UNITED STATES PATENT AND TRADEMARK OFFICE
CERTIFICATE OF CORRECTION

PATENT NO.: 5,761,210

DATED: June 2, 1998

INVENTOR(S): Claydon et al

It is certified that error appears in the above-identified patent and that said Letters Patent is hereby corrected as shown below:

Col. 10, lines 29 and 30 [page 13, line 27] please delete "tseq=0,0,1,0,0,0,0,1,0,1,1,1,1,0,1,1,0,0,0,1,1,1,1,1,0,0,1,1,0,1." and insert --tseq = 0,0,1,0,0,0,0,1,0,1,0,1,1,1,0,1,1,0,0,0,1,1,1,1,1,0,0,1,1,0,1.-- in place thereof.

Col. 12, line 62 [page 17, line 13] please delete "t," and insert -- T, -- in place thereof.

Col. 12, line 67 [page 17, lines 17 and 18] please delete both occurrences of "t" and insert -- T -- in place thereof.

Col. 13, line 5 [page 17, line 22] please delete "t" and insert -- T -- in place thereof.

Col. 13, line 14 [page 17, line 28] please delete "$V_r$," and insert -- $V_t$ -- in place thereof.

Col. 32, line 25 [page 42, line 27] please delete "1" and insert --/-- in place thereof.

Col. 32, line 27 [page 42, line 29] please delete "1" and insert --/-- in place thereof.

Col. 32, line 50 [page 43, line 7] please delete "1" and insert --/-- in place thereof.

Signed and Sealed this

Twenty-fourth Day of November, 1998

Attest:

BRUCE LEHMAN

Attesting Officer

Commissioner of Patents and Trademarks